(12) United States Patent
Finn

(10) Patent No.: US 8,522,431 B2
(45) Date of Patent: Sep. 3, 2013

(54) MOUNTING AND CONNECTING AN ANTENNA WIRE IN A TRANSPONDER

(75) Inventor: David Finn, Tourmakeady (IE)

(73) Assignee: Féines Amatech Teoranta, Lower Churchfield, Turmottady, Cymago (IE)

( * ) Notice: Subject to any disclaimer, the term of this patent is extended or adjusted under 35 U.S.C. 154(b) by 310 days.

(21) Appl. No.: 12/877,085

(22) Filed: Sep. 7, 2010

(65) Prior Publication Data

US 2011/0023289 A1 Feb. 3, 2011

(51) Int. Cl.
*H01R 43/00* (2006.01)

(52) U.S. Cl.
USPC ............. 29/857; 29/600; 29/829; 29/853

(58) Field of Classification Search
USPC ................ 29/857, 33 M, 600, 739, 748, 853, 29/755, 827, 829, 843, 845; 430/5, 22
See application file for complete search history.

(56) References Cited

U.S. PATENT DOCUMENTS

| | | | | |
|---|---|---|---|---|
| 4,476,371 A | * | 10/1984 | Schreiber | 219/83 |
| 6,088,230 A | * | 7/2000 | Finn et al. | 361/737 |
| 6,233,818 B1 | * | 5/2001 | Finn et al. | 29/843 |

* cited by examiner

*Primary Examiner* — Thiem Phan
(74) *Attorney, Agent, or Firm* — Gerald E. Linden

(57) ABSTRACT

During mounting to an inlay substrate, at least one end portion (including end) of an antenna wire is positioned directly over a terminal of the chip module for subsequent connecting thereto. A sonotrode is disclosed with a cutter above the capillary for nicking the wire. The antenna may comprise two separate stubs, each having an end portion (including end) positioned over a terminal of the chip module. Additional techniques for mounting the antenna wire are disclosed.

5 Claims, 34 Drawing Sheets

Prior Art - a transponder with
end portions of antenna wire on terminals

Prior Art - a transponder having
a multi-layer inlay substrate

Prior Art - a transponder with
ends of antenna wire on terminals

Prior Art - a transponder having
a single layer substrate

"portions" of the antenna wire

Prior Art - Leadframe Type Chip Module

Prior Art - Epoxy Glass Type Chip Module

Prior Art - mounting and connecting
(such as in US 6,088,230)

Prior Art - Stage 1 (mounting)
(such as in US 6,233,818)

Prior Art - Stage 2 (connecting)

Prior Art - "Looping"
Stage 1 - mounting with "pre-positioning"
(such as in US 7,546,671)

Prior Art - "Looping"
Stage 2 - repositioning

Prior Art - "Looping"
Stage 3 - connecting

Prior Art - "Looping"

Prior Art - "Looping"

Prior Art - "Brushing"
Stage 1 - mounting with "pre-positioning"
(such as in US 2010/0141453)

Prior Art - "Brushing"
Stage 2 - repositioning

Prior Art - "Brushing"
Stage 3 - connecting

Prior Art - "Brushing"

Prior Art - "Brushing"

Stage 1 - mounting with "pre-positioning"

Stage 2 - connecting end portions (including ends) dangling over terminals

Stage 1 - Dangling the Residual End Portion over the Terminal

Stage 2 - Bonding the Residual End Portion to the Terminal sonotrode suitable for mounting antenna wire
with residual end portions dangling over terminals

FIG. 8A
Stage 1 - mounting with "pre-positioning"
(two separate "stubs" of antenna wire)

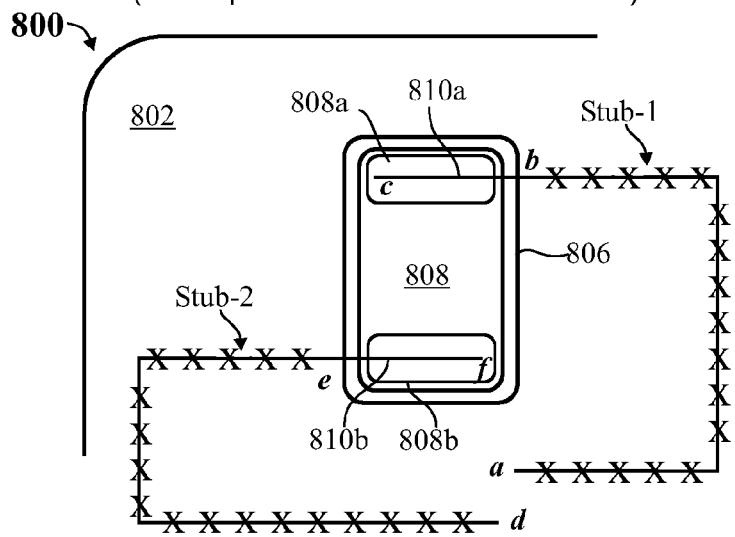

Step 1: embed from "a" to "b", then raise and form first residual end portion between "b" and "c", then sever the wire, forming Stub-1

Step 2: embed from "d" to "e", then raise and form second residual end portion between "e" and "f", then sever the wire, forming Stub-2

FIG. 8B
Stage 2 - connecting

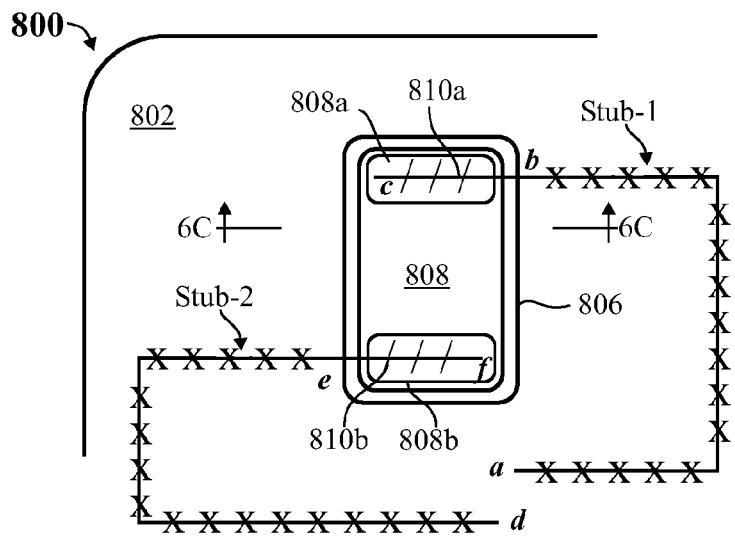

Note: cross section (at terminal) essentially the same as previous 6C

Note: overlapping distal ends of the wires may be connected using the thermode or laser, or other suitable means Note: this is showing one (of many) possible pattern for the stubs
most of the X's omitted, for illustrative clarity
since the wires are insulated, they may also cross over (not shown)

Note: connecting the distal ends of the antenna stubs via a capacitor, a switch, or the like fixing the ends of the antenna wire to the terminals of the chip module bonding the ends of the antenna wire to the terminals of the chip module Prior Art - Chip Module held in Recess by glue Gluing the Ends Step 1
hole Step 2
recess Step 3
Glue Step 4
Module Step 5
Adhesive Step 6
Wire This view is turned 90° and shows one end portion (connection portion) of the antenna wire passing over one terminal of the chip module Step 7
Ablation Step 8
Bonding Step 9
Cover cover applied, adhesive helps ensure destruction of
chip module / antenna if tampered (delaminated)

cross-sectional view top view pre-positioned repositioned

Laser Ablation

Gouging

Ultrasonic Stamp

Heat/Mold

Embedding a Wire in a Channel

Channel Crossings a second portion of the wire in a shallow portion of the channel a first portion of the wire in a deep portion of the channel Wire Straightening

MOUNTING AND CONNECTING AN ANTENNA WIRE IN A TRANSPONDER

TECHNICAL FIELD

The invention relates to "inlay substrates" used in the production of "inlays" for "security documents" such as electronic passports and smart cards and, more particularly, to how an antenna wire is mounted to the inlay substrate and subsequently connected to an RFID (radio frequency identification) chip or chip module disposed on the inlay substrate.

BACKGROUND

Transponders are electronic devices incorporated into secure documents such as "smart cards" and "electronic passports" using RFID (radio frequency identification) technology.

The transponder (or inlay, or chip card) itself generally comprises (includes):
- a substrate (or inlay substrate) which may comprise a sheet of a synthetic material;
- a chip (or chip module, or chip unit) installed on the substrate (or in a recess in the surface of the substrate) and having terminals (or contact surfaces, or pads); and
- an antenna wire (or conductor) mounted on the substrate, formed with "turns" as a flat coil and connected (bonded) by its ends (see FIG. 2A) or end portions (see FIG. 2B) to the terminals of the chip. (In some of the drawings presented herein, only one end or end portion of the antenna wire may be shown, for illustrative clarity, particularly in the cross-sectional views.)

The following dimensions and materials are merely exemplary:
- the chip module may be generally rectangular, measuring for example 5 mm×8 mm (width×height), and may have a thickness of approximately 0.5-1 mm
  - a first terminal disposed on one end of the chip module may measure for example 4 mm wide×2 mm high—in other words, nearly the entire width of the chip module, and approximately ¼-⅓ its height.
  - a second terminal disposed on one the other end of the chip module may measure for example 4 mm wide×2 mm high—in other words, nearly the entire width of the chip module, and approximately ¼-⅓ its height.
- The antenna wire may be "heavy" wire (such as 60 μm in diameter) requiring higher bonding loads than those used for "fine" wire (such as 30 μm). Rectangular section copper ribbon (such as 60 μm×30 μm) can be used in place of round wire. The antenna wire can be self-bonding copper wire or partially coated self-bonding copper wire, enamel copper wire or partially coated enamel wire, silver coated copper wire, un-insulated wire, aluminum wire, doped copper wire or litz wire.
- The inlay substrate may be approximately 10 thousandths of an inch (300 microns) thick and may be a "synthetic paper" material such as Teslin™. The inlay substrate may have an area designated as a "transponder site" whereat the chip module will be installed. (A recess in the inlay substrate may constitute the transponder site.) The transponder site may itself have two areas designated as "terminals areas" corresponding in position to the two terminals of the chip module which will be installed at the transponder site. (The transponder site and terminal areas are generally geometric abstractions, the chip module and terminals are physical elements.) Hence, it should be understood that, where applicable, the terms (and reference numerals for) "transponder site" and "chip module" may be used interchangeably, and that the terms "terminal areas" and "terminals" may similarly be used interchangeably.
- the chip module may be disposed in a recess extending into the surface of the substrate measuring for example 5.5 mm wide×8.5 mm high (generally the recess is only slightly larger than the chip module to allow some clearance during installation, while maintaining good registration)

A conventional method to produce an inlay site on an inlay substrate containing a high frequency RFID chip (or chip module) and an antenna embedded into a multi-layer substrate and connected to the terminals (terminal areas) of the RFID chip is disclosed in U.S. Pat. No. 6,233,818 and comprises
- first positioning the RFID chip in a recess, supported by a lower substrate layer (of the multi-layer substrate), then
- start embedding (countersinking) a wire conductor onto or into the top substrate layer in the direction of the RFID chip,
- then guiding the wire conductor over a first terminal area of the RFID chip, then continuing the embedding process by forming an antenna in the top substrate layer with a given number of turns,
- then guiding the wire conductor over the second terminal area, and
- finally embedding the wire conductor again into the top substrate layer before cutting the wire to complete the high frequency transponder site.

In a next stage of the production process, the wire ends passing over the terminal areas are interconnected by means of thermal compression bonding. Adhesively placing a wire conductor onto the top substrate layer is an alternative to embedding, and typically involves self-bonding coated wire conductor.

An Inlay and Transponder of the Prior Art

FIGS. 1A and 1B illustrate an inlay sheet 100 having a plurality of transponder areas (or sites). A selected one of the transponder areas 102 is shown in some detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Typically, several transponders are fabricated on a single inlay sheet. In the main hereinafter the fabrication of a single transponder at a single transponder site will be discussed, except as may otherwise be noted.

The inlay sheet 100 may be a multi-layer substrate 104 comprising one or more upper (top) layers 104a and one or more lower (bottom) layers 104b. A recess 106 may be formed in (completely through) the upper layer 104a so that a chip module 108 may be disposed in the recess 106, and supported by the lower layer 104b. Alternatively, the substrate 104 may be a single layer substrate (not shown, but imaging layers 104a and 104b being a single layer rather than two distinct layers) with the recess extending only partially through the substrate.

The chip module 108 is shown having two terminals 108a and 108b on a top surface thereof. An antenna wire 110 is connected by its two end portions 110a and 110b to the corresponding two terminals 108a and 108b, respectively, of the chip module 108. In the main hereinafter the mounting and connection of only one end or end portion of an antenna wire to a corresponding one terminal of a chip module may be discussed, and may be taken as representative of how the other end or end portion of the antenna wire is connected to the other terminal of the chip module, except as may otherwise be noted.

The combination of chip module 108 and antenna wire 110 connected to the chip module at a transponder site 102 may be considered to be a transponder, and may be referred to by the same reference numeral 102. Additional layers of material (not shown) may be applied (laminated) to the transponder to make it suitable for use as a secure document such as an electronic passport or smart card. Thus, what is shown in FIGS. 1A and 1B can be considered to be an "interim product". In the main hereinafter transponders which are interim products may be discussed except as may otherwise be noted.

The transponder 102 may be formed on an inlay substrate 104 having multiple layers comprising an upper layer 104a and a lower layer 104b, and may be exemplary of a smart card embodiment of a transponder for a secure document. A hot lamination process may be used to bond the upper and lower layers 104a and 104b together. The following dimensions are merely exemplary:

- the overall thickness of the inlay substrate 104 may be approximately 450 μm
- the thickness of the top layer 104a may be approximately 400 μm, and may comprise one or more layers of material
- the depth of the recess 106 may be the same as thickness of the top layer(s) 104a
- the thickness of the transponder chip 108 may be approximately 320 μm
- the thickness of the bottom layer 104b may be approximately 240 μm, and may comprise one or more layers of material Generally, the recess 106 is sized and shaped to accurately position the chip module 108, having side dimensions only slightly larger than the chip module 108 to allow the chip module 108 to be located within the recess 106. And typically a dab of glue (not shown) in the bottom of the recess 106 will retain the chip module in the recess 106 during manufacturing. The following dimensions are merely exemplary:

- the chip module 108 may measure approximately 5.0×8.0 mm
- the recess 106 may measure approximately: 5.1×8.1 mm
- the terminals 108a/b may measure approximately 5.0×1.45 mm
- the wire may have a diameter between 60 and 112 μm One millimeter (mm) equals one thousand (1000) micrometers (μm, "micron").

In FIGS. 1A and 1B, the recess 106 may be illustrated with an exaggerated gap between its inside edges and the outside edges of the chip module 108, for illustrative clarity. In reality, the gap may be only approximately 50 μm-100 μm (0.05 mm-0.1 mm).

In FIG. 1A the terminals 108a and 108b of the chip module 108 are shown reduced in size (narrower in width and or height), for illustrative clarity. (From the dimensions given above, it is apparent that the terminals 108a and 108b can extend substantially the full width of the chip module 108.)

It should be understood that the chip module 108 is generally snugly received within the recess 106, with dimensions suitable that the chip module 108 will not move around after being located within the recess 106, in anticipation of end portions 110a and 110b of the antenna wire 110 being bonded to the corresponding terminals 108a and 108b, respectively, of the chip module 108.

As best viewed in FIG. 1A, an antenna wire 110 is disposed, such as by embedding, on a top surface (side) of the substrate 104, and may be formed into a flat (generally planar) coil, having a number (such as four or five of "turns" (three shown), two ends, two end portions 110a and 110b, and a main intermediate portion between the two end portions. The overall length of the antenna thus formed may be approximately 1 meter.

As best viewed in FIG. 1A, the end portions 110a and 110b of the antenna wire 110 are shown extending completely over the terminals 108a and 108b of the chip module 108, from one side of the chip module 108 to the other, without (yet) being connected to the terminals 108a and 108b of the chip module 108. The end portions 110a and 110b of the antenna wire 110 may subsequently be connected, such as by thermo-compression bonding, to the terminals 108a and 108b of the transponder chip 108, respectively.

As best viewed in FIG. 1A, an intermediate portion 110c of the antenna wire 110 which is that portion of the antenna wire 110 which is between the two end portions 110a and 110b, and comprising most of the antenna wire is mounted (as indicated by the symbols "X") in the surface of the inlay substrate 102. Only a few of the X's along the length of the intermediate portion of the antenna wire are omitted, for illustrative clarity.

As best viewed in FIG. 1A, a number of points ("a", "b", etc.) are illustrated along the length of the antenna wire 110 are shown. The following terminology may be used to describe different portions of the antenna wire.

- the antenna wire extends between the points "a" at one "end" of the antenna wire and a point "f" at another end of the antenna wire
- a short (such as 1-3 mm) portion of the antenna wire between the points "a" and "b" may be referred to as a "end segment" of the antenna wire, and generally includes the "end". Two end segments are shown,
  - one between the points "a" and "b", and
  - the other between the points "e" and "f".
- another short (6-8 mm) portion of the antenna wire which may pass over the terminal of the chip module may be referred to as the "end portion" of the antenna wire. The end portions may also be referred to as "connection portions". Two end portions (or connection portions) are shown,
  - one between the points "b" and "c", and
  - the other between the points "e" and "f".
- a main or "intermediate portion" of the antenna wire is that portion of the antenna wire which is between the two end portions, such as between the points "c" and "d", and typically may be approximately 1 meter in length, formed with a number (such as 4 or 5) turns.

As best viewed in FIG. 1B, the antenna wire 110 is "mounted" to the substrate 104a, which may comprise "embedding" (countersinking) the antenna wire 110 into the surface of the inlay substrate 102, or "adhesively placing" (adhesively sticking) the antenna wire 110 on the surface of the inlay substrate 102. In the main, hereinafter, mounting the antenna wire by embedding is discussed. As a general proposition, the antenna wire gets mounted (or fixed) to the inlay substrate 102 using a sonotrode tool 116 which vibrates, feeds out the wire, and embeds it into the surface of the inlay substrate 102.

Examples of embedding a wire in a substrate, in the form of a flat coil, and a tool for performing the embedding (and a discussion of bonding), may be found in U.S. Pat. No. 6,698,089 (refer, for example, to FIGS. 1, 2, 4, 5, 12 and 13 of the patent). See also FIGS. 1 and 2 of U.S. Pat. No. 6,233,818. Both of these patents are incorporated by reference herein.

It is known that a coated, self-bonding wire will stick to a synthetic (e.g., plastic) substrate because when vibrated sufficiently to soften (make sticky) the coating and the substrate.

In the case of Teslin (synthetic paper), a normal insulated wire would not properly embed into the material, it would detach. Therefore, one uses self-bonding wire which attaches to the material with a slight penetration of the wire in the material. To sink the wire into the material, it is generally necessary to pre-press the antenna with chip connected using a hot lamination press. In contrast thereto, when pre-forming a channel or groove for the wire (such as by using laser ablation or other techniques, mentioned below, see FIG. 14A, et seq.) it is not necessary to perform this pressing operation.)

FIG. 1B shows the antenna wire 110 feeding out of a capillary 116 of an ultrasonic wire guide tool (or "sonotrode"). The capillary 116 is typically disposed perpendicular to the surface of the substrate 100. The capillary 116 is omitted from the view in FIG. 1A, for illustrative clarity. In the main hereinafter the terms "capillary" and "sonotrode" may be used interchangeably, unless may otherwise be noted.

The capillary 116 may be vibrated by an ultrasonic vibration mechanism, so that it vibrates in the vertical or longitudinal (z) direction, such as for embedding the wire in the surface of the inlay substrate, or in a horizontal or transverse (y) direction, such as for adhesively placing the wire on the surface of the substrate.

In FIG. 1B, the antenna wire 110 is shown slightly spaced (in drawing terminology, "exploded" away) from the substrate, rather than having been embedded (countersunk) in the surface of the substrate, for illustrative clarity.

As described in U.S. Pat. No. 6,233,818, in a first "mounting" stage the end portions of the antenna wire are guided over the terminals of the chip module, and in a second "connecting" stage the end portions are connected to the terminals using a thermode tool to essentially weld the end portion (which may be referred to as a connection portion) of the wire to the terminal. FIG. 1B shows "generic" bond head 118, poised to move down (see arrow) onto the end portion 110b of the antenna wire 110 to bond it to the terminal 108b.

The connecting (or interconnection) process can be inner lead bonding (diamond tool), thermo-compression bonding (thermode), ultrasonic bonding, laser bonding, soldering, ColdHeat soldering (Athalite) or conductive gluing.

As best viewed in FIG. 1A, due to the layout of the antenna coils (or turns), the antenna wire 110 may need to cross over itself. This is illustrated in the dashed-line circled area. (With a different layout of the antenna coils, such as in FIG. 4 of either U.S. Pat. No. 6,233,818 or 6,698,089, no such crossover is necessary.) In order to prevent shorting (electrical contact between different portions of the antenna coil) the antenna wire 110 should be an insulated wire, generally comprising a metallic core and an insulation (typically a polymer) coating. Also, the polymer coating facilitates the wire being "adhesively placed" on (stuck to) a plastic substrate layer (such as 104a).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect. This technique may be used to create a sufficient length of residual wire for positioning adjacent a first terminal of a chip module at a transponder site. This is particularly relevant to the techniques disclosed for example in US 2010/0141453 ("brushing").

The material for one or more layers of the inlay substrate may comprise Teslin™, a waterproof synthetic film, single-layer, uncoated with a thickness of 356 microns.

| | |
|---|---|
| Teslin | A single layer of microporous, polyolefin-based, uncoated film that bonds readily and firmly with toners, inks, adhesives and laminating films. Teslin is a waterproof synthetic material that works well with an inkjet printer, laser printer, or thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 1up, 2up, 3up, 6up, and 8up. Teslin is used widely in the production of drivers licenses, voter ID cards, and other forms of identification card. Because of its commercial availability, Teslin is also often found used for counterfeit or fake IDs. "Teslin" is a registered trademark of PPG Industries, Inc. for synthetic printing sheet. |
| Tyvek ™ | Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics. |

The material for one or more layers of the inlay substrate may comprise PVC, PC, PE, PET, PETE, TYVEK, TESLIN, Paper or Cotton/Noil. The inlay substrate can also have special markings such as luminous threads, water marks, microscopic filings and optical polymer memory for additional security.

FIG. 1C shows a transponder site similar to that of FIG. 1A, with a difference being that the ends of the antenna wire rather than end portions thereof are connected to the terminals of the chip module.

FIG. 1D shows a transponder site similar to that of FIG. 1B, with a difference being that the recess is a "pocket" type recess that extends only partially through the thickness of what is typically a single layer substrate. In contrast therewith, a recess which extends entirely through a substrate, such as the recess 106 shown in FIG. 1B extending entirely through the layer 104a, may be referred to as a "window" type recess.

Portions of the Antenna Wire

FIG. 1E shows an antenna wire, and various portions thereof, such as:

two ends which are generally the geometric "ends" of the elongate antenna wire two end segments which are generally short portions of the antenna wire at each end of the antenna wire. The end segments include the ends, and may be connected to the terminals of the chip module, such as in US 2010/0141453 ("brushing")

two end portions (or connection portions) which are also short portions of the antenna wire which may be connected to the terminals of the chip module, such as in U.S. Pat. No. 6,233,818 or U.S. Pat. No. 7,546,671 ("looping")

a main or intermediate portion which is the longest portion of the antenna wire, between the two end portions, and which may be formed into several turns of a flat coil antenna Some Examples of "Final Products"

Transponders such as are shown in FIGS. 1A,B and 1C,D may be considered to be "interim products" in that some further steps or elements may be needed before getting the product into the "hands of the consumer". For example, various cover layers may be laminated to the inlay substrate to protect (and secure) the transponder, as well as for imprinting with information. The end result, or "final product", may be a secure document such as an electronic passport or a smart card.

FIG. 1F shows an example of a security document which may be a National ID (identification) Card (or electronic ID, "eID" card) comprising a multi-layer (2 layer) inlay substrate, and additional layers comprising a top overlay layer and a bottom overlay layer. An RFID chip module and corresponding antenna (not shown) may be mounted in the inlay substrate(s). The chip module (not shown) may have a mold mass and a leadframe. The additional top and bottom layers may be anti-scratch layers, and protect the inlay substrate(s). The eID card, inlay substrate layer and top and bottom layers are not shown to scale.

Some dimensions for and properties of the layers may be:

| Top overlay layer | transparent | 80 microns |
| Inlay substrate mold | white | 185 microns |
| Inlay Substrate-Lead | transparent | 80 microns |
| Bottom Overlay Layer | transparent | 80 microns |

The layers of the inlay substrate for a smart card may comprise PVC, which has limited life. Smart cards are often replaced (renewed) every few years.

The layers of the inlay substrate for a national ID care may comprise PC, which may be more durable (longer life) than PCV.

FIGS. 1G and 1H illustrate an exemplary construction for an electronic passport cover, corresponding generally to the single layer inlay substrate construction shown in FIG. 1D. The inlay substrate for a US passport may comprise Teslin™.

A cover layer may be disposed over the inlay substrate 1 for the final product. The material for the cover layer may be a cloth product, with chemistry in the coatings and a leather-like appearance to the cloth, such as by Holliston Inc. (905 Holliston Mills Road, Church Hill, Tenn. 37642; www.holliston.com)

Some Examples of Chip Modules

In the main hereinafter, the discussion may focus on RFID chip modules which are leadframe-type modules. However, some of the techniques for producing security documents discussed herein may also be applicable to epoxy glass modules (chip on FR4, wire bonded, glob topped).

FIG. 1I shows an example of an RFID chip module which is a "leadframe module" comprising:
- a leadframe having a thickness of approximately 80 μm
- an RFID chip disposed on and connected by wire bonds to the leadframe, having a thickness of approximately 80 μm
- a mold mass disposed over the chip and wire bonds, having a thickness of approximately 240 μm
- an antenna wire having end portions connected to "connection areas" of the leadframe, typically on a side of the leadframe opposite the RFID chip (as shown), but the end portions can also be connected to connection areas on the same side of the lead frame as the RFID chip.

The total thickness of the leadframe module may be 320 μm, such as for an inlay substrate having a thickness of approximately 356 μm. Generally, the chip module will be disposed in a recess in the inlay substrate so as to be concealed therein.

FIG. 1J shows an example of an RFID chip module which is an "epoxy glass module" comprising:
- an interconnect substrate, such as FR4 (printed circuit board substrate material), having a thickness of approximately 100 μm (FR4 is 100 μm and the chip & glob top 160 μm=overall 260 μm)
- an RFID chip, wire-bonded (alternatively flip-chip connected with solder bumps and underfiller, as illustrated) to the FR4 substrate, having a thickness of approximately 100 μm
- a glob top epoxy disposed over the chip and connections, having a thickness with chip of approximately 160 μm
- an antenna wire having ends connected to "connection pads", typically on the same side of the FR4 substrate as the RFID chip, but can also be connected on the opposite side of the FR4 substrate as the chip.

The total thickness of the epoxy glass module may be 260 μm, such as for an inlay substrate having a thickness of approximately 365 μm. Generally, the chip module will be disposed in a recess in the inlay substrate so as to be concealed therein.

Generally speaking, epoxy glass modules are inherently somewhat more flexible than leadframe modules. This is a factor that may need to be taken into consideration when incorporating an RFID module into a secure document. And, whereas leadframe modules are typically rectangular, the mold part (glob top) of an epoxy glass module are typically round.

It should be understood that, although FIG. 1J shows a flip chip connection between the RFID chip and the FR4 substrate, the chip can be wire-bonded to the substrate (such as was shown in FIG. 1I, for the leadframe-type module.)

SOME DEFINITIONS AND TERMINOLOGY

An "inlay" or "inlay laminate" may comprise an "inlay substrate" which is a planar sheet of plastic material, such as Teslin™. A "chip module" may be disposed in a "recess" in the inlay substrate. An antenna wire may be mounted to the inlay substrate, such as by embedding (countersinking) within or adhesively attaching (sticking, placing) to a surface of the inlay substrate.

A chip module may include an RFID (radio frequency identification) chip and means such as a leadframe or an epoxy-glass (FR4) substrate for facilitating interconnecting the RFID chip with an antenna. Some RFID chips have integrated antennas, and do not require the means for interconnecting with and antenna. As used herein "chip" and "chip module" can encompass many configurations of a silicon die or a packaged chip.

The antenna is typically in the form of a flat coil of wire having a number (such as 4 or 5) of turns and two ends or end portions which are connected to corresponding contact pads (contact areas, terminals) of the chip module. The antenna may be a dipole antenna having two wire segments with two inner ends, or any other antenna configuration suitable for connection to a chip or chip module in an inlay. The wire may include any elongate means for conveying or radiating signals, such as metallic wire (such as gold, aluminum, copper, silver), of any profile (such as round or rectangular), either bare, coated or color coated, as well as optical fibers.

The recess for receiving the chip module extends into the inlay substrate from a "top" surface thereof, and may be a "window" type recess extending completely through the inlay substrate to a "bottom" surface thereof, or the recess may be a "pocket" type recess extending only partially through the inlay substrate towards the bottom surface thereof.

The recess may have a "straight" profile—in other words, substantially constant cross-dimension through (or into) the inlay substrate. Or, the recess may have a "stepped" profile, including a larger cross-dimension at the top surface of the substrate than at (or towards) the bottom surface of the inlay substrate. The recess is generally sized and shaped to accommodate the size and shape of the chip module being disposed therein. The term "cavity" may be used interchangeably with "recess". A stepped recess profile is commonly used to accommodate a leadframe module, since the leadframe is typically wider (8-10 mm) than the mold mass (4-6 mm) of the chip module.

A secure document, such as an electronic passport (e-passport) comprises an "inlay" (inlay substrate, plus chip module, plus antenna) and a "cover" layer (or substrate). The inlay plus cover constitute an "e-cover". The "inlay" may be fully functional, but rarely would be used on its own, without additional, protective layers (such as the cover layer) laminated thereto.

The inlay substrate may comprise, for example, Teslin™, PVC, Polycarbonate (PC), polyethylene (PE) PET (doped PE), PETE (derivative of PE), and the like.

The cover layer may comprise, for example, PVC, coated offset board, with or without optical bleacher or acrylic coated cotton, supplied in web form or in sheets.

E-covers may be manufactured several at a time, such as "3up", on an "inlay sheet" which may include several (a plurality of) distinct "transponder areas" (or "transponder sites") on an "oversize" inlay substrate, for forming a plurality of e-covers. Each transponder site may comprise a chip module and antenna mounted to the inlay substrate. The chip module and antenna may be referred to as a "transponder". A cover layer may be laminated (joined) thereto, then the individual e-covers may be separated from the inlay sheet.

GLOSSARY & DEFINITIONS

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

| | |
|---|---|
| Antenna Wire | The antenna wire for the inlays described herein may comprise self-bonding copper wire or partially coated self-bonding copper wire, enamel copper wire or partially coated enamel wire, silver coated copper wire, un-insulated wire, aluminum wire, doped copper wire or litz wire.<br>The antenna wire may have a diameter of approximately 50-120 µm, and may be coated with enamel so as to be insulated and/or "self-bonding".<br>Insulated wire is relevant where the wire needs to cross over itself. (see for example FIG. 1A)<br>Self-bonding wire is relevant to adhesively mounting the wire to the surface of the inlay substrate (or a layer of a multi-layer inlay substrate).<br>An exemplary wire is Electrisola brand enamelled copper wire. 0.010-0.50 mm (AWG 24-58) (0.010 mm = 100 µm). A 112 µm wire may have only a few microns of insulation on it.<br>With an adhesive layer and an insulation layer, the overall diameter may be 132 µm (for example). |
| chip | As used herein, the word "chip" can encompass many configurations of a silicon die or a packaged chip. Generally, a packaged chip would be referred to as a "chip module". The silicon die for example can have metallized bumps to facilitate the direct connection of the wire ends of an antenna to form a transponder or tag device. A package chip can include various structures such as a tape automated bonding module, a chip module, a flip chip module, a leadframe, a glass epoxy flexible module, a chip carrier, a strap, an interposer or any form of packaging to facilitate transponder manufacturing. |
| inlay | An inlay substrate typically has a plurality, such as array of transponder sites on a substrate which matches the position of the data or graphics on a printed sheet or holder/cover page of a smart card or electronic passport respectively. A secure inlay is similar to a conventional inlay but with additional features such as an additional RFID chip on the transponder site storing information about the production processes in the value chain as well as having personalization features integrated into the inlay such as a hologram, an anti-skimming material or security codes embedded into the inlay. |
| laminating | As used herein, in its most general sense, laminating refers to joining two (or more) sheets of material to one another. The sheets may be the same material as one another. Two different (and distinct) kinds of lamination are discussed herein.<br>Hot Lamination which used temperature and pressure to cause the two sheets of material to fuse with one another<br>Cold Lamination in which an adhesive is used to join the two sheets of material to one another. |
| laser ablation | Laser ablation is the process of removing material from a solid (or occasionally liquid) surface by irradiating it with a laser beam. At low laser flux, the material is heated by the absorbed laser energy and evaporates or sublimates. At high laser flux, the material is typically converted to a plasma. Usually, laser ablation refers to removing material with a pulsed laser, but it is possible to ablate material with a continuous wave laser beam if the laser intensity is high enough.<br>The depth over which the laser energy is absorbed, and thus the amount of material removed by a single laser pulse, depends on the material's optical |

| | -continued |
|---|---|
| | properties and the laser wavelength. Laser pulses can vary over a very wide range of duration (milliseconds to femtoseconds) and fluxes, and can be precisely controlled. This makes laser ablation very valuable for both research and industrial applications.<br>The simplest application of laser ablation is to remove material from a solid surface in a controlled fashion. Laser machining and particularly laser drilling are examples; pulsed lasers can drill extremely small, deep holes through very hard materials. Very short laser pulses remove material so quickly that the surrounding material absorbs very little heat, so laser drilling can be done on delicate or heat-sensitive materials.<br>A typical laser for ablating synthetic material such as Teslin ™ or Polycarbonate is an ultra violet diode pump laser operating at the wavelength of 385 nm. |
| mold mass | Mold mass is the part of a chip module which encapsulates the area surrounding a silicon die mounted on a leadframe or carrier and the wire bond connections (Au wire Ø 24 µm) thereto. The mold mass is typically epoxy duraplast and the encapsulation process is transfer molding. Alternatively, the silicon die and wire interconnections can be protected by dispensing a fast curing resin (glob top). |
| RFID | Short for "Radio Frequency Identification". An RFID device interacts, typically at a limited distance, with a "reader", and may be either "passive" (powered by the reader) or "active" (having its own power source, such as a battery). |
| Sonotrode | A wire embedding apparatus may be an ultrasonic wire guide tool, known as a "sonotrode", with a wire feed channel (capillary) passing through the center of the wire guide tool. The wire conductor is fed through the wire guide tool, emerges from the tip, and by application of pressure and ultrasonic energy the wire conductor is "rubbed" into the substrate, resulting in localized heating of the wire conductor and subsequent sinking of the wire conductor into the substrate material during the movement of the wire guide tool. A wire placement apparatus may also be an ultrasonic tool similar in function to an ultrasonic horn which heats the wire to form an adhesion with a substrate. |
| Teslin | A single layer of microporous, polyolefin-based, uncoated film that bonds readily and firmly with toners, inks, adhesives and laminating films. Teslin is a waterproof synthetic material that works well with an inkjet printer, laser printer, or thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 1up, 2up, 3up, 6up, and 8up. Teslin is used widely in the production of drivers licenses, voter ID cards, and other forms of identification card. Because of its commercial availability, Teslin is also often found used for counterfeit or fake IDs. "Teslin" is a registered trademark of PPG Industries, Inc. for synthetic printing sheet. |

SOME DEFINITIONS

Generally, an RFID transponder which is a secure document such as an e-passport or a smart card is formed by installing a chip module on an inlay substrate, mounting an antenna wire on the substrate, connecting the antenna wire to terminals of the chip module, and laminating a cover layer onto the substrate. The following components, materials and processes may be used.

| | |
|---|---|
| transponder | As used herein, the term "transponder" may refer to a secure document such as ,,, e-pass ,,, smart card capable of storing user-specific data and interacting with an external reader device (or simply "reader", typically for identification or access control, such as at passport control or at the secure entry of a building (or secure area within a building). |
| chip module | As used herein, the term "chip module" may refer to ,,, leadframe,,, mold mass ,,, terminals |
| antenna wire | As used herein, the term "antenna wire" (or simply "wire") may refer to ,,, gauges, coated (self-sticking) etc |
| inlay substrate | As used herein, the term "inlay substrate" (or simply "substrate") may refer to Teslin, PC, etc. and some dimensions (such as for passport and smart card) 3up etc |
| cover material | As used herein, the term "cover material" (or "cover layer", or simply "cover") may refer to ,,, |
| mounting | As used herein, the term "mounting" may refer to either of . . . |

| | -continued |
|---|---|
| | (i) the specific concept of using a sonotrode or similar tool to cause the antenna wire to be embedded (or scribed) into the surface of the substrate. FIGS. 1 and 2 of U.S. Pat. No. 6,233,818 shows this quite well.<br>(ii) the broader concept of how the wire is arranged or pre-positioned on the substrate in relationship to the chip module, such as with loops adjacent terminals as in U.S. Pat. No. 7,546,671 ("looping") |

"Mounting" and "Connecting"

As used herein, the term "mounting" may refer to how the antenna wire is mounted to the inlay substrate, typically in preparation for (previous to) connecting it to the terminals of the chip module.

As shown in FIG. 1C, one way of mounting the antenna to the substrate and connecting it to the chip module may be to connect one end of the antenna wire to a first terminal of the chip module, then scribe (or embed) the turns of the antenna wire into the substrate, then connect the other end of the antenna wire to the second terminal of the chip module, and indeed such a technique is disclosed in U.S. Pat. No. 6,088,230. However, such a technique requires a tool that can perform connecting (bonding) as well as mounting (embedding).

It is important to understand that it is the ends of the wire that are connected to the terminals of the chip module in U.S. Pat. No. 6,088,230. In contrast thereto, the technique disclosed in U.S. Pat. No. 6,233,818 (refer to FIG. 1A) discloses mounting the first end and a short length (first end segment) of the antenna wire to the inlay substrate, near a first terminal of the chip module. (Using a sonotrode, this anchors the end of the antenna wire to the substrate.)

then guide a next portion (first end portion or connection portion) of the wire over a first terminal of the chip module, without connecting it thereto. (As will be evident, at this stage only a sonotrode is being used. Therefore, the connection cannot be made.)

then, having passed over the chip module, resume mounting the antenna wire into the substrate, forming the turns of the antenna with the intermediate portion of the antenna wire, then, return to near the second terminal of the chip module, then, guide a next portion (second end portion or connection portion) of the wire over the second first terminal of the chip module, without connecting it thereto. (Remember, Only a Sonotrode is being Used.)

then, having passed over the chip module, resume mounting a short length (second end segment, including second end) of the antenna wire into the substrate.

then, sever the wire. At this stage, only a sonotrode tool has been used, the wire is mounted into the substrate, and two "connection portions" of the wire are located over the respective two terminals of the chip module and are ready to be connected thereto.

Then, in a second stage of the process, perform connecting the connection portions of the antenna wire to the respective two terminals of the chip module, using a thermode tool.

The term "connection portion" is "generic", and although not explicitly used in U.S. Pat. No. 6,233,818, from the description presented above it is evident that the connection portions of the antenna wire are portions of the antenna wire which are near the ends of the wire, and are those portions of the wire that are ultimately connected to the terminals of the chip module.

In the descriptions presented herein, the term "end portion" may be used to describe such a portion of the wire which is near the end of the wire, per se, and which is connected to the terminal. In other words, "end portion" equals "connection portion".

Usually, in its generic sense, the term "end portion" would refer to an entire final portion of the wire including the end (per se). But when the end is embedded in the substrate, and the next "end portion" of the wire is connected to the terminal, the "end portion" obviously indicates an end portion of the wire excluding the end (per se).

Furthermore, when (for example) the end of the antenna wire is embedded in the substrate (as in U.S. Pat. No. 6,233, 818) or connected to the terminal (as in U.S. Pat. No. 6,088, 233), the end will necessarily include a short length of wire (end segment) which includes the end per se. For example, "end" as used herein may include the last few (e.g., 1-2) millimeters (mm) of wire, at either end of the antenna wire. In other words, the terms "end" and "end segment" may be used interchangeably, as may be appropriate to the context of what is being described.

Hence, in general, when describing and of the prior art or inventive methods of mounting (embedding and arranging on the substrate, typically using a sonotrode tool) and connecting (bonding to the terminals of the transponder chip, typically using a thermode tool) an antenna wire in a transponder discussed herein, "end" may be taken to mean a geometric end of the antenna wire including the last few millimeters thereof, in other words, including a short end segment "end portion" may be taken to mean a portion of the antenna wire which immediately follows the end (or end segment), and which may be used to effect the connection of the antenna wire to the terminal of the chip module. The "end portion" may also be referred to as the "connection portion" of the wire an "intermediate portion" of the antenna wire may be taken to mean a main (major) portion of the antenna wire, between the two end portions thereof, which is typically embedded in the substrate to form the turns of the antenna.

SOME PATENTS AND PUBLICATIONS

Four techniques for mounting and connecting an antenna wire in a transponder will be illustrated and described, using a "common format".

FIGS. 2A-B and 2C-2F illustrate a technique exemplified by U.S. Pat. No. 6,088,230.

FIGS. 3A-C and 3D-3G illustrate a technique exemplified by U.S. Pat. No. 6,233,818.

FIGS. 4A-E and 4F-4I illustrate a technique exemplified by U.S. Pat. No. 7,546,671.

FIGS. 5A-E and 5F-5I illustrate a technique exemplified by US 2010/0141453.

See also US 2008/0150817

U.S. Pat. No. 6,088,230

FIGS. 2A-B illustrate a technique 200 for mounting and connecting an antenna wire in a transponder as may be exemplified by U.S. Pat. No. 6,088,230 ("230 patent"), incorporated by reference herein. (FIGS. 1, 3, 4 and 6 of the '230 patent are reproduced herein as FIGS. 2C-2F.)

A chip module 208 (compare 108) is disposed in a recess 206 (compare 106) in an inlay substrate 202 (compare 102). An antenna wire 210 (compare 110) is mounted to the substrate 202 and connected to the chip module 208 as follows.

a first end (or end segment) of the antenna wire is connected (bonded) to a first terminal 208a of the chip module 208, between the points "a" and "b". This may be done with a thermode-type tool (not shown), and the bonding is indicated by the symbols "/".

the antenna wire 210 is then guided onto the substrate 202 at point "c" and embedded to form the turns of the antenna. The dashed lines indicate the main, intermediate portion of the antenna wire, embedded between the points "c" and "d". This may be done with a sonotrode-type tool (not shown), and the embedding is indicated by the symbols "x".

embedding continues until the point "d" near the second terminal 208b of the chip module 208.

The second end (or end segment) of the antenna wire 110 is then connected (bonded) to the second terminal 208b of the chip module between the points "e" and "f".

FIG. 2B is a cross-sectional view of a transponder formed using the technique 200, such as taken on a line 2B-2B through FIG. 2A. Notice that the substrate is shown as a single layer (rather than multi-layer) substrate, and that the recess is shown is a "pocket" type recess (rather than a "window" type recess) extending only partially through the inlay substrate.

The technique of the 230 patent is a "one stage" process, but requires a tool capable of performing both mounting and connecting the antenna wire. In other words, such a "dual-purpose" tool must be able to function as a thermode-type tool when connecting the antenna wire to the terminals of the chip module, as well as to function as a sonotrode-type tool when mounting the antenna wire to the inlay substrate.

U.S. Pat. No. 6,233,818

FIGS. 3A-C illustrate a technique 300 for mounting and connecting as exemplified by U.S. Pat. No. 6,233,818 ("818 patent"), incorporated by reference herein. (FIGS. 1, 3, 4 and 6 of the 818 patent are reproduced herein as FIGS. 3D-3G.)

A chip module 308 (compare 108) is disposed in a recess 306 (compare 106) in an inlay substrate 302 (compare 102). An antenna wire 310 (compare 110) is mounted to the substrate 302 and connected to the chip module 308 as follows.

In a first stage of the process (see FIG. 3A), a first end of the antenna wire 110 is embedded (scribed) a short distance into the inlay substrate 302, near a first terminal 306a of the chip module 308, between the points "a" and "b". This may be done with a sonotrode-type tool, and the embedding is indicated by the symbols "x".

the antenna wire 310 is then guided over the first terminal 308a, without connecting (bonding) the wire to the terminal, and embedding resumes on the opposite side of the chip module 308, at a point "c". This is also done with the sonotrode-type tool.

The dashed lines indicate the main, intermediate portion of the antenna wire, embedded between the points "c" and "d". This may be done with a sonotrode-type tool, and the embedding is indicated by the symbols "x".

embedding continues until the point "d" near the second terminal 306b of the chip module.

The antenna wire 310 is then guided over the second terminal 306b, without connecting (bonding) the wire to the terminal, and embedding resumes for a short distance on the opposite side of the chip module, between the points "e" and "f". This is also done with the sonotrode-type tool.

In the first stage (described above), the antenna wire 310 has been "mounted", and is ready to be "connected" in a second stage (described below).

In the second stage of the process (see FIG. 3B), the two end portions of the antenna wire (exclusive of the ends of the antenna wire, which are embedded in the substrate) which are located (during the mounting stage) passing over the two terminals 208a and 208b of the chip module 208 are connected to the terminals 208a and 208b of the chip module 208. This may be done with a thermode-type tool (not shown), and the bonding is indicated by the symbols "/".

FIG. 3C is a cross-sectional view of a transponder formed using the technique 300, such as taken on a line 3C-3C through FIG. 3A.

In contrast with the 230 patent, the technique in the 818 patent is a two step (two stage, two phase) process involving (i) in a first stage, mounting the antenna wire on the substrate in given spatial relationship with the chip module, then (ii) in a second stage, connecting end portions (not including the ends or end segments) of the antenna wire to the terminals of the chip module. In the first stage, a sonotrode-type tool is used for mounting. In the second stage, a thermode-type tool is used for connecting. Another contrast is that in the 818 patent the ends (including end segments) of the antenna wire are mounted to (embedded in) the substrate, and in the 230 patent the ends of the antenna wire are connected (bonded) to the terminals of the chip module.

The technique in the 818 patent is generally more "practical" process than that of the 230 patent since it does not require a dual-purpose tool, and is currently being used in the mounting and connecting of antenna wires in secure documents such as electronic passports and smart cards.

U.S. Pat. No. 7,546,671

FIGS. 4A-4E illustrate a technique 400 for mounting and connecting as exemplified by U.S. Pat. No. 7,546,671 ("671 patent"). (FIGS. 2A, 4D, 4E and 9A of the 671 patent are reproduced herein as FIGS. 4F-4I.)

A chip module 408 (compare 108) is disposed in a recess 406 (compare 106) in an inlay substrate 402 (compare 102). An antenna wire 410 (compare 110) is mounted to the substrate 402 and connected to the chip module 408 as follows.

In a first stage ("mounting") of the process (see FIG. 4A), a first end of the antenna wire 410 is embedded (scribed) a short distance, such as 5-8 mm into the inlay substrate 402, near a first terminal 408a of the chip module 408, between the points "a" and "b". This may be done with a sonotrode-type tool (not shown), and the embedding is indicated by the symbols "x". This serves to "anchor" the first end of the antenna wire 410 in the inlay substrate 402.

Notice that the wire between the points "a" and "b" is not in the direction of (not oriented towards) the first terminal.

Embedding stops at the point "b" near the first terminal 406a of the chip module 408, and for a short distance, such as 5-10 mm between the points "b" and "c" the antenna wire is not embedded. (The sonotrode-type tool may be lifted off the surface of the substrate, and moved between the points "b" and "c", playing out wire between these two points. The ultrasonic may be turned off during this non-embedding segment.) This results in a first end portion 410a of the antenna wire which is "pre-positioned" adjacent (near) the first terminal of the chip module. This is done with the sonotrode-type tool.

In other words, the end portion 410a of the antenna wire 410 passes nearby, but not over the first terminal 408a of the chip module 408.

The end portion 410a of the antenna wire 410 is disposed outside an area occupied by the chip module 408, such as outside the recess 406 within which the chip module 408 is disposed.

In the process of lifting the sonotrode-type tool (between the points "b" and "c", a free-standing "loop" may be formed, as described in greater detail hereinbelow.

Embedding resumes at the point "c" (the sonotrode-type tool is lowered, and the ultrasonic turned on), and the dashed lines indicate that a main, intermediate portion of the antenna wire 410 is embedded between the points "c" and "d". This may be done with a sonotrode-type tool, and the embedding is indicated by the symbols "x".

Approximately 1 meter of wire may be used forming the turns of the antenna (not shown) between the points "c" and "d".

Embedding stops at the point "d" near the second terminal 408b of the chip module 408, and for a short distance, such as 5-10 mm between the points "d" and "e" the antenna wire is not embedded. (The sonotrode-type tool may be lifted off the surface of the substrate, and moved between the points "d" and "e", playing out wire between these two points. The ultrasonic may be turned off during this non-embedding segment.) This results in a second end portion 410b of the antenna wire which is "pre-positioned" adjacent (near) the second terminal 408b of the chip module 408. This is done with the sonotrode-type tool.

In other words, the end portion 410b of the antenna wire 410 passes nearby, but not over the second terminal 408b of the chip module 408.

The end portion 410b of the antenna wire 410 is disposed outside an area occupied by the chip module 408, such as outside the recess 406 within which the chip module 408 is disposed.

In the process of lifting the sonotrode-type tool (between the points "d" and "e", a free-standing "loop" may be formed, as described in greater detail hereinbelow.

Embedding resumes for a short distance such as 3-5 mm into the inlay substrate, on the opposite side of the chip module 408, between the points "e" and "f". This may also be done with the sonotrode-type tool, and serves to "anchor" the second end of the antenna wire 410 in the inlay substrate 402.

This completes the first "mounting" stage. The antenna wire 410 has been mounted with its two end portions 410a and 410b (exclusive of the ends of the antenna wire which are anchored in the inlay substrate) located adjacent to (nearby, but not over) the corresponding two terminals 408a and 408b of the chip module 408, respectively.

In a second stage of the process (See FIG. 4B), the two end portions 410a and 410b which adjacent to the two terminals 408a and 408b of the chip module 408 are repositioned to be directly over the terminals 408a and 408b of the chip module 408. A simple mechanical tool (not shown) may be used to reposition the free-standing loop end portions 410a and 410b of the antenna wire 410. See, for example, FIG. 9A of U.S. Pat. No. 7,546,671.

In a third stage of the process (see FIG. 4C), the end portions 410a and 410b of the antenna wire 410 are connected (bonded) to the terminals of the chip module. This may be done with a thermode-type tool (not shown), and the bonding is indicated by the symbols "/".

The un-mounted (not embedded), free-standing end portions 410a and 410b of the antenna wire may be in the form of arches, like conventional wire-bonding loops, oriented substantially perpendicular to the surface of the substrate. Hence the name "looping" which may be used to refer to this technique. The arches (loops) are of sufficient height so that when they are pushed over (repositioned), at least the apexes of the arches (loops) will reach the terminals of the chip module for connecting therewith.

FIG. 4D is a cross-sectional view of a transponder formed using the technique 400, such as taken on a line 4D-4D through FIG. 4C. Note the similarity, from the side view, with FIG. 3C, the technique of U.S. Pat. No. 6,233,818.

FIG. 4E is a perspective view showing the end portions ("loops") before repositioning. The curved arrow indicates how the loops will be repositioned (pushed over) onto the terminals of the chip module.

The cross-sectional view of FIG. 4D is similar in appearance to the cross-sectional view of FIG. 3C. This is because the "end result" in the 671 patent is similar to that of the 818 patent in that end portions of the antenna wire are connected (bonded) to the terminals of the chip module, and the ends of the antenna wire are mounted to (embedded in) the inlay substrate.

The top view of FIG. 4C is different than the top view of FIG. 3B. This is because in the 671 patent the end portions of the antenna wire initially pass by the chip module (hence, not over the terminals), and therefore an additional step of repositioning the end portions is required. In the 818 patent, the end portions of the antenna wire are initially guided directly over the terminals of the chip module, and no such repositioning step is required.

In contrast with the 818 patent which is a two-stage process (mounting, connecting), the technique in the 671 patent is a three-stage process (mounting, repositioning, connecting).

In contrast with the 230 patent wherein the ends of the antenna wire are connected to the terminals of the chip module (and thus, not embedded in the substrate), in the technique of the 671 patent the ends of the antenna wire are embedded in the substrate and it is only the end portions (exclusive of the ends) of the antenna wire which are connected to the terminals of the chip module. And, of course, the 230 patent describes what is essentially a one-stage process, and the 671 patent describes a three-stage process.

In contrast with the 230 patent, in the 671 patent the first end segment (between the points "a" and "b" is not directed at (in line with) the first terminal of the chip module. When the embedding stops, the first end portion 410a (between the points "b" and "c" is generally initially in line with the first end segment. Likewise, the second end segment (between the points "e" and "f" is not directed away from (in line with) the first terminal of the chip module, and the second end portion 401b (between the points "d" and "e") is initially in line with the second end segment. The end portions 410a and 410b are subsequently repositioned to be over the terminals 408a and 408b of the chip module 408.

US Publications No. 2008/0150817 and US 2010/0141453

FIGS. 5A-E illustrate a technique 500 for mounting and connecting as exemplified by US 2008/0150817 ("817 publication") and US 2010/0141453 ("453 publication"). FIGS. 5, 6 and 9 of the 453 publication are reproduced herein as FIGS. 5F-5I.)

A chip module 508 (compare 108) is disposed in a recess 506 (compare 106) in an inlay substrate 502 (compare 102). An antenna wire 510 (compare 110) is mounted to the substrate 502 and connected to the chip module 508 as follows.

In a first stage of the process (see FIG. 5A), embedding starts at a point "b", near a first terminal 508a of the chip module 508. This may be done with a sonotrode-type tool (not shown), and the embedding is indicated by the symbols "x".

A short length of wire, such as 5-10 mm between the points "a" and "b" is "residual" wire previously extending from the sonotrode-type tool and is not embedded, but rather is "pre-positioned" adjacent (near) the first terminal 508a of the chip module 508.

The non-embedded short length of residual antenna wire between "a" and "b" constitutes a first end portion 510a (including the end) of the antenna wire 510 which is positioned nearby, but not over the first terminal 508a of the chip module 508.

Embedding continues, and the dashed lines indicate that a main, intermediate portion of the antenna wire 510 is embedded between the points "b" and "c". This may be done with a sonotrode-type tool, and the embedding is indicated by the symbols "x".

Approximately 1 meter of wire may be used forming the turns of the antenna (not shown) between the points "c" and "d".

Embedding stops at the point "c" near the second terminal 508b of the chip module 108, and for a short distance, such as 5-10 mm between the points "c" and "d" the antenna wire is not embedded. This is done with the sonotrode-type tool.

This results in a second end portion 510b (including the end) of the antenna wire 510 which is "pre-positioned" adjacent (near) the second terminal of the chip module.

In other words, the end portion 510b of the antenna wire 510 is positioned nearby, but not over the second terminal 506b of the chip module 508.

In a second stage of the process (see FIG. 5B), the two end portions of the antenna wire 510 (including the ends of the antenna wire) which are pre-positioned adjacent to (nearby, but not over) the two terminals of the chip module are positioned ("re-positioned") to be over the terminals of the chip module 508. This is done with a tool (not shown). The end portions (including ends) of the antenna wire may be mechanically moved into position, such as by a brush or comb or other mechanical instrument (element 102 in FIG. 6 of the 453 patent), hence the name "brushing" for this technique.

FIG. 7 of the 453 publication is reproduced here as FIG. 5I, and shows a variation on "brushing", where the ends of the antenna wire are temporarily secured to the substrate, but are pulled out (FIG. 8) when repositioned.

In a third stage of the process (see FIG. 5C), the two end portions of the antenna wire 110 are connected (bonded) to the two terminals 108a,b of the chip module 108. This may be done with a thermode-type tool (not shown), and the bonding is indicated by the symbols "/".

FIG. 5D is a cross-sectional view of a transponder formed using the technique 500, such as taken on a line 5D-5D through FIG. 5C.

FIG. 5E is a perspective view showing the end portions before repositioning. The curved arrow indicates how the end portions will be repositioned (pushed over) onto the terminals of the chip module.

As is apparent from the view of FIG. 5D (compare FIG. 2C), the "end result" in the 817 (or 453) publication is similar to that of the 030 patent in that ends of the antenna wire connected (bonded) to the terminals of the chip module. In contrast with either the 818 patent or the 671 patent (Looping Method), in the 817 publication the ends of the antenna wire are not embedded in the substrate (except for the variation shown in FIG. 5I, where the ends are temporarily embedded).

In contrast with the 818 patent,
   in the technique in the 817 (or 453) publication the ends of the antenna wire are not embedded in the substrate.
   the technique of the 817 (or 453) publication requires repositioning.

In contrast with the 230 patent, in the technique in the 817 (or 453) publication
   mounting and connecting are performed in two stages, rather than in one stage, and
   the technique of the 817 (or 453) publication requires repositioning.

An important point to note in the technique of the 817 (or 453) publication is that it is critical to ensure that there is a pre-determined length of residual wire emanating from the sonotrode prior to starting a transponder site (here, "transponder site" refers to substrate plus chip plus antenna). As noted at page 5 . . .

An important aspect of the present invention is lengthening or extending the segment of wire that extends from the embedding tool (or embedding head) both before and after the wire is cut at the completion of a transponder site embedding operation. More specifically, after completion of wire embedding at a transponder site, the insulated wire is cut in order to move to the next transponder site. Cutting the wire leaves a residual amount of wire dangling from the embedding tool equal in length to the distance between the embedding tool and the cutting tool. This residual wire is shown in FIG. 1. This residual wire is normally used to commence a new transponder site, but in the current invention this residual length of wire is extended (or lengthened), simplifying the manufacture process compared to that of the prior art.

see FIG. 21 (sonotrode) and 22/23 (brushing) of the pub

[0062] Referring to FIG. 21, the embedding tool is shown in a raised position relative to the substrate. A greater length of residual wire is shown compared to that shown in FIG. 20. The additional length may be created by forcing air through channel 96 to push a length of wire out of the sonotrode. Alternatively, the wire may be embedded or fixed to the substrate and an additional length of wire drawn from the wire supply by moving the sonotrode.

[0063] Referring now to FIG. 22, an alternate method is shown for configuring the ends of the antenna coil so that they may be subsequently placed in a position for electrical connection to the terminal areas 40. As shown, the ends of the coil wire 104 are arranged as angular extensions from the embedded coil and they do not contact any part of the chip module 34. Rather, the ends 104 simply lay on the substrate adjacent to the chip module. These angular extensions may be formed by simultaneously moving the ultrasonic head and forcing air through channel 96 to expel wire from the device. Once the length of wire has been arranged on the substrate, the coil 50 is formed. Then another length of the wire is positioned generally as shown to form the second angular extension. It is also alternatively contemplated that the wire ends 104 could have a very small length thereof that is embedded which helps to stabilize the position of the length of wire prior to repositioning and bonding to a terminal area.

[0064] In the next step of the manufacturing process, the angular extensions are moved into position over the terminal areas as shown in FIG. 23 for interconnection with the terminal areas. If any portion of the wire ends 104 are embedded, the force of the element displacing the wire ends overcomes the embedding force. The angular extensions can be brushed or combed into position, such as by a rotating brush or comb 106. The brush or comb 106 can be another element incorporated in the group of working elements 16. Alternatively, the angular extensions may be gripped and rotated into position. The gripping may be accomplished by a machine or device, or manually by an operator. Once the angular extensions are placed over the terminal areas, the wire ends can be thermally bonded as discussed above. Thus, with the method of manufacture shown in FIGS. 22 and 23, it is not necessary to form loops but rather, just free extending ends that are placed on top of the substrate and then rotated into position for bonding. As discussed above with respect to the removal of insulation from the wire, insulation can also be removed from the angular extensions without damaging the chip module or any other portions of the inlay or transponder device since the angular extensions are spaced from the chip module.

SUMMARY

Various techniques are disclosed herein for (i) mounting an antenna wire to an inlay substrate, which may include positioning connection portions of the antenna wire over terminals of the chip module for subsequent (ii) connecting to the terminals of the chip module.

In the main hereinafter, the mounting stage (or phase) will be described. Generally, the connecting stage (or phase) may simply involve urging connection portions of the antenna wire onto the terminals of the chip module, and thermocompression bonding them thereto.

According to an embodiment of the invention, a method of mounting a wire to an inlay substrate for a transponder comprising a substrate, a chip module and an antenna wire disposed on the substrate, said chip module comprising two terminals, the method comprising: during mounting the wire, ensuring that at least one end portion including an end of the wire is positioned directly over a corresponding at least one terminal of the chip module for subsequent connecting thereto without requiring repositioning. Upon completing mounting the wire, the wire may be nipped at a selected point along the length of the wire so that it is frangible and can be broken off at the selected point. To perform nipping, a cutting mechanism may be disposed above the sonotrode.

Using the techniques disclosed herein, a residual end portion of wire may be formed for a next transponder site during mounting the antenna wire for a current transponder site.

The residual end portion of wire may have a predetermined length and orientation.

The antenna wire may comprises two lengths, or "stubs" of wire, rather than one continuous length of wire, and;
  a first of the two stubs of antenna wire may be formed by first embedding on the substrate, then causing a first unembedded end portion of the antenna wire to be located directly over a corresponding first one of the two terminals of the chip module;
  a second of the two stubs of antenna wire may be formed by first embedding on the substrate, then causing a second unembedded end portion of the antenna wire to be located directly over a corresponding second one of the two terminals of the chip module.

The two distal ends of the two stubs of antenna wire may be connected together, they may be connected together at a capacitor or a switch, and they may be of unequal length.

The two unembedded end portions of the antenna wire stubs may subsequently be connected to the corresponding two terminals of the chip module.

According to an embodiment of the invention, a sonotrode for mounting an antenna wire to an inlay substrate for a transponder, comprising:
  a capillary having an internal bore through which the wire passes;
  a clamping mechanism for holding the wire relative to the capillary;
  a cutting mechanism for at least partially severing the wire; wherein:
  the cutting mechanism is disposed above the capillary.

The clamping mechanism may be disposed above the capillary.

The cutting mechanism may be disposed between the capillary and the clamping mechanism.

Embodiments of the invention include any product or interim product formed by or with any of the tools, techniques, methods or processes described herein.

According to an embodiment of the invention, a method preparing a transponder site comprising an inlay substrate, a chip or chip module, and an antenna wire, comprising:
  forming at least one channel in the surface of the substrate to accept the antenna wire;
  in an area where the antenna wire must cross over itself, forming a first portion of the channel for a first portion of the antenna wire sufficiently deep that a second portion of the wire crossing over the first portion of the wire does not contact the first portion of the wire.

A second portion of the channel may be formed for accepting the second portion of the wire, wherein the second portion of the channel is shallower than the first portion of the channel.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
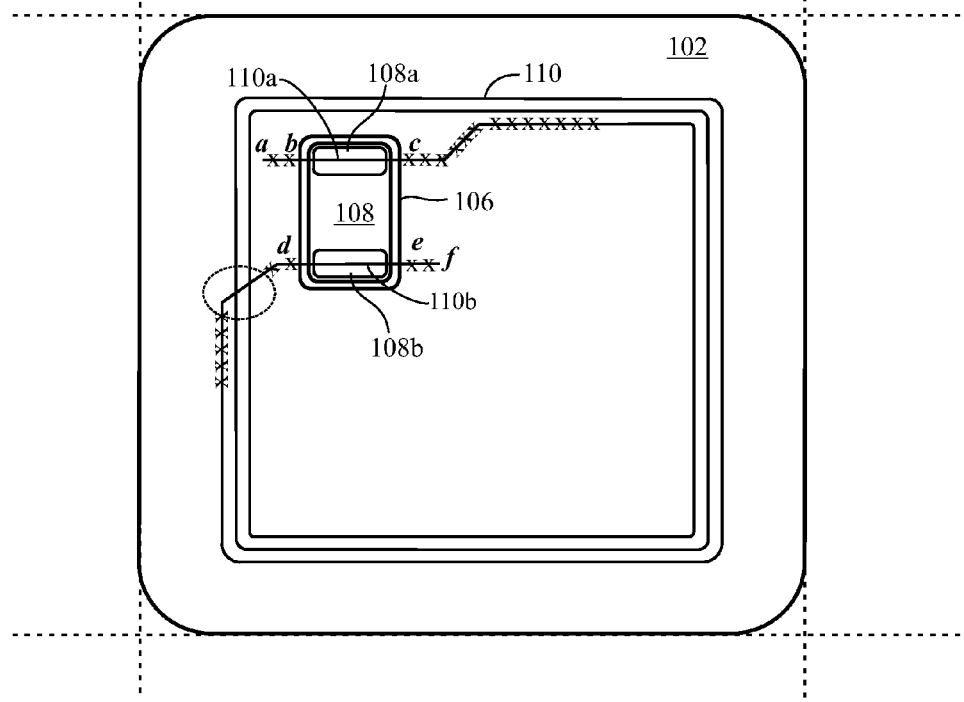

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of a transponder site (one of many on an inlay sheet), according to the prior art.

Figure 1B:
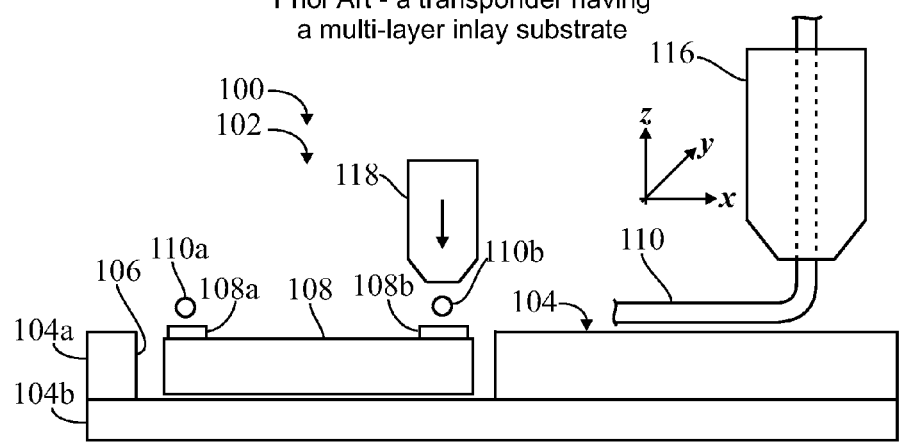

FIG. 1B is a side, cross-sectional view, partially exploded, of a wire being mounted to an inlay substrate and bonded to the terminals of a transponder chip, according to the prior art.

Figure 1C:
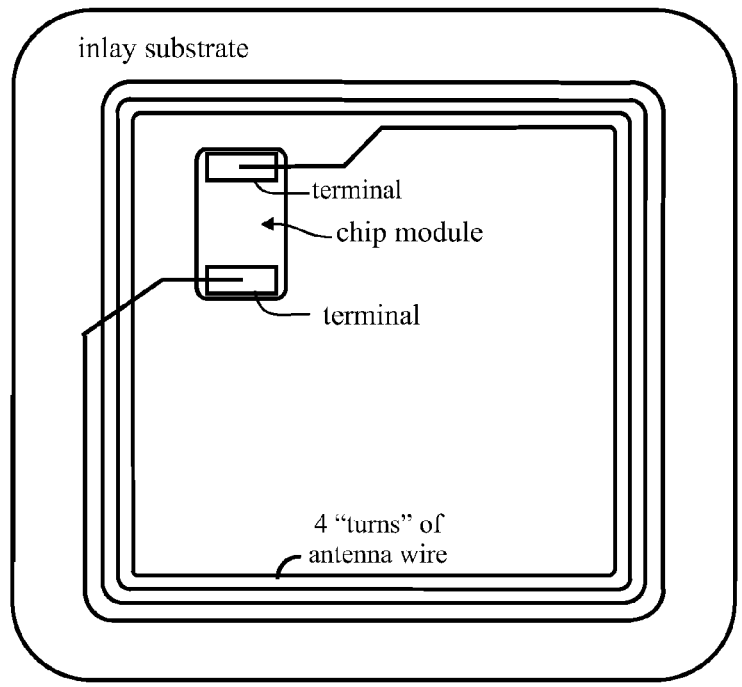

FIG. 1C is a top view of a transponder site (one of many on an inlay sheet), according to the prior art.

Figure 1D:
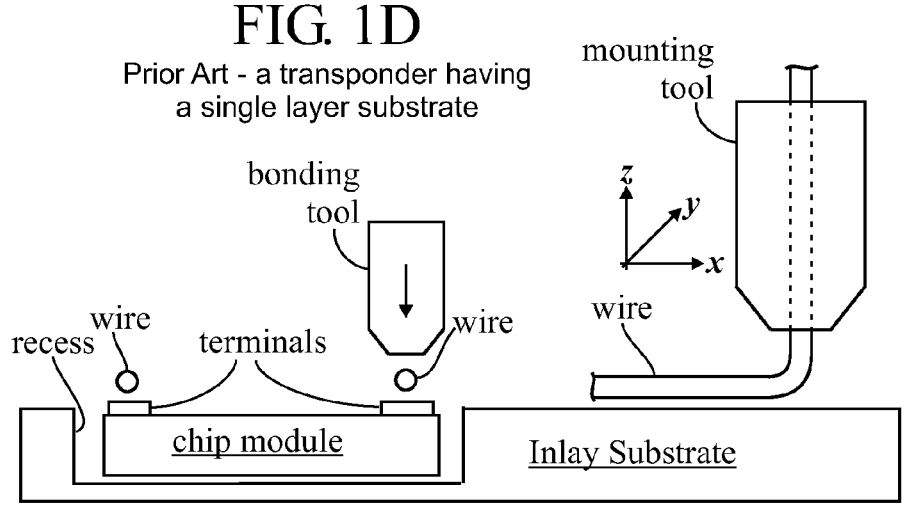

FIG. 1D is a side, cross-sectional view, partially exploded, of a wire being mounted to an inlay substrate and bonded to the terminals of a transponder chip, according to the prior art.

Figure 1E:
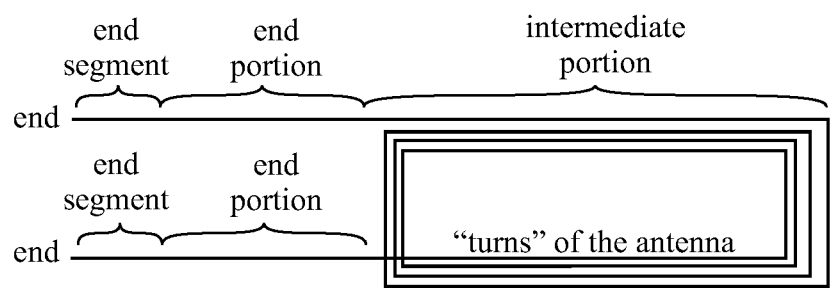

FIG. 1E is a diagram illustrating an antenna wire and various "portions" thereof.

Figure 1F:
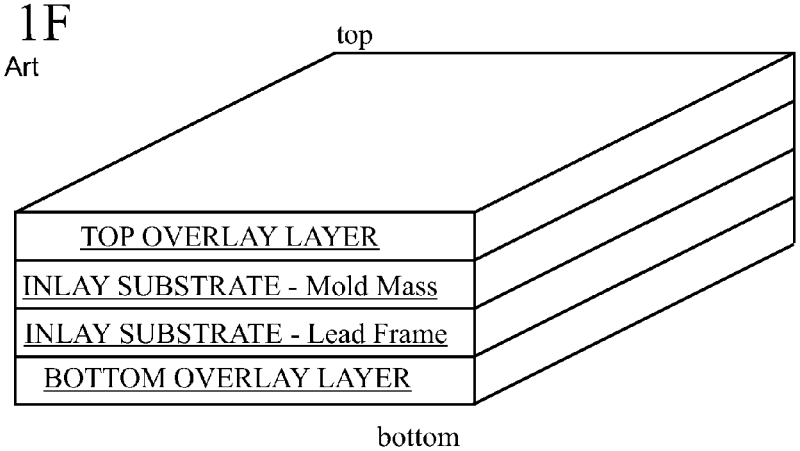

FIG. 1F is a cross-sectional view of a secure document, according to the prior art.

Figure 1G:
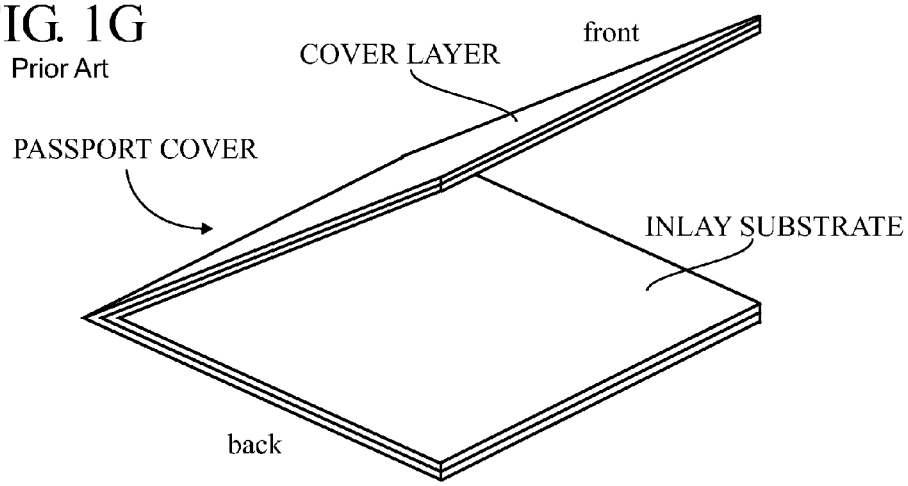

FIG. 1G is a perspective view of a secure document, according to the prior art.

Figure 1H:
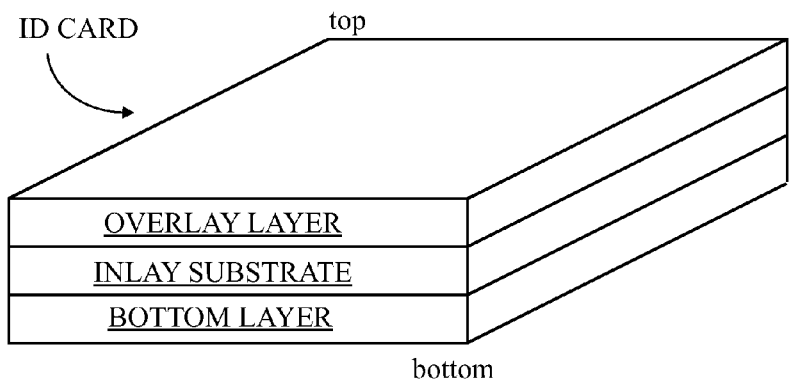

FIG. 1H is a cross-sectional view of a secure document, according to the prior art.

Figure 1I:
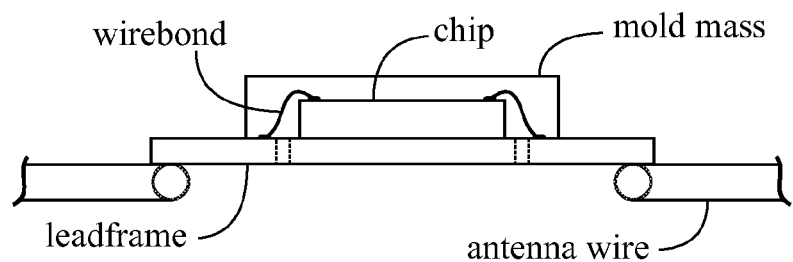

FIG. 1I is a cross-sectional view of a chip module which is a leadframe type module, according to the prior art.

Figure 1J:
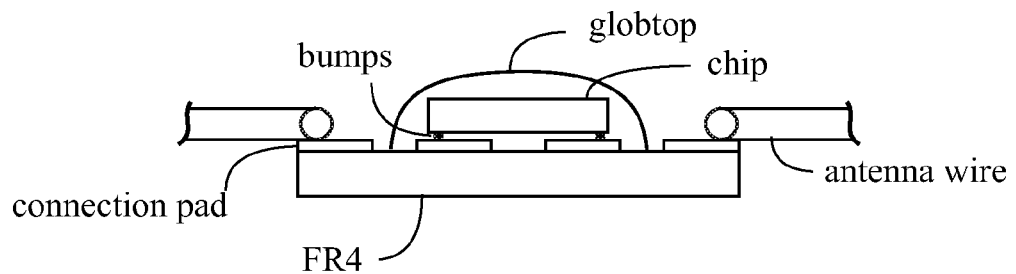

FIG. 1J is a cross-sectional view of a chip module which is an epoxy-glass type module, according to the prior art.

Figure 2A:
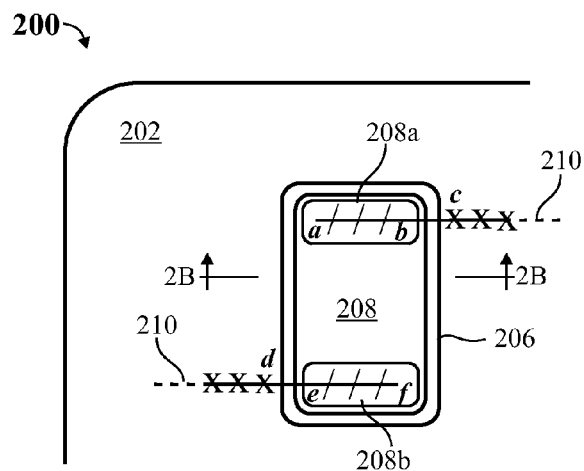

FIG. 2A is a top view of a technique for mounting and connecting an antenna wire in a transponder, according to the prior art.

Figure 2B:
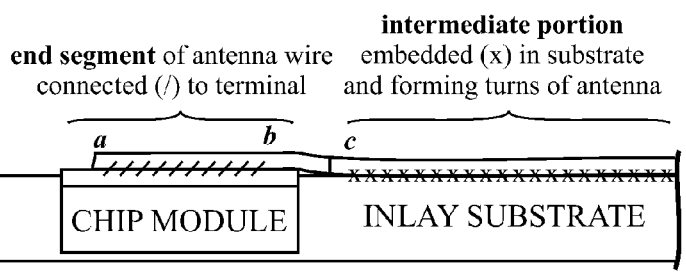

FIG. 2B is a cross-sectional view taken on a line 2B-2B through FIG. 2A.

FIGS. 2C, 2D, 2E, 2F are reproductions of various figures from U.S. Pat. No. 6,088,230.

Figure 3A:
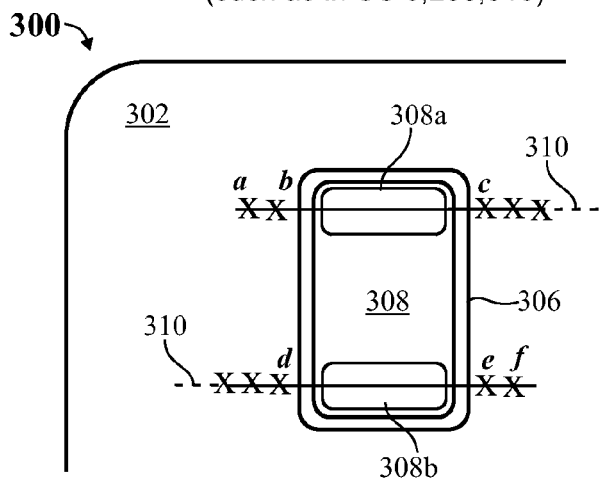

FIG. 3A is a top view of a technique for mounting an antenna wire in a transponder, according to the prior art.

Figure 3B:
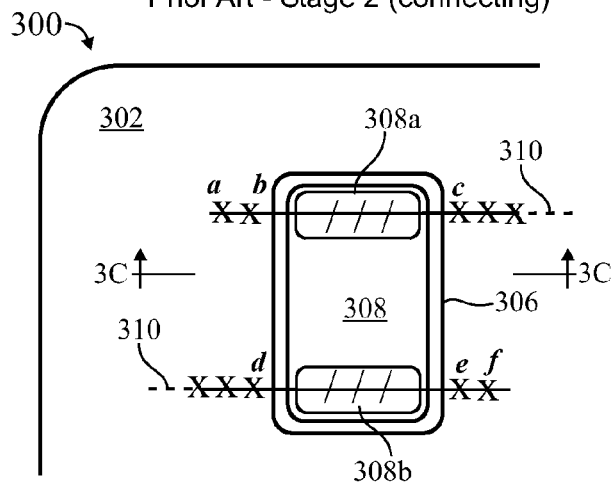

FIG. 3B is a top view of a technique for connecting an antenna wire in a transponder, according to the prior art.

Figure 3C:
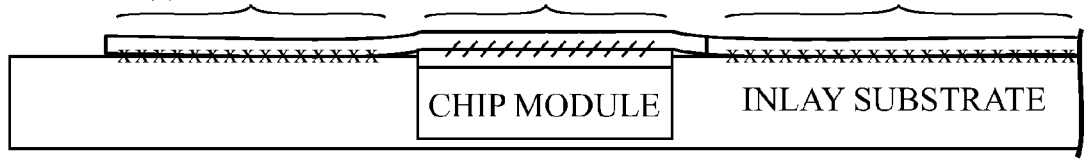
Figure 3D:
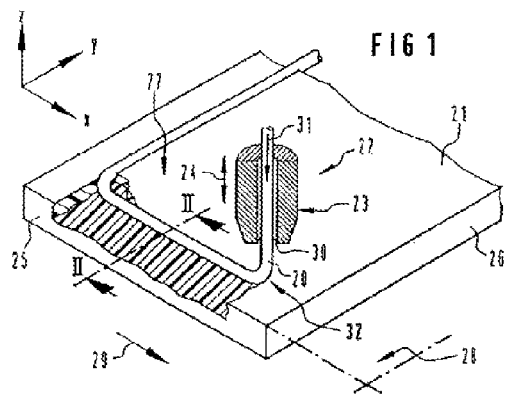
Figure 3E:
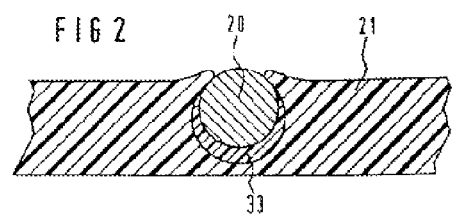
Figure 3F:
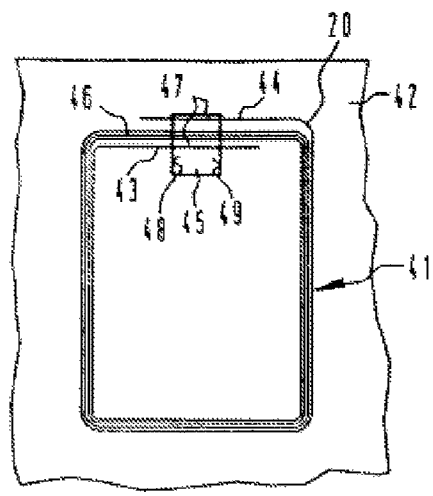
Figure 3G:
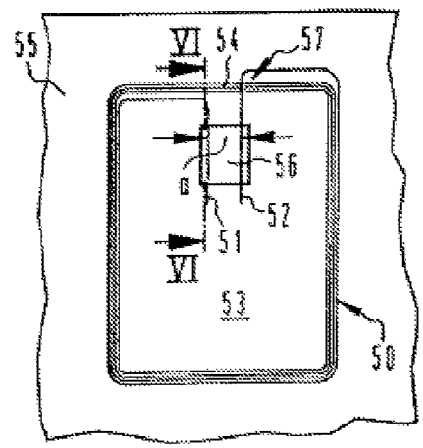

FIG. 3C is a cross-sectional view taken on a line 3C-3C through FIG. 3B.

FIGS. 3D, 3E, 3F, 3G are reproductions of various figures from U.S. Pat. No. 6,233,818.

Figure 4A:
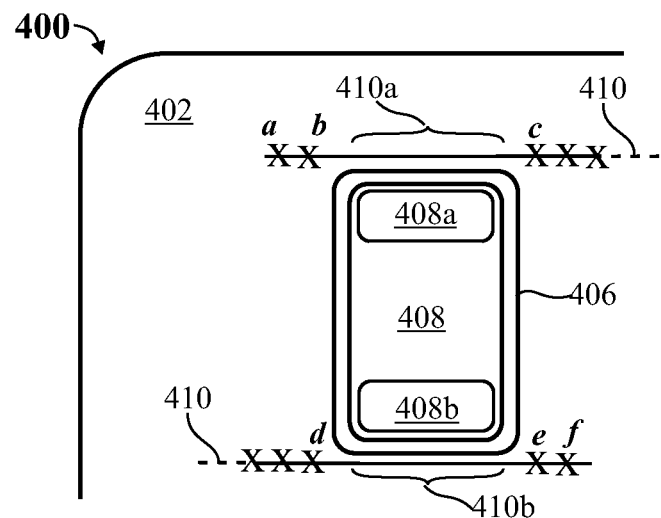

FIG. 4A is a top view of a technique for mounting an antenna wire in a transponder, according to the prior art.

Figure 4B:
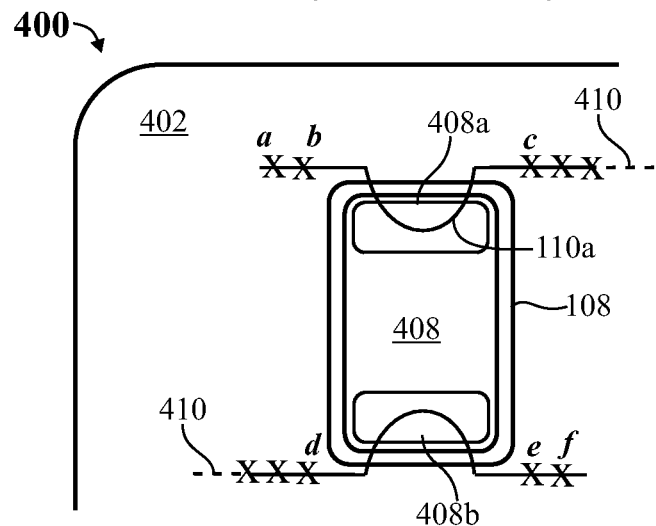

FIG. 4B is a top view of a step of repositioning an antenna wire in a transponder, according to the prior art.

Figure 4C:
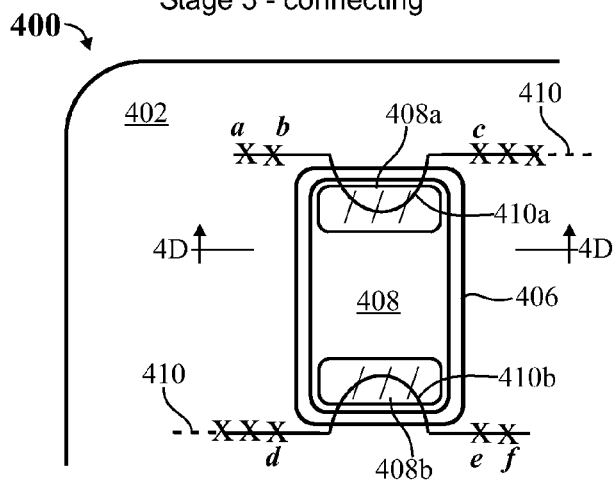

FIG. 4C is a top view of a technique for connecting an antenna wire in a transponder, according to the prior art.

Figure 4D:
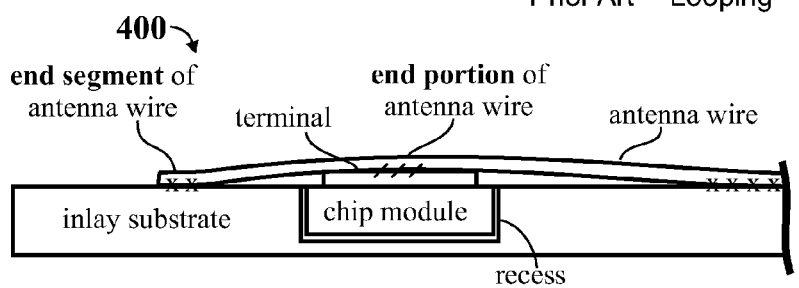

FIG. 4D is a cross-sectional view taken on a line 4D-4D through FIG. 4C.

Figure 4E:
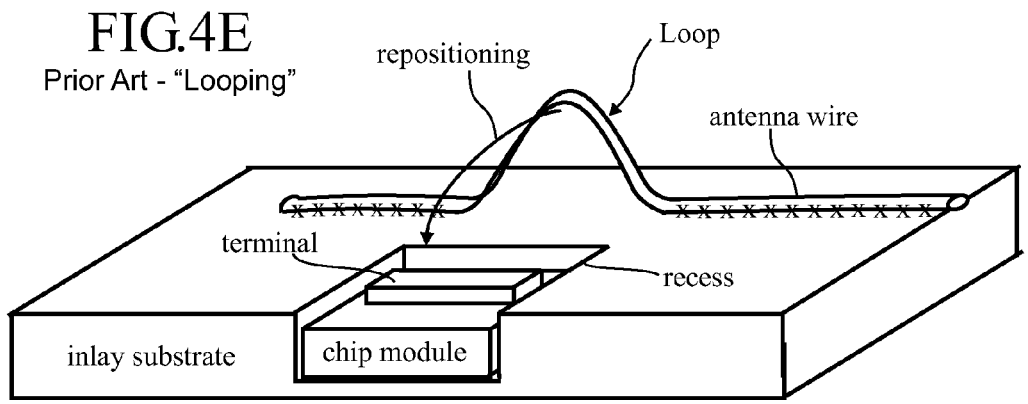
Figure 4F:
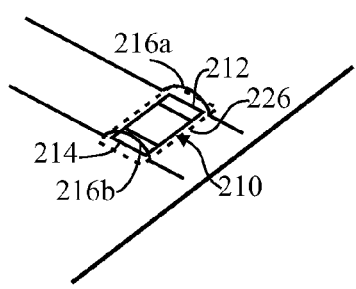
Figure 4G:
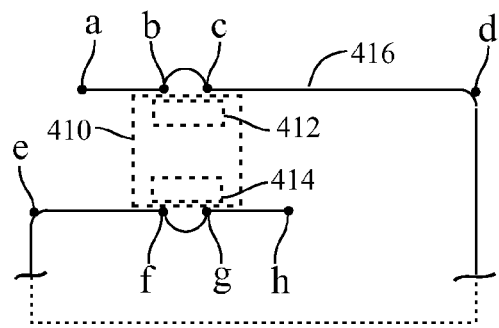
Figure 4H:
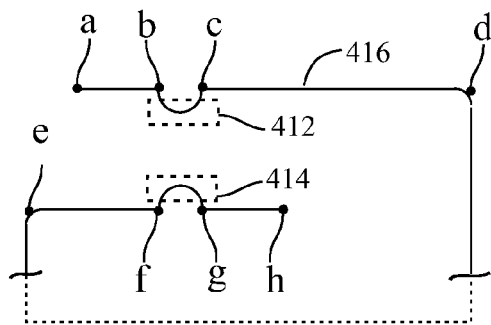
Figure 4I:
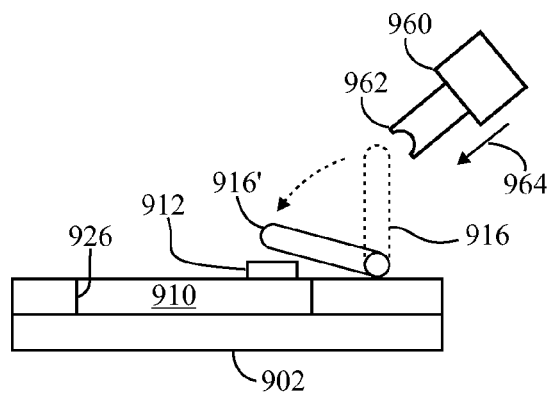

FIG. 4E is a perspective view of a transponder, corresponding generally to FIG. 4A.

FIGS. 4F, 4G, 4H, 4I are reproductions of various figures from U.S. Pat. No. 7,546,671.

Figure 5A:
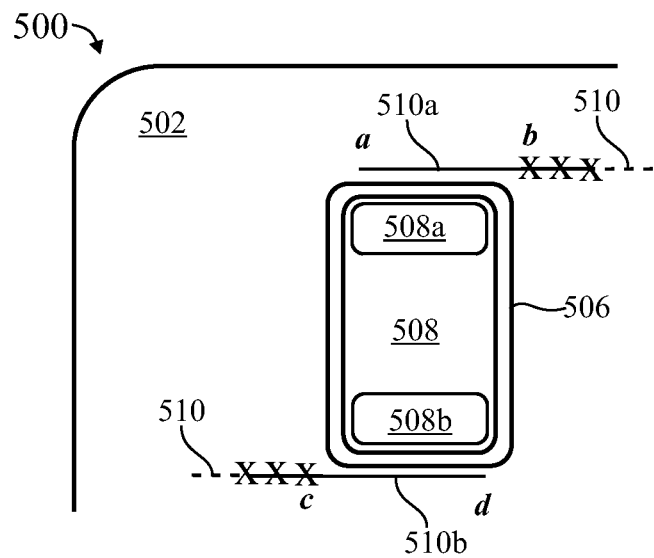

FIG. 5A is a top view of a technique for mounting an antenna wire in a transponder, according to the prior art.

Figure 5B:
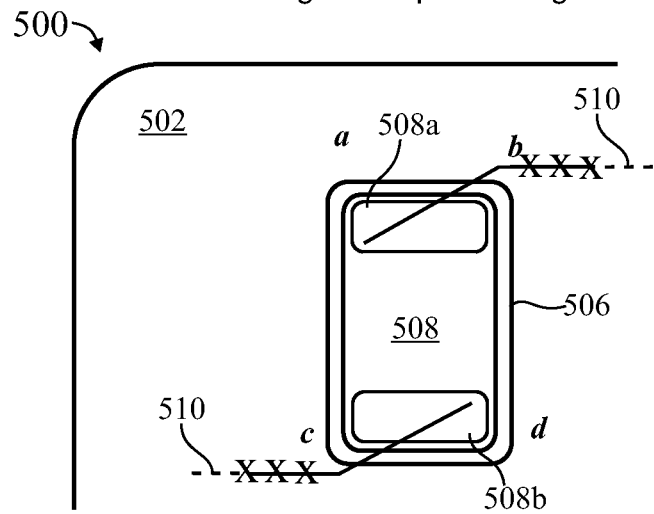

FIG. 5B is a top view of a step of repositioning an antenna wire in a transponder, according to the prior art.

Figure 5C:
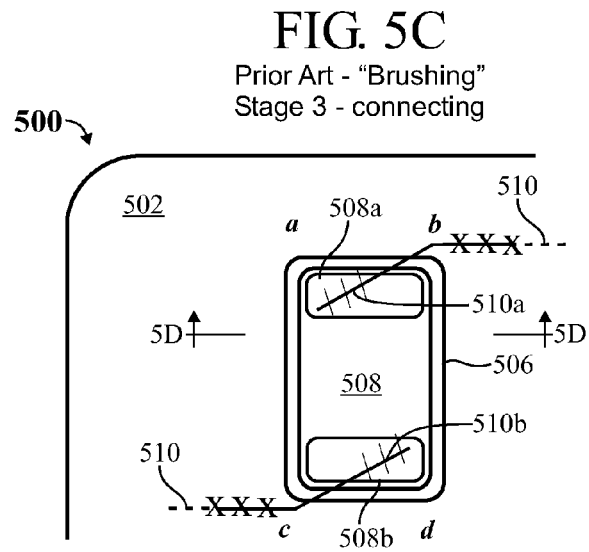

FIG. 5C is a top view of a technique for connecting an antenna wire in a transponder, according to the prior art.

Figure 5D:
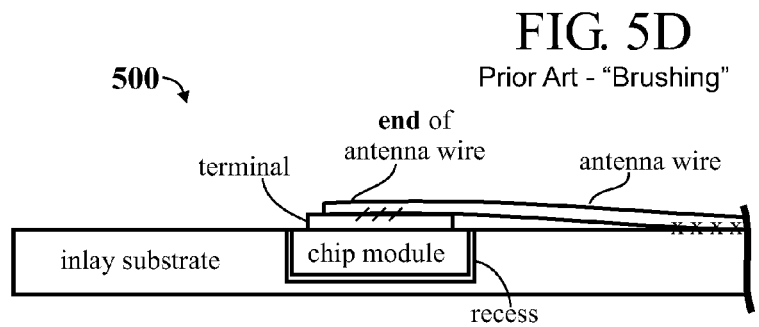

FIG. 5D is a cross-sectional view taken on a line 5D-5D through FIG. 5C.

Figure 5E:
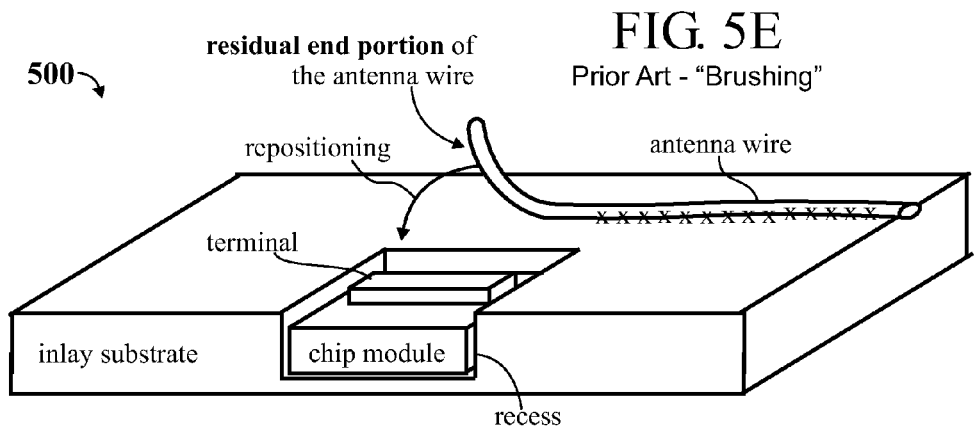
Figure 5F:
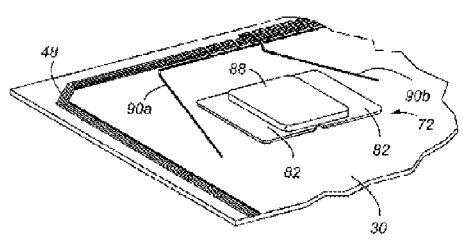
Figure 5G:
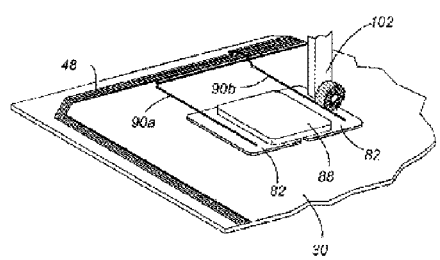
Figure 5H:
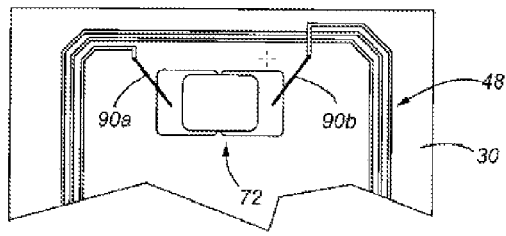
Figure 5I:
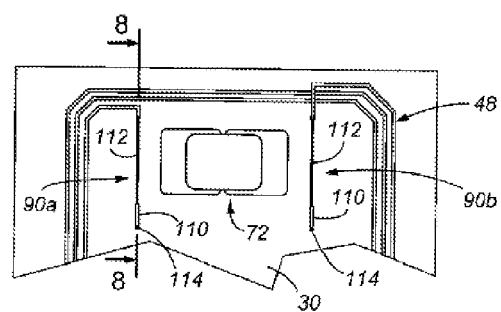

FIG. 5E is a perspective view of a transponder, corresponding generally to FIG. 5A.

FIGS. 5F, 5G, 5H, 5I are reproductions of various figures from US 2010/0141453.

Figure 6A:
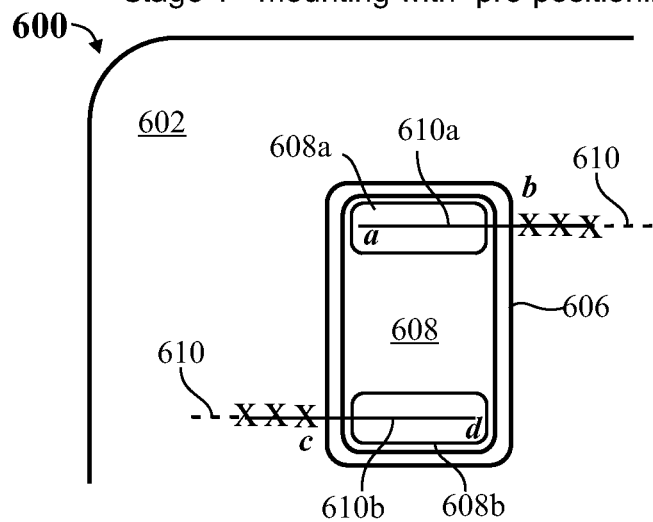

FIG. 6A is a top view of a technique for mounting an antenna wire in a transponder, according to an embodiment of the invention.

Figure 6B:
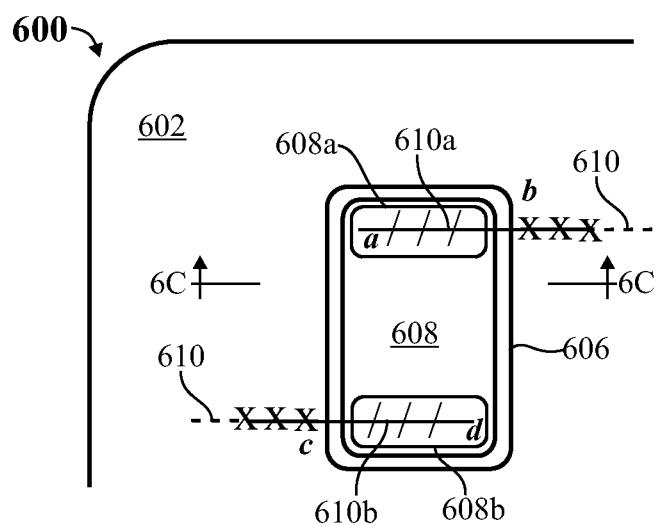

FIG. 6B is a top view of a technique for connecting an antenna wire in a transponder, according to an embodiment of the invention.

Figure 6C:
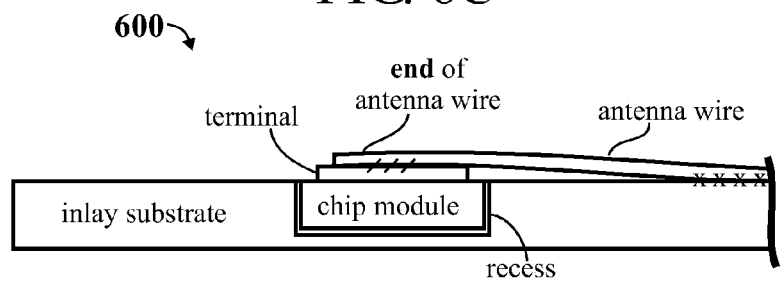

FIG. 6C is a cross-sectional view taken on a line 6C-6C through FIG. 6B.

Figure 6D:
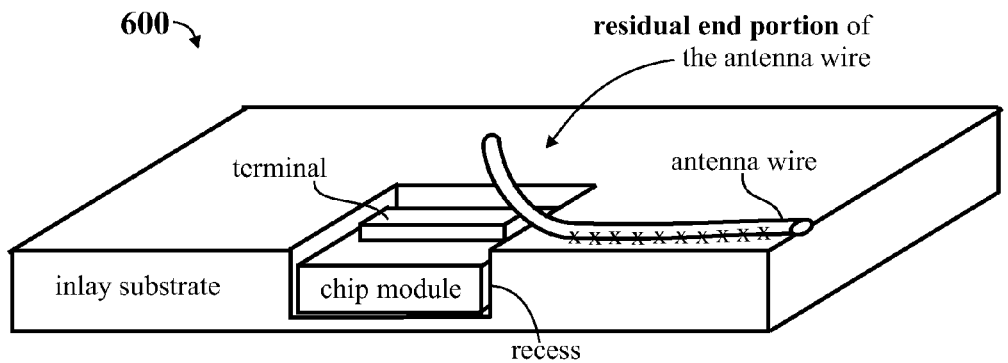

FIG. 6D is a perspective view of a transponder, corresponding generally to FIG. 6A.

Figure 6E:
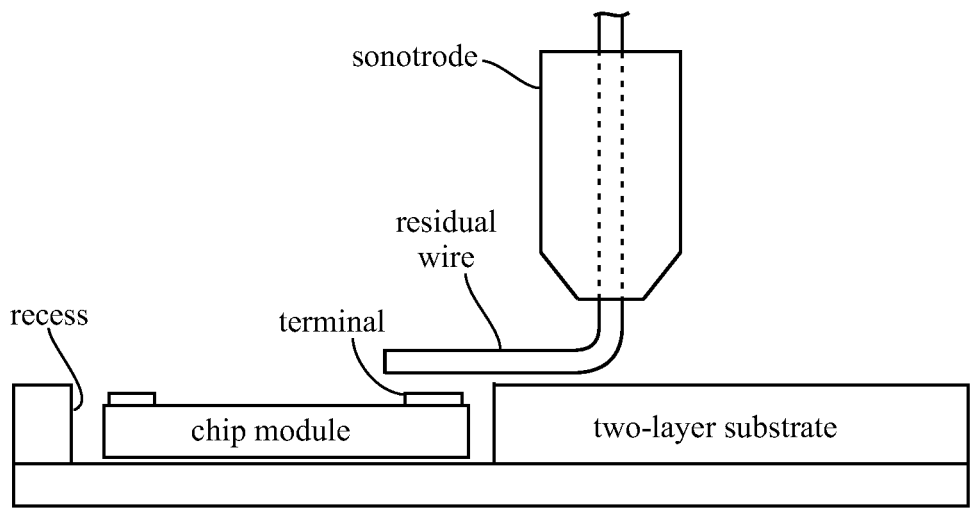

FIG. 6E is a cross-sectional view showing mounting the antenna wire on an inlay substrate, according to an embodiment of the invention.

Figure 6F:
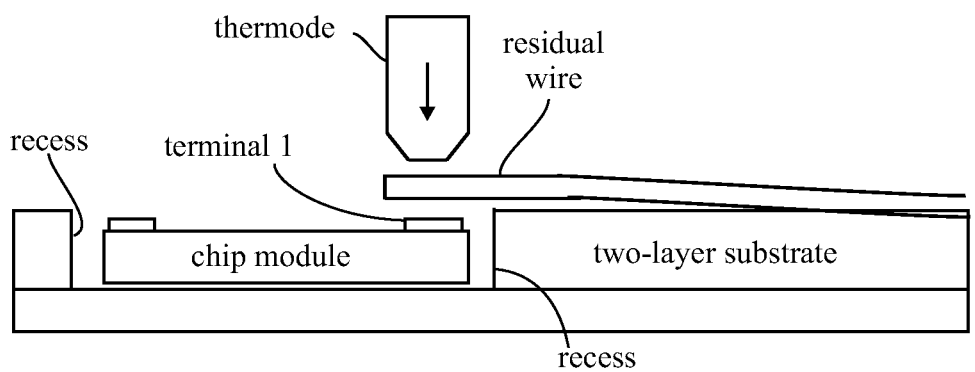

FIG. 6F is a cross-sectional view showing connecting the antenna wire to the terminals of the chip module, according to an embodiment of the invention.

FIGS. 7A-7E are cross-sectional views showing a technique for mounting and connecting an antenna wire to a chip module of a transponder, according to an embodiment of the invention.

Figure 7A:
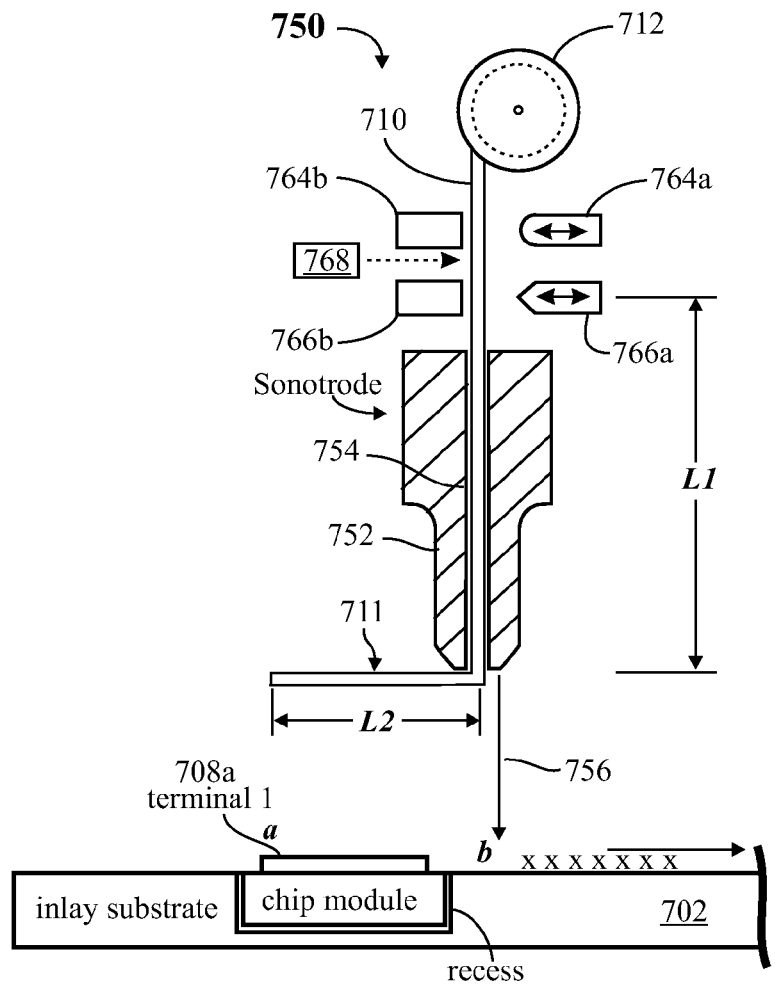
Figure 7B:
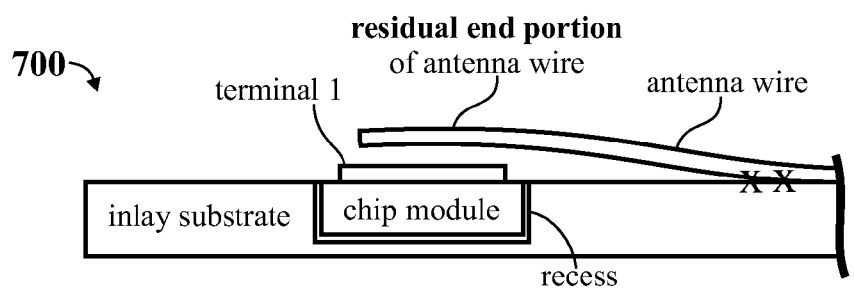
Figure 7C:
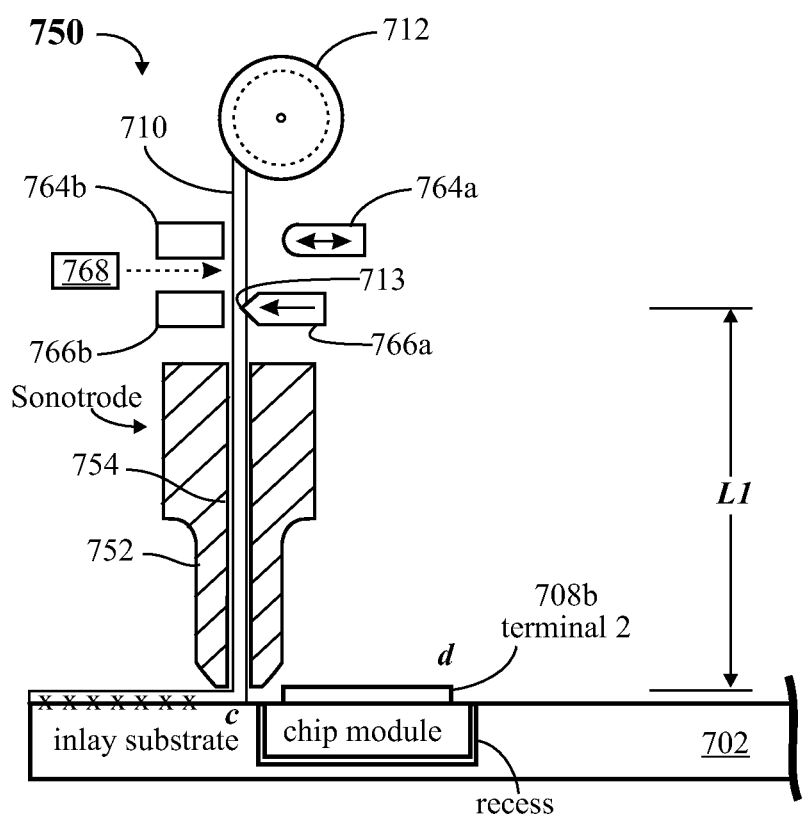
Figure 7D:
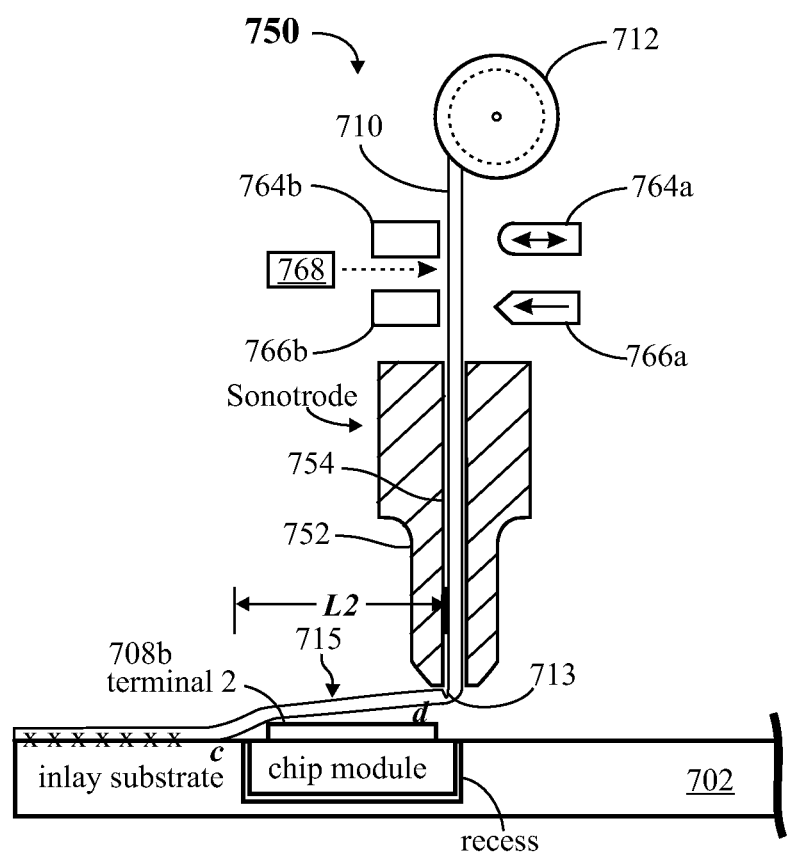
Figure 7E:
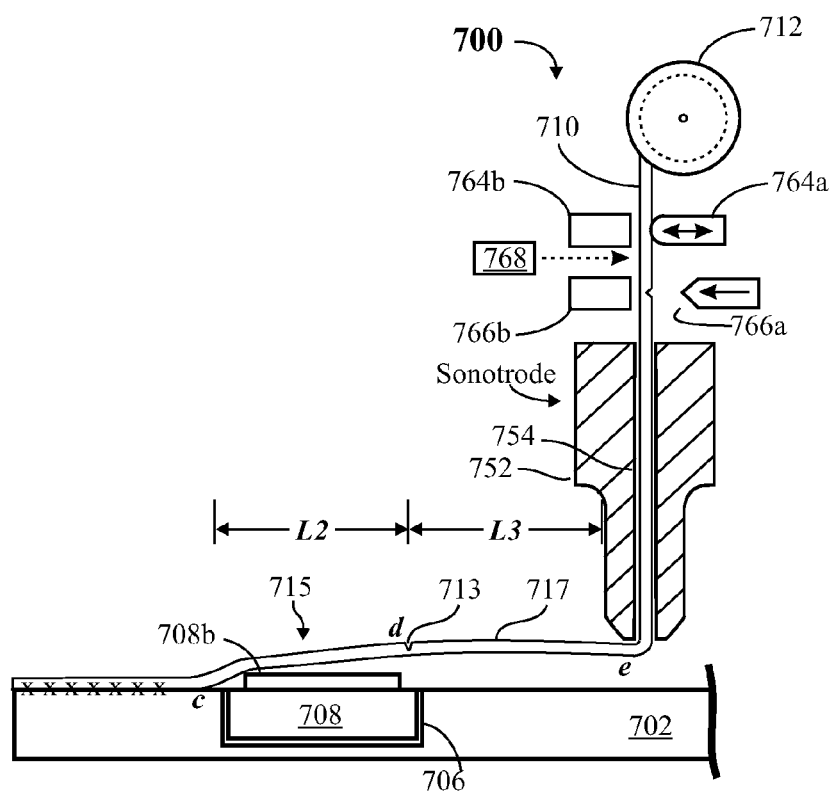
Figure 7F:
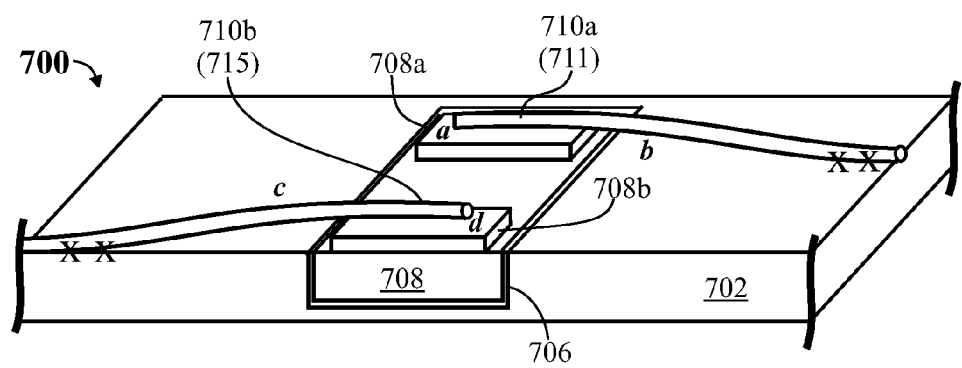

FIG. 7F is a perspective view showing an interim product resulting from the technique of FIGS. 7A-7E.

Figure 7G:
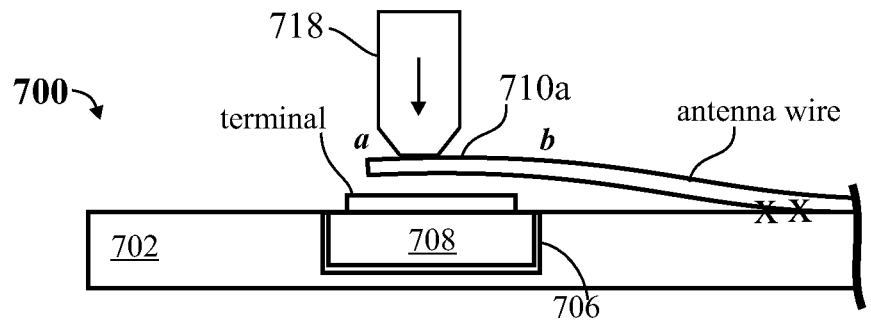
Figure 7H:
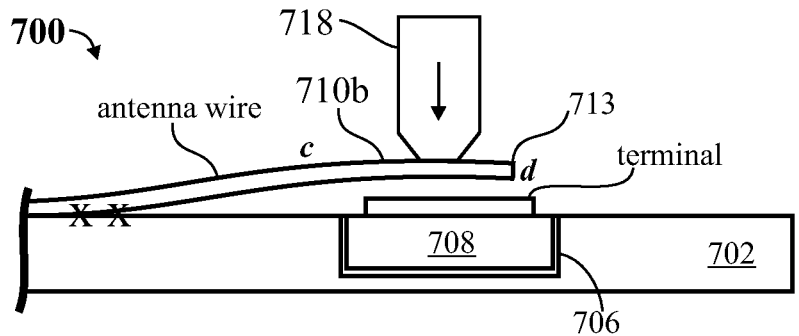

FIGS. 7G and 7H are cross-sectional views showing a technique for mounting and connecting an antenna wire to a chip module of a transponder, according to an embodiment of the invention.

Figure 7I:
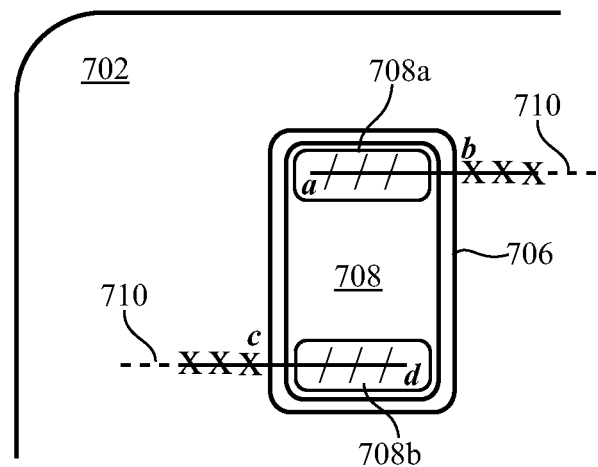

FIG. 7I is a top view showing a an interim product resulting from a technique for mounting and connecting an antenna wire to a chip module of a transponder, according to an embodiment of the invention.

FIGS. 8A-8E are top views of a technique for mounting an antenna wire in a transponder, according to an embodiment of the invention.

Figure 9A:
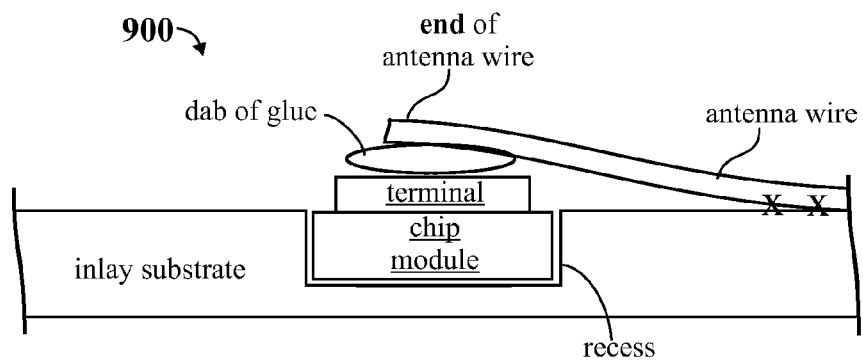
Figure 9B:
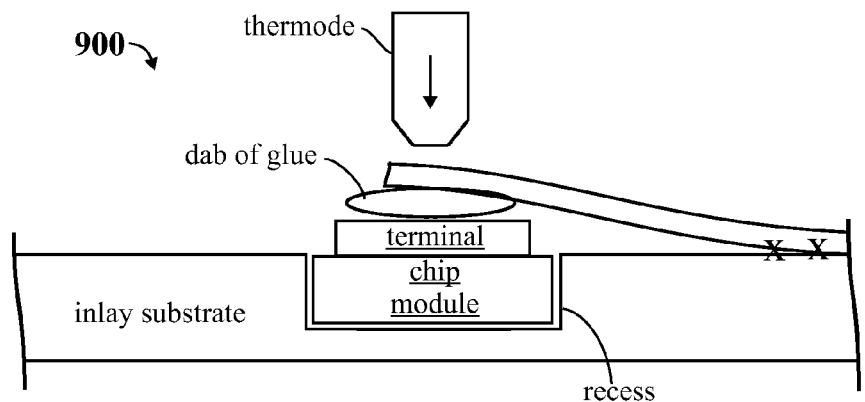

FIGS. 9A and 9B are cross-sectional views showing a technique for mounting and connecting an antenna wire to a chip module of a transponder, according to an embodiment of the invention.

Figure 10A:
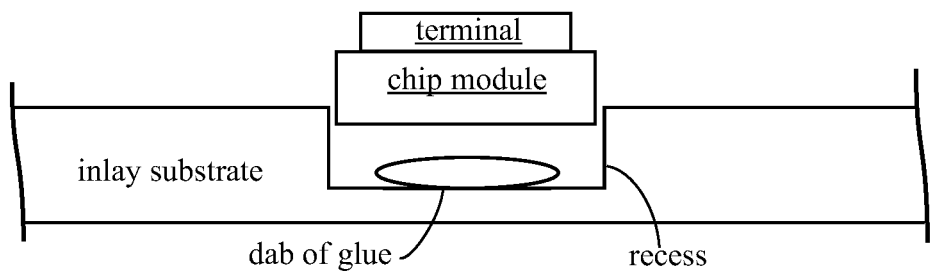

FIG. 10A is a cross-sectional view of a technique for installing a chip module in a recess of an inlay substrate, according to the prior art.

Figure 10B:
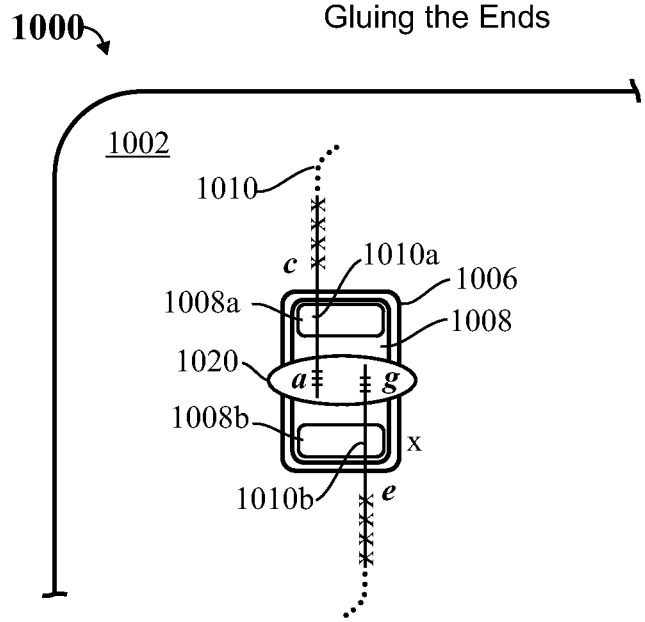

FIG. 10B is a cross-sectional view showing a technique for mounting and connecting an antenna wire to a chip module of a transponder, according to an embodiment of the invention.

FIGS. 11A-11I are cross-sectional views of a technique for mounting and connecting an antenna wire to a chip module of a transponder, according to an embodiment of the invention.

Figure 12A:
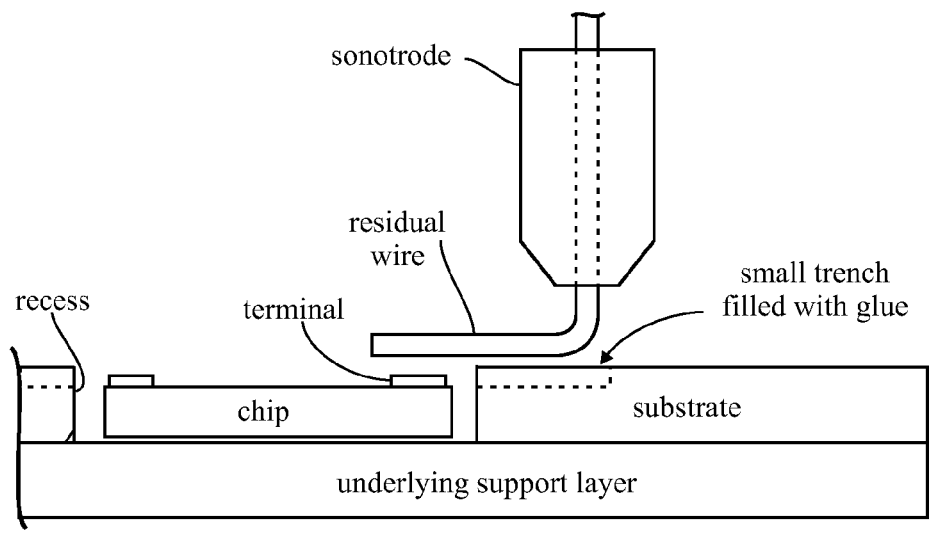
Figure 12B:
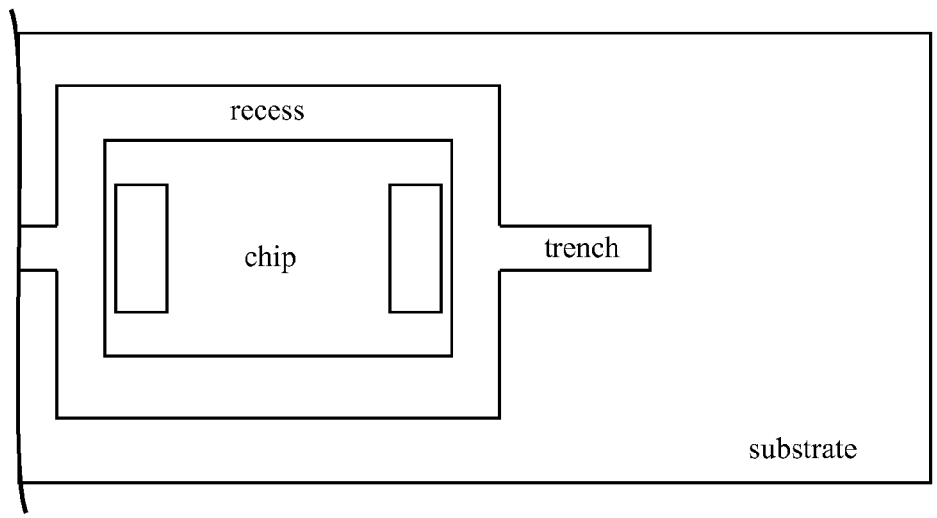

FIG. 12A is a cross-sectional view and FIG. 12B is a top view of a technique for mounting and connecting an antenna wire to a chip module of a transponder, according to an embodiment of the invention.

Figure 13A:
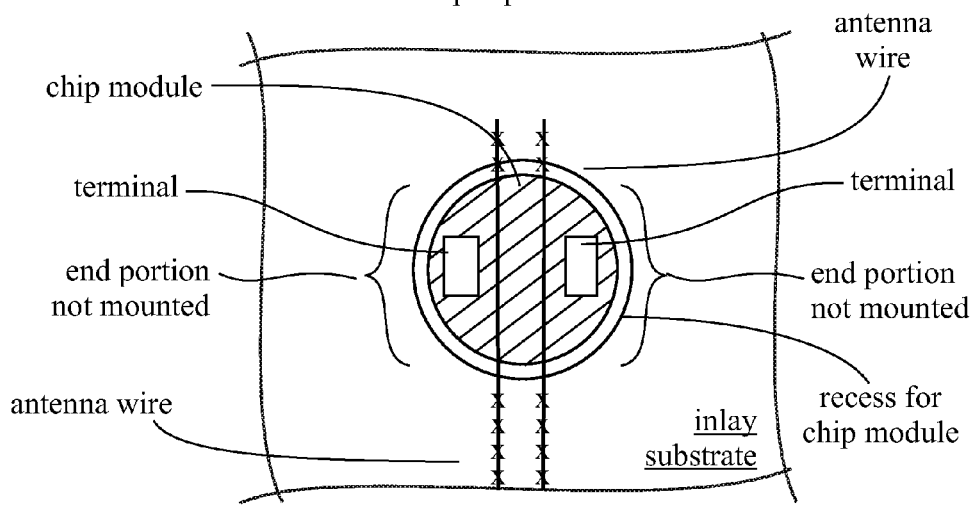
Figure 13B:
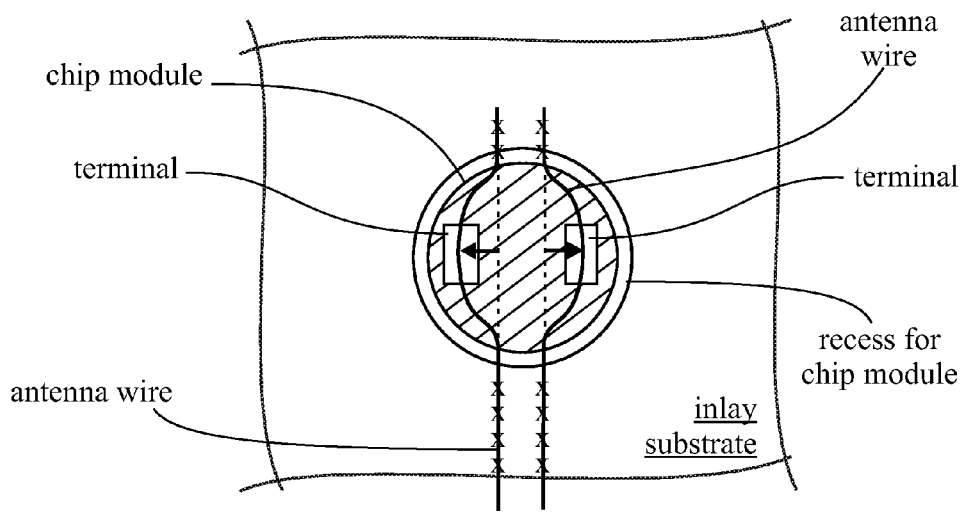

FIGS. 13A and 13B are top views of a technique for mounting and connecting an antenna wire to a chip module of a transponder, according to an embodiment of the invention.

Figure 14A:
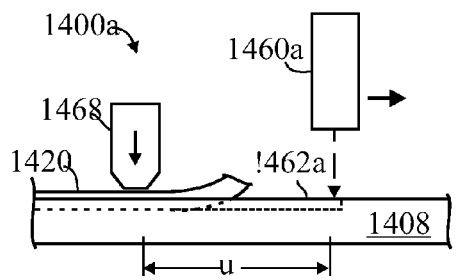

FIG. 14A is a cross-sectional view illustrating a technique for creating channels for mounting an antenna wire in an inlay substrate, according to an embodiment of the invention.

Figure 14B:
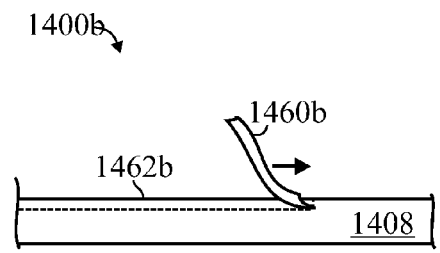

FIG. 14B is a cross-sectional view illustrating a technique for creating channels for mounting an antenna wire in an inlay substrate, according to an embodiment of the invention.

Figure 14C:
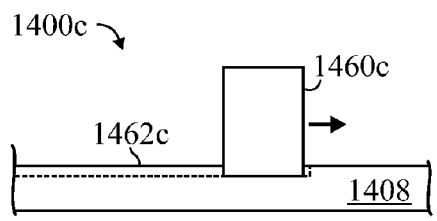

FIG. 14C is a cross-sectional view illustrating a technique for creating channels for mounting an antenna wire in an inlay substrate, according to an embodiment of the invention.

Figure 14D:
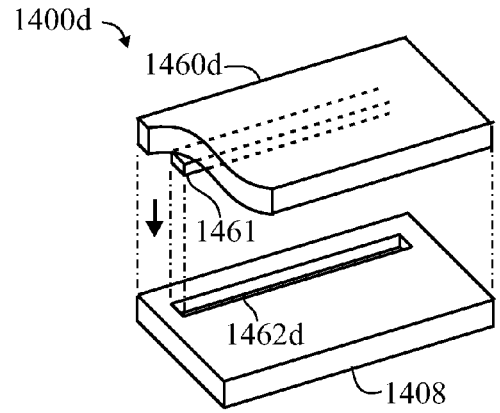

FIG. 14D is a perspective view illustrating a technique for creating channels for mounting an antenna wire in an inlay substrate, according to an embodiment of the invention.

Figure 14E:
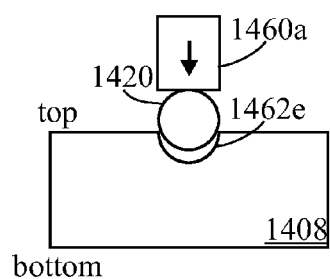

FIG. 14E is a cross-sectional view illustrating mounting an antenna wire in a channel, according to an embodiment of the invention.

Figure 15:
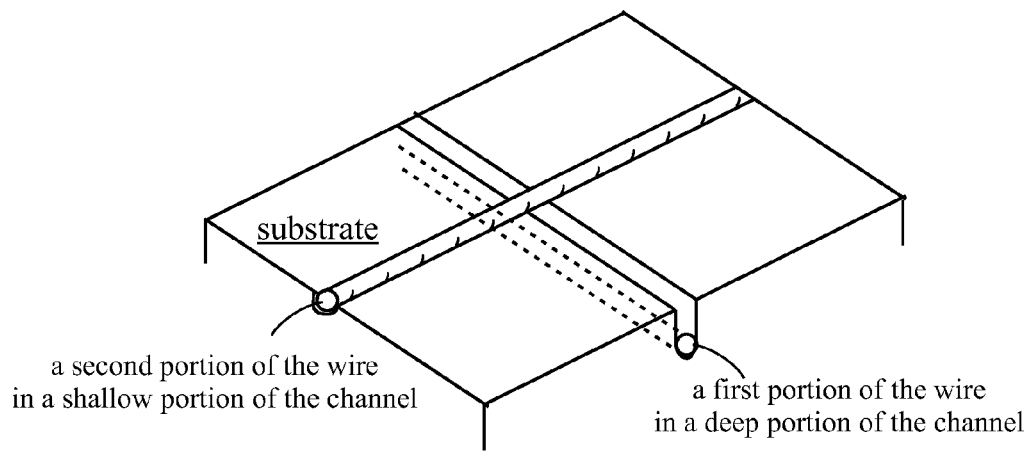

FIG. 15 is a perspective view illustrating a technique for creating channels for mounting an antenna wire in an inlay substrate, according to an embodiment of the invention.

Figure 16:
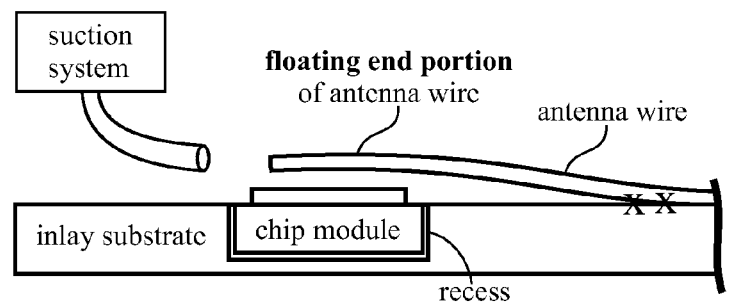

FIG. 16 is a cross-sectional view showing a technique for mounting and connecting an antenna wire to a chip module of a transponder, according to an embodiment of the invention.

DETAILED DISCLOSURE

Various "embodiments" of the invention (or inventions) will be discussed. An embodiment is an example or implementation of one or more aspects of the invention(s). Although various features of the invention(s) may be described in the context of a single embodiment, the features may also be provided separately or in any suitable combination. Conversely, although the invention(s) may be described herein in the context of separate embodiments for clarity, the invention(s) may also be implemented in a single embodiment.

The relationship(s) between different elements in the figures may be referred to by how they appear and are placed in the drawings, such as "top", "bottom", "left", "right", "above", "below", and the like. It should be understood that the phraseology and terminology employed herein is not to be construed as limiting, and is for descriptive purposes only.

The invention relates generally to inlays and techniques for making the inlays, including technical features and security features. As used herein, an "inlay" may be a single- or multi-layer substrate containing HF (high frequency) and/or UHF (ultra-high frequency) radio frequency identification (RFID, transponder) chips and/or modules. These inlays may be used in secure documents, such as, but not limited to, electronic passports (ePassports) and electronic ID (eID) cards.

In some of the figures presented herein, only one end or end portion of the antenna wire and a corresponding single one of the two terminals of the chip module may be shown as described, as exemplary of how both ends or end portions of the antenna wire may be mounted to the inlay substrate and connected to the terminals of the chip module, unless as otherwise may be noted.

In some of the techniques for mounting and connecting an antenna wire presented herein, mainly the mounting of the antenna wire is described in detail, including embedding the antenna wire into the inlay substrate. Typically, the connecting of the antenna wire will occur subsequent to mounting, using a conventional thermode-type tool in a conventional manner, and may only be briefly discussed and/or shown.

Some Embodiments of the Invention

Various embodiments of the invention will be presented to illustrate the teachings of the invention(s). In the main, examples of electronic passport covers with inlay substrates having leadframe modules may be used to illustrate the embodiments. It should be understood that various embodiments of the invention(s) may also be applicable to other secure documents containing electronics (such as RFID and antenna), such as electronic ID cards. Secure documents may also be referred to as "electronic documents". In the main hereinafter, secure documents which are passport inlays, typically cold laminated (with adhesive), are discussed.

The following embodiments and aspects thereof may be described and illustrated in conjunction with systems, tools and methods which are meant to be exemplary and illustrative, not limiting in scope. Specific configurations and details may be set forth in order to provide an understanding of the invention. However, it should be apparent to one skilled in the art that the invention(s) may be practiced without some of the specific details being presented herein. Furthermore, well-known features may be omitted or simplified in order not to obscure the descriptions of the invention(s).

Mounting the Antenna Wire with Unembedded End Portion(s) Positioned to be Over the Terminal(s) of the Chip Module A number of prior art techniques for mounting an antenna wire to an inlay substrate and connecting the antenna wire to terminals of a chip module installed on the inlay substrate to form a transponder have been discussed above, including.

FIGS. 2A-B, 2C-F illustrate a technique exemplified by U.S. Pat. No. 6,088,230 wherein mounting and connecting occur in a single stage with a "compound" tool FIGS. 3A-C, 3D-G illustrate a technique exemplified by U.S. Pat. No. 6,233,818 wherein, inter alia, the ends of the antenna wire are embedded in the substrate and during the mounting stage the end portions of the antenna wire are guided directly over the terminals, and subsequently (in the connecting stage) bonded to the terminals.

FIGS. 4A-E, 4F-4I illustrate a technique exemplified by U.S. Pat. No. 7,546,671 ("looping") wherein, inter alia, during the mounting stage the end portions of the antenna wire are positioned adjacent (rather than directly over) the terminals, then in a second stage repositioned to be directly over the terminals, and in a third connecting stage are bonded to the terminals. The ends of the antenna wire are embedded in the substrate.

FIGS. 5A-E, 5F-5I illustrate a technique exemplified by US 2010/0141453 ("brushing") wherein, inter alia, wherein, inter alia, during the mounting stage the end portions (including ends) of the antenna wire are positioned adjacent the terminals, then in a second stage repositioned to be directly over the terminals, and in a third connecting stage are bonded to the terminals. The ends of the antenna wire may not be embedded in the substrate.

FIGS. 6A-F illustrate a technique 600 for mounting and connecting an antenna wire, according to an embodiment of the invention. A chip module 608 (compare 108) is disposed in a recess 606 (compare 106) in an inlay substrate 602 (compare 102). An antenna wire 610 (compare 110) is mounted to the substrate 602 and connected to the chip module 608 as follows.

In a first stage of the process (see FIG. 6A), embedding starts at a point "b", near a first terminal 608a of the chip module 608. This may be done with a sonotrode-type tool (not shown), and the embedding is indicated by the symbols "x".

A length of wire between the points "a" and "b" is a first residual end portion 610a of the antenna wire 610 wire which may have been previously extending from the sonotrode-type tool. This residual end portion 610a of the antenna wire 610 is not embedded, and may be referred to as an unembedded end portion. Rather, in the process of mounting the antenna wire 610, the first residual end portion 610a of the antenna wire 610 is positioned (or left "dangling") directly over a first terminal 608a of the chip module 608. The residual end portion 610a of the antenna wire 610 may have a length of approximately 1-3 mm Embedding continues between the points "b" and "c" and the dashed lines indicate that a main, intermediate portion of the antenna wire 610 is embedded between the points "b" and "c". This may be done with a sonotrode-type tool, and the embedding is indicated by the symbols "x".

Approximately 1 meter of wire may be used to form the turns of the antenna (not shown; see, for example, FIG. 1A) between the points "c" and "d".

Embedding stops at the point "c" near the second terminal 608b of the chip module 608. At the point "c", the sonotrode-type tool may be lifted and continue to move (traverse across the inlay substrate, horizontally as shown) directly over the second terminal 608b of the chip module 608.

Between the points "c" and "d" the antenna wire is not embedded. Rather, in the process of mounting the antenna wire 610, the second residual end portion 610a of the antenna wire 610 is positioned (or left "dangling") directly over the second terminal 608b of the chip module 608. The residual end portion 610b of the antenna wire 610 may have a length of approximately 3-8 mm, and may be referred to as an unembedded end portion.

The antenna wire 610 may then be severed, at the point "d". This results in a second residual end portion 610b of the antenna wire 610 positioned directly over the second terminal 608b of the chip module 608.

Generally speaking, the residual end portions of the antenna wire may include the actual ends of the antenna wire. However, the residual end portions may extend slightly beyond the corresponding terminals of the chip module, in which case the actual ends of the antenna wire would not be "directly over" the terminals. In such as case it could nevertheless be said that "substantially" the entire residual end portions of the antenna wire are disposed over the corresponding terminals of the chip module.

Also, strictly speaking, the second end portion 608b is not "residual" in the same exact sense that the first end portion 608a is residual, or left-over a previous mounting operation, such as mounting the antenna wire for a previous transponder site.

The end portions 610a and 610b of the antenna wire 610 may more correctly be referred to simply as un-mounted end portions, since they are essentially "floating" over the terminals of the chip module. And, as mentioned above, they may extend beyond the terminals, also floating over the substrate adjacent the chip module. In other words, the ends of the wire may be over the terminals, or they may be over the substrate. But, in no case are the ends of the antenna wire embedded in the substrate, as in U.S. Pat. No. 6,233,818 or U.S. Pat. No. 7,546,671. A method of aligning the floating end portions of the antenna wire is described with respect to FIG. 16.

In the mounting phase (or stage), or as a result of the mounting stage, two short lengths of antenna wire, namely the first and second residual end portions 610a and 610b of the antenna wire 610 are "pre-positioned" (or simply positioned, since there is no "repositioning" required) directly over the corresponding two terminals 608a and 608b, respectively, of the chip module 608 for subsequent connecting thereto, without requiring a repositioning step as in (for example) U.S. Pat. No. 7,546,671 ("looping") or US 20100141453 ("brushing").

In a second stage ("connecting") of the process (see FIG. 6B), the first and second residual end portions 610a and 610b of the antenna wire 610 are (which may or may not include the ends of the antenna wire) are connected to the two terminals 608a,b of the chip module 608. This may be done with a thermode-type tool (not shown), and the bonding is indicated by the symbols "/".

FIG. 6C is a cross-sectional view of a transponder formed using the technique 600, such as taken on a line 6C-6C through FIG. 6B.

FIG. 6D is a perspective view of a the interim product shown in FIG. 2A.

In FIG. 6D, it can readily be seen that the antenna wire is mounted so that the residual end portion of the antenna wire is directly over the terminal of the chip module, and therefore does not need to be repositioned before connecting (bonding) to the terminal of the chip module.

In other words, as shown in FIG. 6D, the antenna wire may be mounted to (embedded or scribed into) the inlay substrate with at least one (including both) of the residual end portions (including ends) of the antenna wire being not mounted, but rather already positioned (without repositioning) directly above a corresponding least one (including both) of the terminals of the chip module for subsequent connecting thereto without requiring a repositioning step as in "looping" or "brushing".

The cross-sectional view of FIG. 6C is similar in appearance to the cross-sectional view of FIG. 2B. This is because the "end result" in the mounting and connecting technique 600 is similar to that of the 230 patent in that the ends of the antenna wire may be connected (bonded) to the terminals of the chip module.

The mounting and connecting technique 600 disclosed herein is different than the technique 200 of the 230 patent in that the antenna wire is first mounted to the inlay substrate, and subsequently the ends or end portions of the antenna wire are connected to the terminals of the chip module.

The mounting and connecting technique 600 disclosed herein is different than the technique 300 of the 818 patent in that the ends of the antenna wire are not embedded in the inlay substrate.

The mounting and connecting technique 600 disclosed herein is different than the technique 400 of the 671 patent (looping) in that the ends of the antenna wire are not embedded in the inlay substrate, and in that no repositioning step is required.

The cross-sectional view of FIG. 6C is similar in appearance to the cross-sectional view of FIG. 5D. This is because the "end result" in the mounting and connecting technique 600 disclosed herein is similar to that of the 453 publication (brushing) in that the ends of the antenna wire may be connected (bonded) to the terminals of the chip module.

The mounting and connecting technique 600 disclosed herein is also different than the technique 500 of the 453 publication (brushing) in the way that residual wire is created for starting a transponder site, as described in greater detail hereinbelow with respect to FIGS. 7A-7F.

FIG. 6E is a cross-sectional view showing using a sonotrode-type tool (compare 116) for mounting (embedding) the antenna wire on the substrate with a first "residual" end portion of the antenna wire (or simply "residual wire") dangling over a terminal (608a) of a chip module in a recess in an inlay substrate, according to the technique 600.

FIG. 6F is a cross-sectional view showing using a thermode-type tool (compare 118) for connecting (bonding) the residual end portions of the antenna wire to the terminals of the chip module, according to the technique 600.

In FIGS. 6E and 6F, the inlay substrate is a multi-layer substrate having an upper layer (compare 104a) and a lower layer (compare 104b). The recess is shown as a "window type" recess extending completely through the top layer of the substrate.

A Sonotrode-Type Tool for Performing Mounting the Antenna Wire with End Portions (Including Ends) Positioned Over Terminals of the Chip Module A conventional embedding tool for mounting the antenna wire to the inlay substrate is disclosed in US 2010/0141453. As noted therein:

[0026] FIG. 1 illustrates an example of an embedding device 10 such as an ultrasonic sonotrode. The sonotrode includes an ultrasonic transducer 12 that locally heats a wire 14 through ultrasonic vibration. The embedding tool further includes a manifold 16 which houses a capillary tube 18 and a compressed air channel 20 that communicates with the capillary tube 18. The wire 14 is routed through the capillary tube 18 so that it can be dispensed from the distal tip 22 of the sonotrode. A wire clamping mechanism 24 comprises one method to control the feed of wire. The clamping mechanism jaws 26 close together to prevent feed of the wire. The compressed air may control the rate at which the wire is dispensed from the capillary tube when the jaws are open.

[0027] As also shown in FIG. 1, a knife 28 may form a part of the overall apparatus 10 and reciprocate between an upper and lower position to cut the wire 18 as needed, such as at the completion of a wire embedding step. As shown, a length of wire is embedded partially in the substrate 30 and a residual amount of wire 32 extends from the distal tip 22 of the embedding tool 10 following the cutting operation. This residual amount 32 is typically equal to the distance between the distal tip of the embedding tool and the knife or cutting tool 28. If the knife 28 is positioned relative to the embedding tool 10, the residual length may vary.

FIGS. 7A-7E illustrate an embodiment of a sonotrode-type tool 750 suitable for (but not limited to) performing the mounting steps described in FIGS. 6A-6F, and a technique for performing the mounting steps.

In FIG. 7A, the sonotrode-type tool 750 is shown positioned above a transponder site 700 comprising an inlay substrate 702 (compare 102), a chip module 708 (compare 108) disposed in a recess 706 (compare 106) in the surface of the inlay substrate 702 and having two terminals 708a and 708b (compare 108a and 108b). Only one terminal 708a is shown in the view of FIG. 7A for illustrative clarity.

The sonotrode-type tool 750 comprises a sonotrode (or capillary) 752. Antenna wire 760 is supplied from a spool 762 and passes through an internal bore 754 of the sonotrode 752. The sonotrode 752 may be a conventional sonotrode, and the antenna wire may be conventional wire having a diameter of approximately 60 μm.

The sonotrode-type tool 750 may additionally comprise:
  a clamping mechanism "764" which may comprise a movable part 764a and a stationary part 764b; and
  a cutting mechanism "766" which may comprise a movable part 766a and a stationary part 766b Clamping and cutting mechanisms, per se, are known. The clamping mechanism is for holding the wire relative to the capillary—in other words preventing it from feeding through the capillary. The cutting mechanism is for at least partially severing the wire.

The clamping and cutting mechanisms 764 and 766 may both be disposed above the sonotrode 752, as shown, with the clamping mechanism 764 being located atop (further away from the sonotrode 752 than) the cutting mechanism 766. (The cutting mechanism 766 may be disposed between the top of the capillary 752 and the clamping mechanism 764.) The clamping and cutting mechanisms 764 and 766 may be mounted in the sonotrode-type tool 750 in a fixed relationship to the sonotrode 752 so that they will move with the sonotrode 752 as the sonotrode may be moved up and down (towards and away from) or as it may traverse across the surface of the inlay substrate (such as for forming the turns of the antenna). A distance "L1" between the cutting mechanism 766 and the tip (bottom end, as viewed) of the sonotrode 752 may thus be a fixed distance, such as approximately 3-10 mm A cutting mechanism is conventionally located below the nozzle. (compare knife 28 of the US 20100141453). A feature of the mounting tool 750 disclosed herein is that the cutting mechanism 766 is located above the sonotrode 752. Another feature of the mounting tool 750 disclosed herein is that the cutting mechanism 766 may not be used for cutting (completely severing) the antenna wire 710, but rather may be used for nipping (or nicking, or weakening, or partially cutting through) the wire 710, as described below. Nipping the wire will make it frangible at a selected location (the point whereat it is nipped.)

Optionally, a laser 768 may be provided for removing insulation from the wire 710, either above or below the cutting mechanism 716. The laser 768 is shown directing a beam (- - ->) onto the antenna wire 710 between the clamping mechanism 764 and the cutting mechanism 766 for removing insulation therefrom, such as by laser ablation. Insulation may be removed from the wire in the vicinity of (at and nearby) the point where it is nipped.

In FIG. 7A, the sonotrode 752 is shown positioned above the surface of the substrate 702 with a short length of "residual" wire 711 extending ("dangling") from the end of the sonotrode 752. For example, the residual wire 711 dangling from the sonotrode 752 may have a length "L2" of approximately 3-10 mm The antenna wire 710 may be mounted to the substrate 102 (in a first stage) for subsequent connecting (in a second stage) to the chip module, using the sonotrode-type mounting tool 750, as follows.

first of all, the direction (orientation) of the residual wire 711 with respect to the sonotrode 752 may be predetermined, and its length (L2) may also be predetermined, as described below.
  the sonotrode 752 is lowered, as indicated by the arrow 756, and embedding of the wire 710 into the substrate starts at a point "b" on the inlay substrate, near the first terminal (terminal 1, see 608a, FIG. 6A) The point "b" may be a position on the inlay substrate just outside of the recess for the chip module. Embedding of the antenna wire may proceed in a direction away from the chip module as indicated by the string of x's heading away from the chip module (to the right, as shown).
  The resulting intermediate product is shown in FIG. 7B, which bears some resemblance to the mounting and connecting technique of FIG. 2B. However, note that in this technique, the residual end portion of the wire 710 is not yet connected to the terminal of the chip module.
  embedding continues, forming the turns of the antenna, until a point "c" which is adjacent (near) the second terminal (terminal 2, see 608b, FIG. 6A) of the chip module, as shown in FIG. 7C. (compare FIG. 6A)
  At this point, embedding may stop and the antenna wire 710 may be "nipped" at a point 713.
    Nipping the wire involves closing the cutting mechanism 766 to at least partially sever the antenna wire 710. If only nipped (and not totally severed), the nipped/frangible antenna wire 710 may subsequently be broken apart at the point 713 where it has been nipped, in a subsequent step (below).
    The length of the antenna wire 710 between the point c (near the second terminal, where embedding stops) and the nip 713 is substantially "L1" which is substantially the distance between the cutting mechanism 766 and the tip of the sonotrode 702.
    As will become evident, the objective is that the nip 713 will ultimately be located at the point "d" and when the antenna wire 710 is broken apart, the nip 713 will become the end of the antenna wire, and the portion of antenna wire 710 between the points "c" and "d" will become a residual end portion of the antenna wire 710.
    If necessary in order to get the nip 713 lined up with the point "d", the sonotrode 752 can be stopped slightly before (or after) the point "d", the wire nipped, then proceed to the point "d". Where to stop and nip depends on the dimensions of the sonotrode, etc.

Nipping the wire and controlling the movement of the sonotrode so that residual end portion of the antenna wire is directly over the terminal of the chip module may be referred to as the "nipping technique".

Next, as shown in FIG. 7D, after the wire has been nipped (FIG. 7C), and after the sonotrode 752 has reached the position "d" directly over the second terminal (terminal 2), the sonotrode 752 may continue to move (in the direction it has been moving, left-to-right as viewed). During this traversing of the sonotrode across the surface of the substrate, no embedding is occurring, and antenna wire 710 will simply play (feed) out of the end of the sonotrode, ultimately creating a second residual end portion 715 (more appropriately, "unembedded end portion, including end") of the antenna wire.

Next, as shown in FIG. 7E, after the wire has been nipped (FIG. 7C), and after the sonotrode 752 has passed directly over the terminal 708b, and beyond, the clamping mechanism 764 is applied and the sonotrode 752 is moved to sever (or break) the antenna wire at the nip (weak point). This results in another residual end portion 717 of the antenna wire 710 dangling from the end of the sonotrode 752, between the points "d" and "e", and having a length "L3" which may be substantially equal to the length "L2" of the unembedded end portion 715 This third, dangling residual end portion 717 may become the first of two unembedded end portions positioned over a first terminal of a subsequent transponder site. (The first unembedded end portion at a transponder site is correctly a "residual" end portion. The second unembedded end portion is not "residual" in the same sense. But, both of these end portions are unembedded, and positioned directly over corresponding terminals of the chip module.)

FIG. 7F shows an interim product resulting from the nipping technique 700. The antenna wire 710 is mounted, but not yet connected. A first end portion (including end) 710a (compare 110a) of the antenna wire 710 (compare 110) is shown positioned directly above a first terminal 708a (compare 108a) of the chip module 708 (compare 108), and a second end portion (including end) of the antenna wire 710 is shown positioned directly above a second terminal 708b (compare 108b) of the chip module 708. In a next step, these two end portions 710a and 710b, which are "residual end portions" 711 and 715 can be connected (bonded) to the corresponding two terminals, without requiring repositioning. The chip module 708 is shown disposed in a pocket-type recess 706 in a single layer inlay substrate 702. (Compare FIG. 2B). As a result of the mounting process 700, the antenna wire 710 may be connected to the terminals 708a and 708b of the chip module 708 without requiring a repositioning step.

Subsequently, in a second stage (connecting), the antenna wire which has been mounted and pre-positioned so that its dangling (residual) end portions are directly above the terminals of the chip module may be connected (bonded) to the terminals of the chip module as described hereinabove, for example with respect to FIGS. 6 A-F.

FIG. 7G is a cross-sectional view (compare FIG. 7B) showing the first terminal 708a of the chip module 708, and a thermode-type bonding tool 718 (compare 118) positioned to connect (bond) the first residual end portion 710a of the antenna wire 710 to the first terminal 708a.

FIG. 7H is a cross-sectional view (compare FIG. 7E) showing the second terminal 708b of the chip module 708, and the thermode-type bonding tool 718 (compare 118) positioned to connect (bond) the second residual end portion 710b of the antenna wire 710 to the second terminal 708a.

FIG. 7I is a top view of a transponder 700 which has had the antenna wire 710 mounted to the inlay substrate 702 and connected to the terminals 708a and 708b of the chip module 708, according to some of the techniques disclosed herein. Compare FIG. 2A.

As an alternative to the nipping technique, when the sonotrode moves over the second terminal (708b) and reaches the point "d", it can be stopped and the wire may then be cut using a cutter similar to element 28 in US 2010/0141453. This would sever the wire at the tip of the sonotrode. However, there would be no residual wire ready for the next transponder site.

In a variation of the alternative to the nipping technique, at an appropriate distance before the sonotrode reaches the point "d", the wire can be nipped. Then, when the sonotrode moves over the terminal and reaches the point "d", it can be stopped and the wire severed by clamping the wire and moving the sonotrode. This would sever the wire at the tip of the sonotrode, again with the disadvantage that there would be no residual wire ready for the next transponder site.

In another variation of the technique of positioning the residual end portions of the antenna wire directly over the corresponding two terminals of the chip module, the technique of mounting and connecting may proceed as follows:

start embedding the antenna wire a short distance, such as 1-3 mm, in the inlay substrate with a first residual end portion (such as 610a) positioned over a corresponding first terminal of the chip module, using a sonotrode-type tool (or a sonotrode portion of a "composite tool" such as is disclosed in U.S. Pat. No. 6,088,230).

As an alternative to embedding a short distance, the sonotrode could just touch down on the inlay substrate to stabilize the first residual end portion of the antenna wire for this first bonding step.

pause embedding, and bond the first residual end portion (such as 610a) positioned over a corresponding first terminal of the chip module, using a thermode-type tool (or a thermode portion of a "composite tool" such as is disclosed in U.S. Pat. No. 6,088,230)

resume embedding to form the turns of the antenna, and return to the near the chip module stop embedding, and form the second residual end portion (such as 610b) of the antenna wire directly over the second terminal of the chip module, in any of the manners described herein (including cutting, severing or nicking the wire)

alternatively, the cutting step may occur after the second bonding step described in the following paragraph bond the second residual end portion end of the antenna wire to the second terminal of the chip module, using the thermode-type tool (or thermode portion of the composite tool)

This variation is similar to that of U.S. Pat. No. 6,088,230 in that a second connecting stage, separate from the mounting stage is not required. This may have an advantage, for example, of eliminating the need (if any) for moving the transponder between an embedding station and a bonding station in an automated process.

This variation is different than that of U.S. Pat. No. 6,088,230 in that the sequence may be embed-bond-embed-create residual wire-bond, rather than simply bond-embed-bond. And, it is not necessary that the ends of the antenna wire are bonded to the terminals (as is the case in U.S. Pat. No. 6,088,230), but rather any part of the residual end portions of the antenna wire may be bonded to the terminals.

The technique for mounting and connecting an antenna wire in a transponder disclosed in FIG. 7 herein is similar to any of U.S. Pat. No. 6,233,818 or U.S. Pat. No. 7,546,671 ("looping") or US 2010/0141453 ("brushing") in that in a first stage the wire is mounted, and in a second stage the wire is connected. Thus, the technique is different that the technique of U.S. Pat. No. 6,088,230 which is not a two-stage process.

The technique for mounting and connecting an antenna wire in a transponder disclosed herein is similar to US 2010/0141453 ("brushing") in that the end of the wire is not embedded in the substrate.

The technique is different than US 2010/0141453 ("brushing") in that the residual end portions of the antenna wire are not positioned adjacent the terminal areas, but rather are positioned directly above the terminal areas, thereby negating a need to perform repositioning of the residual end portions of the antenna wire prior to connecting the residual end portions of the antenna wire to the terminals of the chip module. Note the following in the two "brushing" publications (US 2008/0150817 and US 2010/014143):

A method and apparatus are provided for making radio frequency (RF) inlays. The RF inlays include an integrated circuit and an antenna affixed to a substrate material carrying the integrated circuit. During processing, portions of the wire forming the antenna are located adjacent to, but not directly over the integrated circuit such that the wire may be subject to further processing, such as removing insulation without potentially damaging the integrated circuit. In the subsequent processing step, the wire ends are placed in contact with and secured to the integrated circuit terminal areas. Methods of the invention include forming loops with the wire ends wherein the loops extend above a plane of the substrate, and in another processing step, the loops are displaced to be electrically connected to the terminal areas. Methods also include repositioning the wire and using a brush or comb device. (US 2008/0150817; Abstract; emphasis added)

A method and apparatus are provided for making radio frequency (RF) inlays. The RF inlays include an integrated circuit and an antenna affixed to a substrate material carrying the integrated circuit. During processing, portions of the wire forming the antenna are located adjacent to, but not directly over the integrated circuit. In the subsequent processing step, the wire ends are placed in contact with and secured to the integrated circuit terminal areas. (US 2010/014143; Abstract; emphasis added)

Some similarities and differences between the technique 700 and the techniques of the prior art have been discussed above, with respect to FIGS. 6A-6F. Additionally, in contrast with the technique 500 of US 2010/0141453 (brushing) there is no need for forcing the wire out of the sonotrode to get a suitable length of residual wire for the next transponder site, and the direction of the residual wire may be better controlled using the present technique in contrast with the brushing technique.

Summarizing the techniques shown in and described with respect to FIGS. 6 and 7, it may be observed that basically, before finishing a transponder site, the wire is nipped (or nicked, weakened) with a sharp blade at the top of the sonotrode during the embedding of the antenna. When the embedded wire reaches the second terminal area, the wire is clamped at the top of the sonotrode while at the same time, the wire is dragged over the terminal area. Because the wire is pulled through the motion of the sonotrode, the wire may break at the position where it was nipped.

Here, "transponder site" refers to the inlay+chip module+wire, which is sometimes referred to simply as "transponder". In other places "transponder site" refers only to the position (typically recess) on the inlay where the chip module will be installed. The term should be interpreted in context.

This results are twofold. First, the residual wire (or "unembedded end portion", or "connection portion") is positioned directly above the second terminal area, in preparation for connecting thereto. Secondly, the residual wire may be directed in a particular direction in preparation to commence a new (subsequent) transponder site. In other words, so that when commencing embedding for the next transponder site, the residual wire can be positioned directly above the first terminal of the chip module.

Some benefits of using the technique for mounting and connecting an antenna wire in a transponder disclosed herein may include:

it is relatively easy to create an arbitrary length of residual wire, and to control its orientation No "pushing" of the wire through the capillary is needed, as in US 2010/0141453 ("brushing")

Using the technique disclosed herein, the length of the residual wire is determined by the indent cut (nip)-break mechanism above the sonotrode and the residual wire can be made as short or long as necessary (minimum length is approximately the length of the sonotrode.)

Forming the Antenna with Two Stubs, Each Having an End Portion Over a Terminal

The mounting (and connecting) techniques set forth in FIGS. 6 and 7 sound simple and straightforward—mount the antenna wire with its two end portions (including ends) positioned ("dangling") over the corresponding two terminals of the chip module. Then connect the two end portions (including ends) to the two terminals. Repositioning the end portions of the antenna wire prior to performing the connecting stage is not required, such as in U.S. Pat. No. 7,546,671 ("S9"). However, upon closer inspection it is evident that an appropriate length and known orientation of residual wire extending from the sonotrode is required before commencing mounting the antenna wire so that the first end portion is appropriately positioned over the first terminal after forming the turns of the antenna, ensuring an appropriate length and orientation of the second end portion is a little more straightforward "conceptually" (just come up over the second terminal and sever the wire), but in practice is a bit more involved than that, and can benefit greatly from modifications of the embedding tool. See for example, in FIGS. 7A-7I therein.

And, after completing mounting the antenna wire for a first transponder site, it is beneficial to ensure that the remaining residual wire is ready (appropriate length and orientation) for becoming the first residual end portion of the next transponder site.

An alternative to the mounting and connecting techniques described above avoids some of the complexities mentioned above, and may include one or more of the following steps starting other than at or adjacent the chip module (such as "away from" rather than "adjacent to"), embed a first portion of the antenna wire in a desired pattern, finishing near (adjacent to) the chip module and causing a first end portion of the antenna wire to be located directly above a first terminal of the chip module sever the wire in any conventional manner then starting other than at or adjacent the chip module (such as "away from" rather than "adjacent to"), embed a first portion of the antenna wire in a desired pattern, finishing near (adjacent to) the chip module and causing a second end portion of the antenna wire to be located directly above a second terminal of the chip module This results in two separate segments (or "stubs") of antenna wire, each independently mounted to the inlay substrate, and each having an end portion (including end) located over a corresponding one of the two terminals of the chip module. Then, in a second stage, the end portions (or "connection portions") can be connected to the terminals in a conventional manner This forms a type of dipole antenna, which has two separate lengths (or segments, or stubs) of wire. These antenna segments can be interleaved, closely coupled with one another, whatever. Each stub has one end connected to a terminal, and another "free" or distal end (connected to nothing).

Alternatively, the distal ends of the two antenna stubs could be overlapping one another and connected, such as with the thermode used for connecting, or by laser welding, or the like.

FIGS. 8A and 8B are similar to FIGS. 6A and 6B in that chip module 808 (compare 608) is disposed in a recess 806 (compare 606) in an inlay substrate 802 (compare 602). Instead of one continuous antenna wire (610), there are two separate lengths of antenna wire, labeled "Stub-1" and "Stub-2". The technique for mounting the two stubs of antenna wire may proceed as follows.

- start embedding at a point "a", anywhere on the inlay substrate. The point "a" need not be near or adjacent to the chip module (or recess).
- Continue embedding until the point "b" which is near a first terminal 808a (compare 608a) of the chip module.
- Stop embedding at the point "b", raise the sonotrode, move directly over the first terminal 808a, and sever the wire. This results in a first end portion 810a (compare 610a) of wire located directly over the first terminal for subsequent connecting (in a connecting stage) thereto.
  - The end portion is, strictly speaking, not the conventional "residual" end portion remaining dangling from the sonotrode after severing. Rather, is may more correctly be referred to simply as an unembedded end portion, or connection portion of the segment (stub) of antenna wire
- start embedding again, at a point "d", anywhere on the inlay substrate. The point "d" need not be near or adjacent to the chip module (or recess).
- Continue embedding until the point "c" which is near a second terminal 808b (compare 608b) of the chip module.
- Stop embedding at the point "d", raise the sonotrode, move directly over the second terminal 808b, and sever the wire. This results in a second end portion 810b (compare 610b) of wire located directly over the second terminal for subsequent connecting (in a connecting stage) thereto.
  - The end portion is, strictly speaking, not the conventional "residual" end portion remaining dangling from the sonotrode after severing. Rather, is may more correctly be referred to simply as an unembedded end portion, or connection portion of the segment (stub) of antenna wire
- in a subsequent "connecting stage", bond the two end portions 810a and 810b to the respective two terminals 808a and 808b of the chip module 808

Note that the technique of FIG. 8 differs from that of FIG. 6 as follows.

- in the FIG. 6 technique, you start with residual wire then form the turns of the (single) antenna wire then end with residual wire. And the processes for forming the two residual wires are different than one another. And attention needs to be given to the resulting residual wire which will be used for the first terminal of the next transponder site. Note that mounting the antenna wire at a transponder site starts with residual wire.
- in the FIG. 8 technique, you start with embedding a first length (stub) of the antenna wire and end with a first unembedded end portion. Then you repeat the process— embedding another length of antenna wire and ending with a second unembedded end portion. This is simpler, both unembedded end portions are formed in the same manner, and no attention needs to be given to the resulting residual wire to be used for the next transponder site, because mounting antenna wire at transponder sites starts with embedding, rather than starting with residual wire.

Figure 8C:
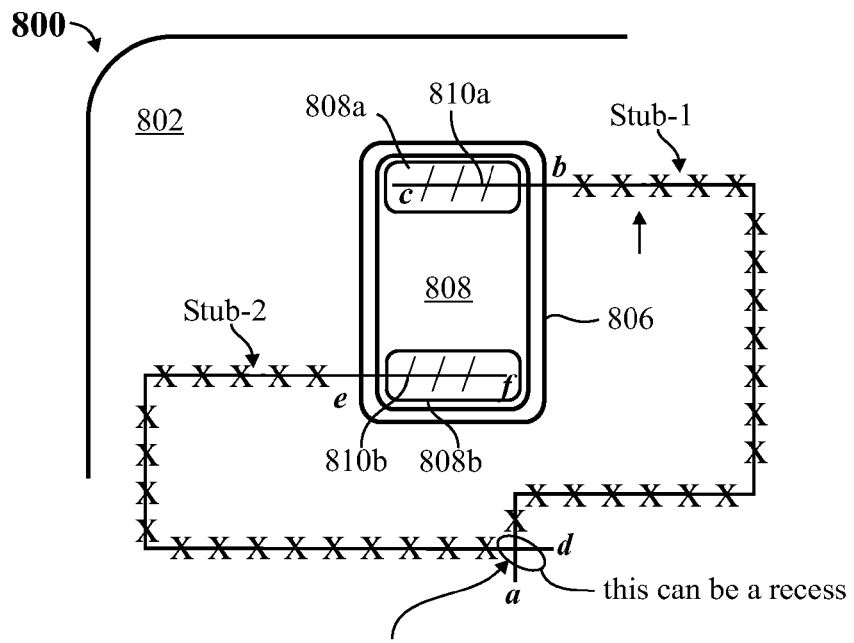

FIG. 8C shows that the two distal ends of the stubs can be overlapped during mounting. (Compare FIG. 1A which shows an overlap of antenna wire.) Then subsequently, the two ends can be connected using the thermode (connecting stage), or a separate laser (for example).

The overlap for connecting the distal ends of the two stubs can be at a previously formed recess in the substrate (see the oval).

The distal ends of the two stubs could be connected at a capacitor which is previously installed or formed on the substrate. Or, similarly, at a switch. See FIG. 8E.

The two stubs can be of unequal lengths.

Figure 8D:
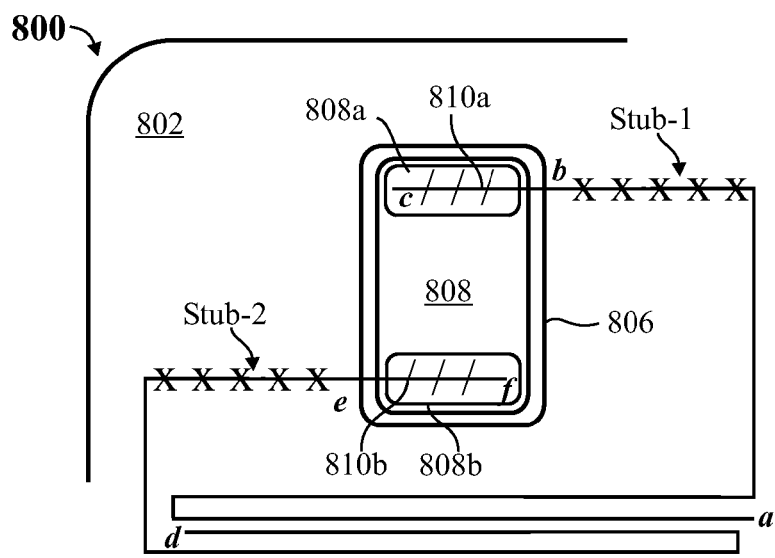
Figure 8E:
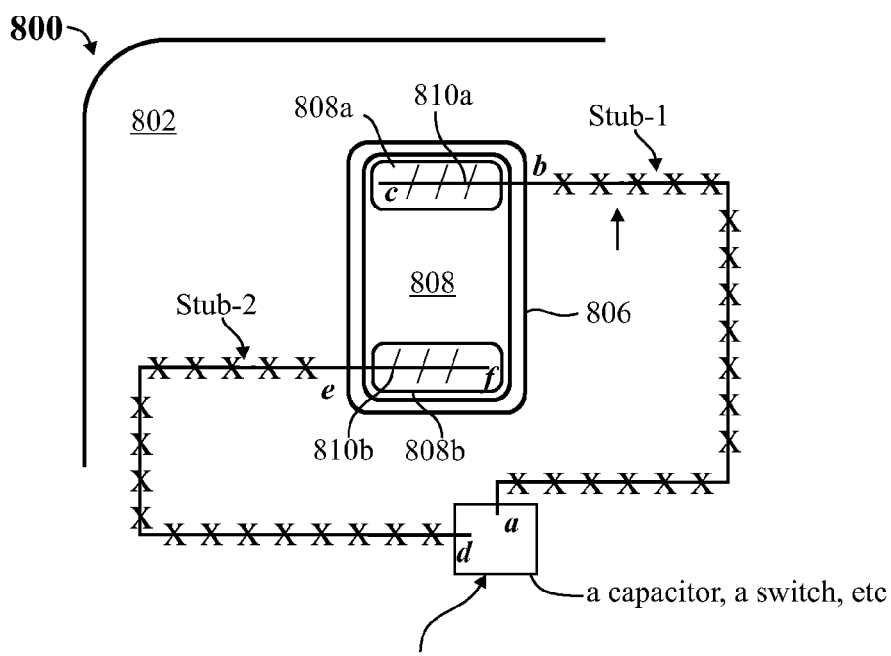

FIG. 8D shows an example of an antenna pattern wherein each stub is formed with some turns. Since the wire is typically insulated wire, they may overlap anywhere, and any number of times. (Compare FIG. 1A which shows an overlap of antenna wire.)

Commencing Mounting the Antenna Wire on a Dab of Glue

FIGS. 9A-B illustrate a technique 900 for mounting and connecting an antenna wire, according to an embodiment of the invention. A chip module (compare 108) is disposed in a recess (compare 106) in an inlay substrate (compare 102). An antenna wire (compare 110) is mounted to the substrate and connected to the chip module as follows.

- dabs (or spots) of glue are disposed on the terminals.
- In a first "mounting" stage, a first end of the wire is stuck into (or fixed by) the dab of glue on a first terminal, but is not connected (i.e., is not electrically connected) to the terminal. This can be done with a sonotrode-type tool.
- Embedding commences, and the turns of the antenna are formed,
- Returning to the chip module, the second end of the antenna wire is fixed into the dab of glue on the second first terminal, but is not connected to the terminal. The antenna wire is cut.
- In a second "connecting" stage, the ends of the antenna wire are bonded to the terminals without requiring "repositioning".

Rather than sticking the ends of the antenna wire into the dabs of glue on the terminals, end portions (exclusive of ends) of the antenna wire may be stuck into the dabs of glue.

This technique 800 is similar to the previous technique 600 in that in a first mounting stage the ends of the antenna wire are pre-positioned over the terminals of the chip module, then in a second connecting stage are connected to the terminals, and no repositioning is required. In both techniques 800 and 600 (and 700), the antenna wire is mounted so that at least one end (or end portion) of the wire is disposed directly above a corresponding at least one of the two terminals of the chip module for connecting thereto; and in a second phase, connecting the wire to the terminal.

An alternative to having dabs of glue on both terminals is fixing the first end (or end portion) to the dab of glue on the first terminal (same as above), forming the turns of the antenna, then rather than fixing the second end to a dab of glue on the second terminal, the second end (or end portion) of the wire is left dangling over the second terminal. Compare FIGS. 6D, 6F and 7D.

Various "claims" directed to this technique may include the following, which are not presented as claims herein.

1. Method of mounting an antenna wire onto an inlay substrate and connecting it with terminals of a chip module comprising:

applying a first dab (spot) of glue to a first terminal of the chip module;

stick a first end of the antenna wire into the first dab of glue;

form the turns of the antenna return to the chip.

2. The method of claim 1, further comprising:

applying a second dab (spot) of glue to a second terminal of the chip module;

stick a second end of the antenna wire into the second dab of glue.

3. The method of claim 1, further comprising:

leaving the second end of the wire dangling over the second terminal.

4. The method of claim 2 or 3, further comprising:

connecting (bonding) the two ends of the wire to the to terminals of the chip module.

5. Method of mounting an antenna wire onto an inlay substrate and connecting it with terminals of a chip module comprising:

mounting the antenna wire so that at least one end portion (including end) of the wire is disposed directly above a corresponding at least one of the two terminals of the chip module for connecting thereto; and in a second phase, connecting the wire to the terminal.

6. The method of claim 5, wherein both end portions are left dangling above the corresponding two terminals of the chip module prior to connecting, and in the second phase, connecting the two end portions (including ends) to the two terminals.

An Alternate Embodiment, Also Using a Dab of Glue

FIG. 10A illustrates a prior art technique for installing a chip module in a recess of an inlay substrate. The recess shown here is a "pocket" type recess, having a bottom. Generally, a dab (or spot) of glue is deposited on the bottom of the recess, then the chip module is inserted into the recess. The glue holds the chip module in place during subsequent processing steps, such as during mounting (and connecting) and antenna wire.

FIG. 10B illustrates a technique 900 for mounting and connecting an antenna wire, according to an embodiment of the invention. A chip module 1008 (compare 108) is disposed in a recess 1006 (compare 106) in an inlay substrate 1002 (compare 102). The chip module 1008 has two terminals 1008a and 1008b. An antenna wire 1010 (compare 110) is mounted to the inlay substrate 1002 and connected to the chip module 1008 as follows.

Put at least one dab (or spot) of glue on the inlay substrate 1002 anywhere near the chip module 1008, or on the chip module 1008 itself.

FIG. 10B shows one relatively large spot of glue 1020 disposed approximately in the middle of the chip module 1008, and extending beyond the side edges of the chip module, and slightly onto the inlay substrate 1002. In other words, the dab of glue 1020 may be on the mold mass of the chip module 1008, between the two terminals 1008a and 1008b of the chip module 1008.

stick the first end of the antenna wire 1010 into the dab of glue 1020, such as by applying heat. This can be done with the sonotrode-type tool (not shown), and the first end of the antenna wire 1010 is stuck into the dab of glue at the point "a". The dashes "-" indicate that the antenna wire 1010 is stuck (not embedded, not bonded) in the dab of glue 1020.

With the sonotrode, draw (guide) the antenna wire 1010 over the first terminal 1008a of the chip module 1008.

This results in a first end portion 1010a of the antenna wire 1010 being disposed over the first terminal 1008a of the chip module 1008 then guide the antenna wire 1010 away from the chip module 1008 onto the inlay substrate 1002, for embedding and forming the turns of the antenna, commending at the point "c"

return to the chip module 1008, at the point "e"

With the sonotrode, draw (guide) the antenna wire 1010 over the second terminal 1008b of the chip module 1008

This results in a second end portion 1010b of the antenna wire 1010 being disposed over the second terminal 1008a of the chip module 1008 cut the antenna wire 1010 optionally, prior to cutting the wire, stick the second end of the wire into the dab of glue, at the point "g", such as by applying heat. The dashes "-" indicate that the antenna wire 1010 is stuck (not embedded, not bonded) in the dab of glue 1020.

Alternatively, the second end (or end portion) of the wire may be left "dangling" over the second terminal 1008b, such as in the techniques 600 or 700.

According to this embodiment of the invention, rather than embedding the ends of the antenna wire in the inlay substrate, the ends of the antenna wire may be glued to the inlay substrate, or to the chip module or to the interface (or gap) between the inlay substrate and the chip module (i.e., at the side edges of the recess).

According to this technique 1000, the dab(s) of glue secure the ends of the antenna wire in place, in lieu of (in contrast with) embedding in the substrate (as in U.S. Pat. No. 6,233,818) or bonding to the chip terminals (as in U.S. Pat. No. 6,088,230).

The glue may be a hot melt adhesive (thermoplastic) or epoxy resin (thermosetting) which can be reheated or manipulated during the curing process. An example of a suitable adhesive is Delo Monopox™.

One function of the glue may be to hold the chip module 1008 in place within the recess 1006. Note that in FIG. 10B, one relatively large spot of glue (larger than one of the cross-dimensions of the chip module) can secure the chip module at two opposite sides of the recess without the need for glue under the chip module. (The conventional method of holding the chip module in place is to have glue under the chip module, as shown in FIG. 10A.)

The spot of glue in the middle of the chip module may be smaller, not large enough to extend onto the substrate, in which case additional glue spots may be needed to secure the chip module in the recess. This may include gluing the chip module in the recess, as in FIG. 10A.

Alternatively, two small spots of glue could be disposed on opposite side edges of the chip module to hold the chip module in place as well as for sticking the ends of the antenna wire.

Various "claims" directed to this technique may include the following, which are not presented as claims herein.

1. Mounting an antenna wire onto an inlay substrate and connecting it with terminals of a chip module comprising:
   applying at least one dab (spot) of glue on the chip module or on the substrate near the chip module,
   stick a first end of the antenna wire into the glue
   draw (guide) the wire over a first terminal of the chip and guide the wire onto the substrate
   form the turns of the antenna
   return to the chip
   draw (guide) the wire over the second terminal of the chip
   cut the wire
2. The second end (or end portion) of the wire is left dangling over the second terminal
3. The method of claim 1, further comprising
   prior to cutting the wire, stick the second end of the wire into the glue
4. The method of claim 1 wherein:
   the glue bridges a gap between the chip module and a side edge of the recess
5. The method of claim 4 wherein:
   the glue spot is sufficiently large to bridge gaps between the chip module and two opposite side edges of the recess
6. The method of claim 1, wherein:
   the glue comprises two spots of glue.
7. The method of claim 6 wherein:
   the two spots of glue are disposed at opposite sides or corners of the recess.
8. A transponder comprising:
   a substrate
   a chip module mounted to the substrate (which may be in a recess)
   an antenna wire mounted to the substrate
   a first end of the antenna wire is stuck to a spot of glue on the chip module or on the substrate near the chip module.
9. The transponder of claim 8 wherein:
   a second end of the antenna wire is stuck to a spot of glue on the chip module or on the substrate near the chip module.
10. The transponder of claim 9 wherein:
    one large spot of glue comprises the first and second spots of glue.
11. The transponder of claim 8 wherein:
    the chip module is mounted in a recess in the substrate, and
    the spot of glue extends across a gap between the chip module and the substrate, thereby holding the chip module in place without the glue being under the chip module.

Fixing (Embedding) the Wire in Adhesive Surrounding the Cavity

Figure 11A:
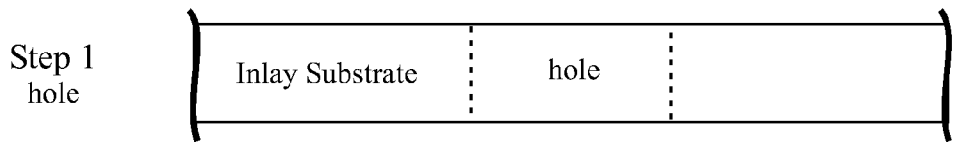

A method of mounting and connecting an antenna wire in an inlay substrate may comprise:

FIG. 11A, Step 1: punch a hole through the inlay substrate. The hole may be slightly smaller than the chip module, and is for the mold mass of the chip module.

Figure 11B:
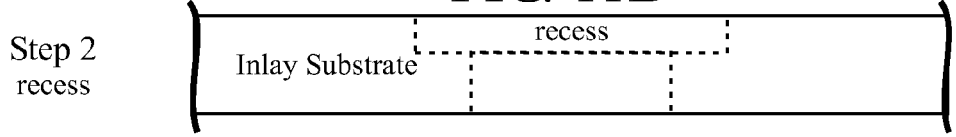

FIG. 11B, Step 2: form a recess to accept a chip module in the inlay substrate, such as by laser ablation. The recess may be approximately the size of the chip module. Such as approximately 5 mm×8 mm, and 0.90 mm deep. (LEADFRAME)

Note that there is usually always a recess, especially the recess or punched hole to accept the mold mass of the chip module, and that the recess for the leadframe can be created by pressing the chip into the substrate layer, especially in the case of Teslin, by applying temperature and pressure—a so-called pre-press process in a laminator.

Figure 11C:
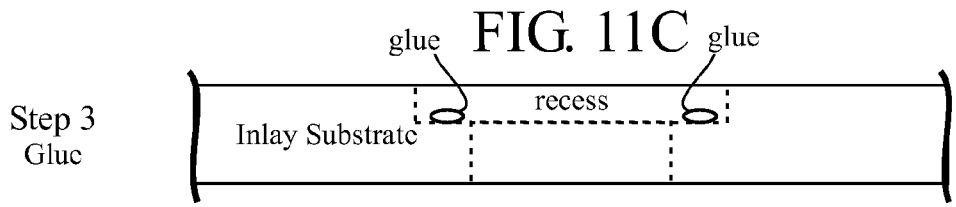

FIG. 11C, Step 3: dispense glue in the recess, for securing the chip module in the recess.

Figure 11D:
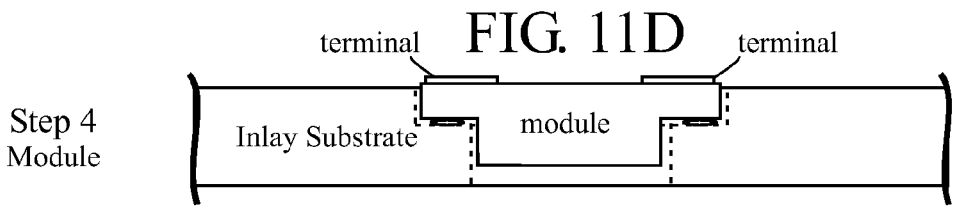

FIG. 11D, Step 4: install the chip module in the recess, such as by using a "pick and place" tool.

The chip module may measure 5×8 mm, and 0.90 mm thick, for example.

Figure 11E:
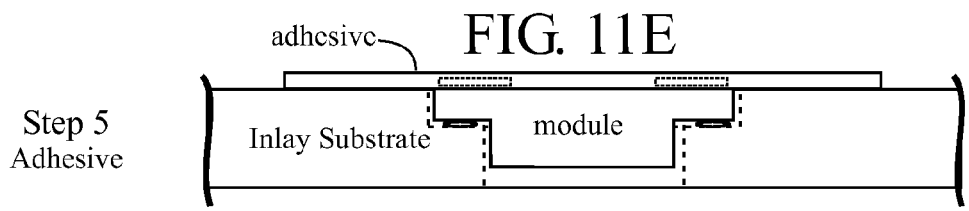

FIG. 11E, Step 5: (Adhesive Coating) Apply a layer of adhesive coating on the substrate around (adjacent) the chip module, such as by spraying. The layer of adhesive coating may cover the chip module.

The layer of adhesive may be continuous and round (as shown), having a diameter of approximately 15 mm The thickness of the adhesive may be approximately 30 µm.

A mask may be applied so that the layer of adhesive coating does not cover the chip module, or does not cover the terminals of the chip module.

Or, the application (such as by spraying) of the adhesive can be controlled so that the layer of adhesive coating does not cover the chip module, or does not cover the terminals of the chip module.

Note if the terminal areas are coated with adhesive, openings (through the adhesive) to allow an interconnection between the wire ends of an antenna with the underlying terminal areas of the chip module can be achieved by irradiating the adhesive layer with a UV laser.

Figure 11F:
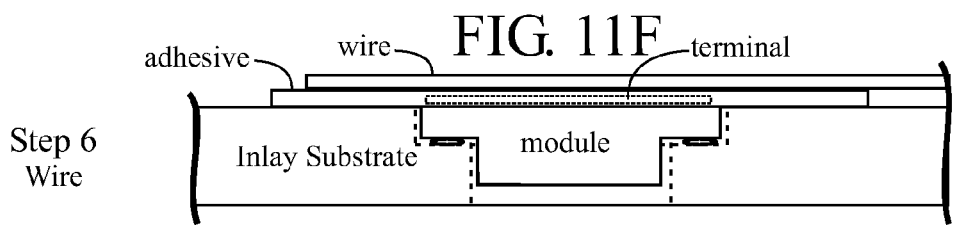

FIG. 11F, Step 6: Embed the antenna wire as follows:

Commencing near a first terminal of the chip module, start embedding the wire. The end of the wire may be (i) embedded in the layer of adhesive, or (ii) just outside of the layer of adhesive (as shown). An end portion of the antenna wire is shown embedded in the adhesive. Guide the wire over a first terminal of the chip module.

Guide the wire away from the chip module and embed it in the substrate, forming the turns of the antenna.

Return to the chip module.

Guide the wire over the second terminal of the chip module.

Continue past the chip module and embed a final portion of the wire in the adhesive adjacent the chip module The wire is embedded into an adhesive plane above the (antenna) substrate layer and above the chip module containing the terminal areas. In other words, there is a layer above the substrate layer. The "turns" of the antenna are embedded into the substrate layer, whereas the wire ends of the antenna are embedded into the adhesive layer. In a next step, openings are created in the adhesive layer to connect the wire ends (connection portions) of the antenna which are mounted to the adhesive layer to the underlying terminals of the chip module which is mounted to the substrate layer.

When ablating the adhesive layer to create openings, it is also possible to remove the insulation from the antenna wire.

Note the adhesive plane only extends partially over the substrate layer, adjacent the chip module area (or recess). The adhesive need not cover the entire area of the substrate.

Similar to U.S. Pat. No. 6,233,818 it may be noted that in the present technique there is also "forming the wire coil on the surface of the substrate". Different than U.S. Pat. No. 6,233,818, in a first phase the wire conductor is guided over and away from a terminal area, but on a different plane to the coil substrate. And the wire conductor is guided over a region accepting the terminal area.

return to chip module,
   guide over second terminal,
   continue past chip module and embed a little in substrate.
   then, do bonding.

Figure 11G:
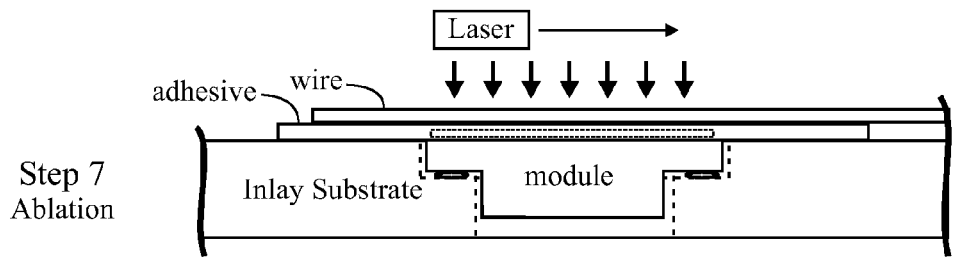

FIG. 11G, Step 7: Ablation of Adhesive Layer and Wire Insulation

Before bonding connection portions of the antenna wire to the terminals of the chip module ablating adhesive in the chip terminal area, and insulation on the wire can also be ablated in this step.

Alternatively, the adhesive over the terminals may alternatively be ablated prior to Step 6 (Wire Embedding)

Figure 11H:
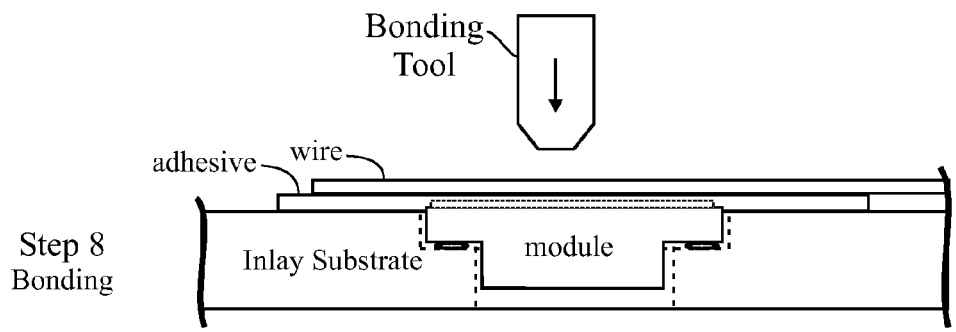

FIG. 11H, Step 8 (Bonding) Bond the connection portions of the antenna wire to the terminals of the chip module.

Figure 11I:
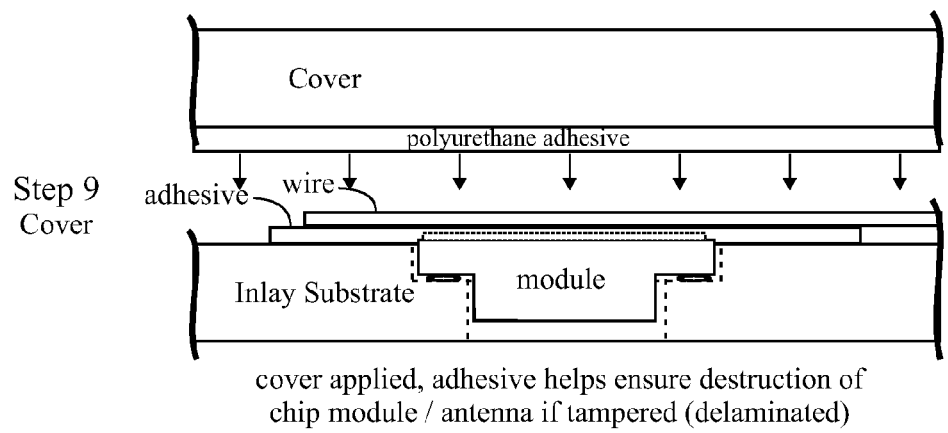

FIG. 11I, Step 9 (Cover) Laminating the cover to the inlay substrate (with chip module and antenna). The cover material may be coated with a layer of polyurethane reactive glue.

Some Comparisons of this Technique with U.S. Pat. No. 6,233,818

The "embed in adhesive" technique described herein (above) is similar to and differs from the technique disclosed in U.S. Pat. No. 6,233,818 in that:

- in both, a first end of the antenna wire is embedded outside of the recess area, near a first terminal of the chip module.
  - In U.S. Pat. No. 6,233,818 the wire is embedded in the substrate.
  - In the present technique, the first end of the wire is embedded in a layer of adhesive atop the substrate.
- In both, the wire is then guided over a first terminal of the chip module
- In both, the wire is then guided away from the chip module and embedded in the substrate, forming the turns of the antenna.
- In both, the wire is guided back to (return to) the chip module, and then is guided over the second terminal of the chip module
- In both, the wire continues past the chip module and is embedded near the second terminal of the chip module
  - In U.S. Pat. No. 6,233,818 the wire is embedded in the substrate.
  - In the present technique, the first end of the wire is embedded in a layer of adhesive atop the substrate.
- then do bonding In the aforementioned U.S. Pat. No. 7,546,671 ("S9"), adhesively sticking was mentioned, but that was with a coating on the wire. In the present technique the wire is adhesively stuck to a layer of adhesive which is atop the substrate, and can be uncoated wire.

The adhesive for mounting the ends of the antenna wire may also provide a security feature.

The adhesive layer may serve several purposes. Firstly, to fix the chip module firmly to the Teslin or polycarbonate layer, and secondly to separate the adhesion between the chip module and the cover material from the adhesion between the antenna and the cover material, after the cover material has been coated with reactive polyurethane. If one tries to delaminate the cover material from the inlay (Teslin or polycarbonate layer) through evasive tampering, the antenna is destroyed differently to that of the chip module, because of the difference in adhesion to the cover material. Thirdly, the adhesive coating around the edges of the chip module can prevent micro-cracking of the polycarbonate layer due to movement of the module in its pocket, especially in the case of national identity cards.

Some Alternatives:

The wire can be started on the module rather than on the substrate (i.e., on the adhesive on the substrate), it is only a question of cutting the residual wire "in the air". Or, the wire can be started on the substrate, pass over the adhesive layer and then make an opening in the adhesive layer to bring the antenna wire in contact with a terminal area of the chip module.

The entire substrate can be coated with adhesive, rather than only the area surrounding (and covering the chip module). Although this may have been done by others (in particular Cubit (Michael Michalk) now Sokymat Erfurt—HID Global—Assa Abloy), it is believed that they do not embed the wire into the adhesive layer.

For a passport, the antenna may be embedded into the substrate but with direct contact with the cover material through the adhesive layer holding the substrate and cover material together, while, the chip is in direct contact with the substrate-Teslin layer.

Inlay Substrate Materials and Issues

In the case of a passport document, the inlay substrate may be Teslin™.

In the case of a smart card, the inlay substrate may be polycarbonate (PC). Polycarbonate has cracking issues. As discussed in 61/315,036 Mar. 18, 2010 ("s26ppa") Makrofol® ID Chemflex is a new polycarbonate (PC) film for plastic cards that boasts improved resistance against a number of media, including oils, greases and many types of hydrocarbons. The film is available in thicknesses of between 55 and 300 micrometers. The thin version is ideal for use as an overlay film for cards, including company ID cards, driver's licenses, passports and other security and access documents that are also subject to high mechanical stresses, such as those in the processing and chemical industries. With a white pigment, the new film can also be used for the inside of cards, where its excellent chemical resistance is also an advantage. It has a higher level of resistance to a number of adhesives and the associated solvents that are often used in the production of chip cards. The card manufacturer thus benefits from a much greater processing window. A further positive feature of the film is its higher tear strength after notching. This ensures that microscopic tears in the film structure caused by laminated components with sharp edges, such as microchips, is kept to a minimum—even if the card is bent frequently.

Makrofol® ID Chemflex is also available in a special grade that can be inscribed using a laser. The resulting marking has as high a contrast as standard laser films from the Makrofol® ID range. Its lamination properties are of a similarly high quality, too. When the new film is laminated with Makrofol® ID at high temperature and sufficient pressure, the materials bond together inseparably. This means the inside of the card can no longer be accessed without causing damage, a fact that helps protect against counterfeiting. See http://pc-films.com/pc-films/emea/en/library/search/docId-2778554/Films_for_heavy-duty_cards_greater_resistance_to_chemicals_ID_Chemflex.html The Chemflex may be used on the top and bottom sides of the antenna module, in order to prevent micro cracks. Adhesives should be used which are flexible and do not contain aggressive solvents. Super glue is not recommended.

In the "embed in adhesive" technique disclosed herein, the adhesive which is applied over the chip area (including an area around the recess) may help avoid the problem of polycarbonate cracking.

Laminating the Cover to the Inlay Substrate (Step 9)

In preparing the cover material for adhesive attachment to the inlay using polyurethane reactive glue, the following steps may be performed to augment the adhesion and shear strength:

- since the textile of the cover material may be coated with an acrylic, it may be beneficial to first partially remove acrylic around the area of the chip module and antenna by ablating the material using a UV laser, and secondly to reduce the surface tension of the material by applying temperature before coating. The latter procedure prevents curling of the material after lamination with the inlay layer such as Teslin™.

Aligning the Grain

Paper is a thin material mainly used for writing upon, printing upon or for packaging. It is produced by pressing together moist fibers, typically cellulose pulp derived from wood, rags or grasses, and drying them into flexible sheets. The fibres in the paper basically run in the machine direction. Sheets are usually cut "long-grain", i.e. with the grain parallel to the longer dimension of the sheet. Synthetics such as Tyvek and Teslin have been introduced as printing media as a more durable material than paper.

An e-passport may comprise an inlay substrate of a synthetic paper material such as Teslin™ or Tyvek™, and a cover layer. In order to reduce curling of the e-cover (cover layer for the e-passport), the grain direction of the Teslin™ may be mounted in the opposite direction to that of the cover material.

Various "claims" directed to this technique may include the following, which are not presented as claims herein.

1. An inlay substrate for a secure document having a recess extending into the inlay substrate from a first (top) surface thereof for receiving a chip module therein, and an antenna wire connected with the chip module, characterized by:
a layer of adhesive disposed on the inlay substrate in an area surrounding the recess; and ends of the antenna wire are embedded in the layer of adhesive.

2. A method of making a secure document comprising an inlay substrate, a chip module disposed in a recess extending into a surface of the inlay substrate, and an antenna wire connected with the chip module, comprising:
applying a layer of adhesive over an area of the substrate which encompasses and surrounds the recess. (Normally, the recess constitutes the chip area. The area covered by adhesive should be an area adjacent/external to the recess, and may or may not include the chip area.)

3. The method of claim 2, further comprising:
masking the chip module so that terminals of the chip module do not become covered by adhesive when applying the layer of adhesive.

4. The method of claim 2, further comprising:
removing (such as by ablating) excess adhesive covering terminals of the chip module.

5. The method of claim 4, further comprising:
during the removing step, removing insulation from the wire in the terminal area.

Small Trenches, Notches, Wire

This embodiment relates to inlay laminates used in the production of national identity cards, electronic passports and contactless smart cards, and methods of
preparing an inlay substrate to receive an RFID chip module (or chip), such as by forming a recess in a surface of the substrate.
installing an RFID chip module (or chip) on the substrate, such as in the recess
mounting an antenna wire to the substrate, such as by embedding the wire along the surface of the substrate, using an ultrasonic embedding tool
connecting the antenna wire to terminals of the chip module In summary, a method is disclosed to
place (install) an RFID chip module (or chip) in a laser ablated or mechanically milled stepped recess or pocket type recess in a substrate,
affix the chip module to the substrate by means of an adhesive material dispensed in small trenches which are formed adjacent the sides of the recess, and
use the adhesive to hold (pre-position) end portions of the wire in place before interconnecting the end portions of the wire to the terminals of the chip module.

The recess may be a pocket-type recess extending only partially through the substrate, and may be stepped (having at least two cross-dimensions).

An Embodiment

Before a transponder site is created by embedding a wire antenna into a substrate and interconnecting the wire ends in a similar fashion as is described in U.S. Pat. No. 6,088,230 and U.S. Pat. No. 6,233,818, it is proposed that the substrate be prepared to accept a chip module by laser ablating or mechanically milling the surface in the following manner:
firstly small trenches may be created near the positions of the terminal areas where a chip module would be placed,
secondly a stepped recess may be created to accommodate the chip module or a pocket type recess is created to accommodate the mold mass of the chip module
After the chip module is picked, placed and positioned in the recess in the substrate, the two trenches on each side of the chip module may be filled with adhesive material to hold the chip module in place. The purpose of the trenches is twofold,
firstly to hold in place the chip module during transport of the inlay sheet and
secondly to provide a means of affixing the start and end of an embedded antenna.

The conventional method to adhesively attach a module to a substrate is to dispense glue into the recess accommodating the chip module. (i.e. dispensing glue before placing the chip)

In this invention, the attachment is achieved by dispensing glue after the chip module has been positioned (installed) in its cavity or recess.

In commencing a transponder site,
a recess is formed extending into the substrate from a surface thereof. The recess may be a stepped recess. The recess may be rectangular, having four sides, and is sized and shaped to accept a chip module.
two small trenches are formed adjacent the recess (just outside of the trench area) and may be contiguous with the recess. The two trenches may be formed on opposite sides of the recess. The small trenches are sized and shaped to accept a short length of antenna wire. (The small trenches are at disposed at positions corresponding with and aligned close to terminal areas of the chip module which will be installed in the recess.)
the chip module is installed in the recess, with its terminals facing up. Each of the two terminals is in close proximity with a corresponding one of the two small trenches.
an adhesive is dispensed into the small trenches, and may flow onto the top surface of the chip module (and also onto the terminals). The adhesive can be an UV curing glue.

The trenches may be formed in conjunction with forming the recess by going with the laser outside of the periphery ("border") of the recess, resulting in a recess with "ears". There may be notches on all four sides or around the circumference of the module to prevent micro cracks. (see discussion of Chemflex).

A similar concept is disclosed in 61/259,224 filed Nov. 9, 2009 ("S22ppa"). See FIG. 13. Regarding mounting and connecting the antenna wire, it should first be understood that:
when using an ultrasonic wire embedding tool, a residual length of wire typically protrudes from the bottom of the tool. This residual wire is equal in length to the distance between the tool and the wire cutting mechanism, and protrudes in the direction of the wire cutter.

when using an ultrasonic embedding tool to mount the wire on the substrate, the wire may become embedded into the surface of the substrate, more-or-less flush with the surface of the substrate Regarding mounting and connecting the antenna wire, the following steps may be performed:

the wire embedding tool passes over the chip module, placing (inserting) the end portion of the residual wire into the adhesive on the surface of the module and continuing into the first trench, before switching on the ultrasonic power to embed the wire into the substrate.

Next, the turns of an antenna coil may be formed on the surface of the substrate Then, the wire embedding tool passes the wire into the second trench and again onto the module passing over the second terminal area before cutting. This means the wire ends of the antenna are left dangling over the chip module but fixed in a specific direction in preparation for interconnection.

Generally, this "pre-positioning" of the residual wire avoids a need to reposition the residual ends over the terminals, such as by "brushing". See, for example, US 20080150817 published Jun. 26, 2008, for example FIGS. 22 and 23 therein.

In US 20080150817 the residual ends are located adjacent the chip (module) and must first be prepared to be sufficiently long to reach the terminals when re-positioned. For example, FIG. 20 illustrates an example of an embedding device such as an ultrasonic sonotrode 90. The sonotrode includes a manifold 92 which houses a capillary tube 94 and a compressed air channel 96 that communicates with the capillary tube 94. The wire 32 is routed through the capillary tube so that it can be dispensed from the distal tip 98 of the sonotrode. A wire clamping mechanism 102 controls the feed of wire. The clamping mechanism jaws close together to prevent feed of the wire. The compressed air can control the rate at which the wire is dispensed from the capillary tube when the jaws are open.

An Exemplary Process (FIGS. 12A and 12B)

FIG. 12A shows a chip (module) disposed in a recess in a substrate. This recess is shown as extending completely through the substrate, hence an underlying support layer is included. A trench is shown extending from the right (as viewed) side of the recess, as an "extension" of the recess. A trench is also shown on the left side of the recess. A residual wire is shown extending from a capillary of a sonotrode. FIG. 12B shows the substrate, chip (module), recess and trench (es), but the wire and sonotrode are omitted, for illustrative clarity.

With reference to FIG. 12A, with the residual wire oriented to be over the chip terminal, the sonotrode is lowered to place (embed) a portion of the residual wire into the trench. The trench may have previously been filled with glue (adhesive, not shown).

Then (not shown), the turns of the antenna may be formed by guiding the sonotrode along the surface of the substrate, with the ultrasonic turned on.

Then (not shown), the sonotrode returns to the chip, places the second end portion of the wire in the other trench, and the wire is severed with the residual wire oriented (positioned) to be over the second chip terminal.

Then, the two residual wires may be interconnected (bonded) to the respective terminals. Typically, a thermode would be used to perform the bonding.

The adhesive may serve two purposes —(i) holding the chip (module) in place, and (ii) holding the residual wire end portions in place for subsequent bonding.

Microcracks

According to an aspect of the invention, a trench may be created around the recess accommodating the module and filling the trench with glue. This can avoid a need to use Chemflex™

Makrofol® ID Chemflex is a new polycarbonate (PC) film for plastic cards that boasts improved resistance against a number of media, including oils, greases and many types of hydrocarbons. The film is available in thicknesses of between 55 and 300 micrometers. The thin version is ideal for use as an overlay film for cards, including company ID cards, driver's licenses, passports and other security and access documents that are also subject to high mechanical stresses, such as those in the processing and chemical industries. With a white pigment, the new film can also be used for the inside of cards, where its excellent chemical resistance is also an advantage. It has a higher level of resistance to a number of adhesives and the associated solvents that are often used in the production of chip cards. The card manufacturer thus benefits from a much greater processing window. A further positive feature of the film is its higher tear strength after notching. This ensures that microscopic tears in the film structure caused by laminated components with sharp edges, such as microchips, is kept to a minimum—even if the card is bent frequently.

Makrofol® ID Chemflex is also available in a special grade that can be inscribed using a laser. The resulting marking has as high a contrast as standard laser films from the Makrofol® ID range. Its lamination properties are of a similarly high quality, too. When the new film is laminated with Makrofol® ID at high temperature and sufficient pressure, the materials bond together inseparably. This means the inside of the card can no longer be accessed without causing damage, a fact that helps protect against counterfeiting.

See http://pc-films.com/pc-films/emea/en/library/search/docId-2778554/Films_for_heavy-duty_cards_greater_resistance_to_chemicals_ID_Chemflex.html The Chemflex may be used on the top and bottom sides of the antenna module, in order to prevent micro cracks. Adhesives should be used which are flexible and do not contain aggressive solvents. Super glue is not recommended.

Various "claims" directed to this technique may include the following, which are not presented as claims herein.

Method of forming a transponder comprising and of forming a recess in the inlay substrate which is larger than the chip module, thereby avoiding the chip (module) being in contact with the sides of the recess. The recess may be a pocket-type recess;

forming small trenches extending laterally from the recess. One or two of these small trenches may be adjacent corresponding one or two of the chip (module) terminals.

filling the small trenches with adhesive;

mounting (embedding) a "fixed" portion of the residual end wire in the small trench (in the glue), rather than (embedded) in the substrate;

mounting the antenna wire such that the residual end portions of the wire extend over the chip terminals, and do not need to be repositioned prior to bonding then, bonding the end portions to the terminals Pre-Positioning the Connection Portions Between the Terminals In U.S. Pat. No. 6,233,818, in a mounting stage, end portions (connection portions) of the antenna wire are pre-positioned over the terminals of the chip module. The ends (end segments) of the antenna wire are embedded in the substrate. In a second, connecting stage, the end portions are bonded down onto the terminals.

In U.S. Pat. No. 7,546,671, in a mounting stage, end portions (connection portions) of the antenna wire are pre-positioned adjacent, outward from the terminals of the chip module. The ends (end segments) of the antenna wire are embedded in the substrate. Prior to connecting, the end portions are repositioned (inwardly) to be over the terminals. The repositioned end portions are closer together than the pre-positioned end portions. Then, in a connecting stage, the repositioned end portions are bonded down onto the terminals.

In a method of mounting an antenna wire disclosed herein, generally,
- the chip (or chip module) is first installed on the substrate (such as in a recess),
- the un-mounted end portions of the antenna wire are pre-positioned over the site for the transponder chip—in other words, over the chip module—but not over the terminals, rather, between the terminals This first procedure results in the un-mounted end portions of the antenna wire being pre-positioned laterally over the site for the transponder chip (such as over the mold mass of the chip module). The distance between the two pre-positioned end portions may thus be less than the width of the chip (or module), and therefore the chip (or module) should be installed prior to the antenna wire being mounted too the substrate.

Then, in a second procedure, the pre-positioned end portions of the antenna wire are each repositioned (outwardly) to be over corresponding ones of the terminals on the transponder chip, and are bonded thereto.

FIG. 13 is a plan view type schematic illustration of
- (13A) two end portions of the antenna wire pre-positioned over the site for the transponder chip, in an "inner" space between the terminals of the transponder chip, and
- (13B) the end portions of the antenna wire repositioned, outwardly, over (above) the terminals of the transponder chip, for bonding thereto The inward (of the terminals) pre-positioning and outward repositioning of the end portions disclosed herein may be easier to do than the outward pre-positioning and inward repositioning of the end portions disclosed in U.S. Pat. No. 7,546,671 ("S9"), since the end portions of the wire do not need to be "dragged" so far. To perform the repositioning, a tool (not shown) such as a "cam" (with an elliptical cross-section having a small radius and a large radius) can be inserted between the two end portions, then rotated (90 degrees) to "spread apart" the two end portions to be over the terminals, in preparation for connecting thereto. Or a "tuning fork" (two-pronged) type tool.

FIG. 13A shows the un-mounted (free-standing) end portions (connection portions) of the antenna wire pre-positioned between the terminals of the chip module.

The cross-hatching lines across the chip module are for shading purposes, to distinguish the mold mass from the terminals. (This is a top view, not a cross-sectional view).

FIG. 13B shows the un-mounted (free-standing) end portions of the wire repositioned over the chip's terminals, for subsequent bonding thereto. In FIG. 13B, embedding is indicated by "X's".

The arrows in FIG. 13B show that the un-mounted (free-standing) end portions of the antenna wire will be repositioned, further away from one another, so as to be over the terminals of the chip (or chip module). The dashed lines indicate the pre-positioned position of the end portions (connection portions) of the antenna wire.

Various "claims" directed to this technique may include the following, which are not presented as claims herein.

1. Method of forming an inlay comprising:
a substrate having a surface;
a transponder chip (or chip module) installed on (such as in a recess extending into the surface of) the substrate; and
an antenna wire mounted to (such as embedded in the surface of) the substrate;
characterized by:
in a first phase, end portions of the antenna wire are pre-positioned over the chip module, between terminals of the chip module; and
in a second phase, the end portions of the antenna wire are repositioned over (above) the terminals of the chip module and are subsequently bonded thereto.

2. Method of forming an inlay comprising:
a substrate having a surface;
a transponder chip (or chip module) installed on (such as in a recess extending into the surface of) the substrate; and
an antenna wire mounted to (such as embedded in the surface of) the substrate;
characterized by:
any of the methods described or suggested herein which are novel and non-obvious.

3. The method of claim 2, further comprising:
various elements (and combinations thereof) of applicant's previous applications from which an application claiming priority to this application can also claim priority. This may include methods of forming recesses, removing insulation from end portions of the wire, etc.

4. A product formed by or with any of the techniques, methods or processes described herein.

Repositioning the Connection Portions of the Wire

Figure 2C:
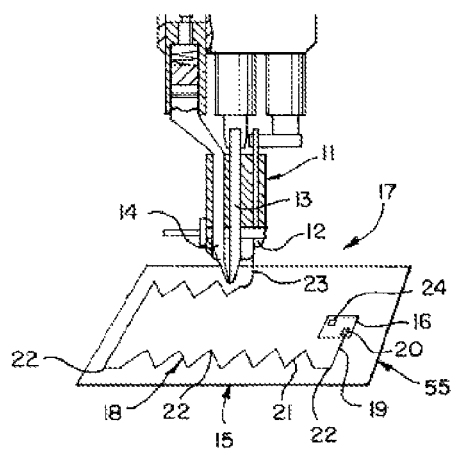
Figure 2D:
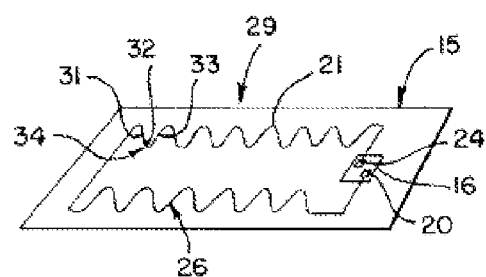
Figure 2E:
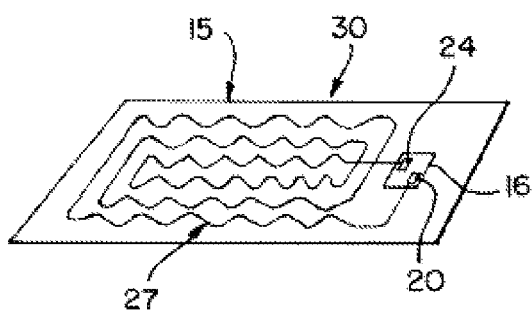
Figure 2F:
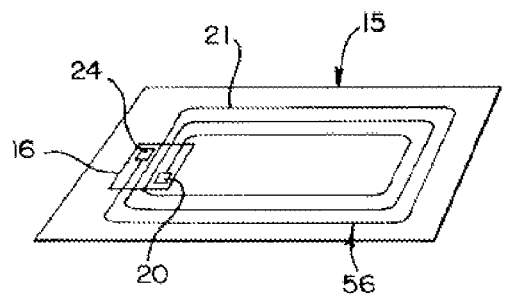

In the "looping method of S9 (and S9div), "planar loops" are described with respect to FIGS. 2C and 2D which may be substantially linear, or may be arcuate, and are pre-positioned in a plane that is substantially coplanar with the surface of the substrate.

The "swabbing method" disclosed herein is similar to the "looping method", particularly the "planar loop" version. The "swabbing method" seeks to avoid needing slots (compare 282 and 284) for permitting a tool to grab (or push) the planar loop of the end portion of the antenna onto the terminal for connection (bonding) thereto.

Generally, in the "swabbing method",
the end (such as the first 2 mm) of the antenna wire is embedded (more generally, "mounted", which can include adhesively placing the wire on the surface of the substrate);
then a first end portion (such as 4-5 mm) of the antenna wire is left un-embedded (un-mounted), or slack, adjacent the recess (near where a first terminal of the chip module will be when installed in to the recess). This slack end portion may be generally coplanar with the substrate, simply laying on the surface thereof, and may have an arcuate shape, or a squiggle or the like (anything that provides some slack);
then embedding of the wire resumes and the coils (turns) of the antenna are formed on (or in) the surface of the substrate;

then the wire is directed towards the chip recess then a second end portion (such as 4-5 mm) of the antenna wire is left un-embedded, or slack, adjacent the recess (near where a second terminal of the chip module will be when installed in to the recess). This slack end portion may be generally coplanar with the substrate, simply laying on the surface thereof, and may have an arcuate shape, or a squiggle or the like (anything that provides some slack);

then, if the chip is installed into the recess (if it was not already installed therein);

then the slack first and second end portions of the antenna wire are re-positioned by any suitable means into position above the terminals of the chip for bonding thereto. This may involve using a repositioning tool such as a brush, a rotating brush, a fiber or fibers (like a small broom), a strip or strips (like a small mop) to drag, brush, sweep or swab the slack first and second end portions of the antenna over the terminals of the chip for bonding thereto. The process of re-positioning the wires can also include using compressed air to force the wire portions to cross the recess in which the chip or chip module resides. Or using a tuning fork (two pronged) tool which rotates a few tens of degrees to twist ("tweak") the slack end portions of the wire over the recess area in which the chip or chip module resides (or will be installed). Other alternatives such as using compressed air to reposition the slack end portions of the antenna wire may also be used.

It should be understood that the recess may be a window-type recess extending entirely through the substrate (or a layer of a multi-layer substrate), or may be a pocket-type recess extending only partially through a layer of a substrate. Alternatively, the "recess" may not be a recess at all, but rather simply a designated area for the chip (or chip module) on the surface of the inlay substrate. However, it is generally preferred to have a recess so that the chip (or chip module) does not protrude significantly above the surface of the inlay substrate.

Refer to the figures entitled "Antenna before repositioning" and "Antenna after repositioning".

A Product

E-cover Passport, National Identity Card or Financial Transaction Card inlay consisting of a single substrate layer or a multiple of substrate layers with a least one chip or chip module and an antenna for electromagnetic coupling A Process Procedure for embedding a wire conductor into a single substrate layer or a substrate layer with multiple underlying layers, beginning with a start position on the transponder site, routing the wire conductor into or onto the substrate in the direction of the chip or chip module, pre-positioning a portion of the wire conductor to the surface of the substrate adjacent to one side of an area accepting the chip or chip module, forming an antenna with several turns of embedded wire in or on said substrate layer, routing the wire conductor again into or onto the substrate in the direction of the chip or chip module, pre-positioning a portion of the wire conductor to the surface of said substrate adjacent to the other side of the area accepting the chip or chip module, completing the wire embedding process with an end position on the transponder site, mounting a chip or chip module into the recess or opening area to accept the chip or chip module in or on the substrate, re-positioning the opposing wire portions on the surface of the substrate to be over the respective terminal area of the chip or chip module mounted in the recess or window opening and connecting the re-positioned wire portions with the respective terminal area on the installed chip or chip module on the same substrate or supporting substrate layer for the purpose of producing a transponder site with a least one chip and one antenna.

A process to produce a transponder site on a single substrate layer by creating a recess or pocket in the substrate to mount a chip or chip module in said substrate, by mechanically milling or laser ablating the substrate using an ultra violet laser source.

Alternatively, a process to produce a transponder site encompassing several layers of substrate with the antenna embedded into an upper substrate layer and the chip or chip module positioned in a recess in an underlying layer or positioned in a window in a substrate layer supported by another substrate layer. The recess can be mechanically milled or laser ablated whereas the window in the substrate layer to accept the chip or chip module is punched with an underlying layer supporting the chip or chip module in the window opening.

Therefore, the chip or chip module is installed in the area accepting the chip or chip module such as a recess, pocket or window opening in the substrate after the wire portions are pre-positioned on each side of said area accommodating the chip or chip module.

In detail, embedding a wire conductor in a substrate layer to create an antenna with several turns of wire using a wire guiding tool wherein:

in a first phase the wire conductor is placed onto or embedded into the substrate at a start position on the transponder site and routed in the direction of an area to accept a chip or chip module;

in a second phase the wire conductor is pre-positioned adjacent to one side of the area accepting the chip or chip module with a portion of the wire conductor laying flat and loose on the substrate close to said area accepting the chip or chip module, but having the slack wire portion firmly fixed at two positions on the substrate;

in a third phase placing or embedding the wire conductor onto or into the substrate layer to form an inductive antenna with several turns of wire and then routing the wire conductor in the direction of the area to accept the chip or chip module;

in a fourth phase the wire conductor is pre-positioned adjacent to the other side of the area accepting the chip or chip module with a portion of the wire conductor laying flat and loose on the substrate close to said area accepting the chip or chip module, but having the slack wire portion firmly fixed at two positions on the substrate;

in a fifth phase the wire conductor is routed away from the last adjacent position to the area accepting the chip or chip module and placed onto or embedded into the substrate to arrive at the end position on the transponder site;

in a sixth phase the chip or chip module is installed in the area on the substrate to accommodate the chip or chip module and holding said chip or chip module in place by suction, adhesion or mechanically;

in a seventh phase the slack wire portions on each side of the area accepting the chip or chip module are re-positioned to be over the terminal areas on the chip or chip module by dragging, brushing or sweeping said slack wire portions into position;

in an eighth phase, interconnecting those portions of the wire conductor protruding over the respective terminal area on the chip or chip module.

Note the laser ablated area to accept a chip or chip module can also be prepared to accept any security feature or electronic device such as a sensor (inductive or capacitive), switch, display, lighting emitting diode or an electronic ink device.

Disclaimer

It is believed that much, if not all of what is disclosed herein has previously been disclosed, or fairly suggested in earlier ones of Applicant's patent applications from which a non-provisional of this provisional patent application may claim benefit from. Nothing presented herein should be taken as an "admission" that the subject matter or a feature thereof set forth herein was not earlier presented.

Various "claims" directed to this technique may include the following, which are not presented as claims herein.

1. In a transponder having a substrate and a chip, a method of mounting and connecting an antenna wire, comprising the steps of:

mounting an end (such as the first 2 mm) of the antenna wire;

leaving a first end portion (such as 4-5 mm) of the antenna wire is un-mounted, or slack, adjacent the recess (near where a first terminal of the chip module will be when installed in to the recess).

resuming mounting of the wire to form coils (turns) of the antenna on (or in) the surface of the substrate;

directing the wire is directed towards the chip recess;

leaving a second end portion (such as 4-5 mm) of the antenna wire is left un-mounted, or slack, adjacent the recess (near where a second terminal of the chip module will be when installed in to the recess).

then, if the chip is installed into the recess (if it was not already installed therein);

then the slack first and second end portions of the antenna wire are re-positioned by any suitable means into position above the terminals of the chip for bonding thereto.

2. The method of claim 1, wherein the slack, un-mounted end portions of the antenna wire may be generally coplanar with the substrate, simply laying on the surface thereof, and may have an arcuate shape, or a squiggle or the like (anything that provides some slack).

3. The method of claim 1, wherein the means for repositioning comprises any of:

a brush, a rotating brush, a fiber or fibers (like a small broom), a strip or strips (like a small mop) to drag, brush, sweep or swab the slack first and second end portions of the antenna over the terminals of the chip for bonding thereto. The process of re-positioning the wires can also include using compressed air to force the wire portions to cross the recess in which the chip or chip module resides. Or using a tuning fork (two pronged) tool which rotates a few tens of degrees to twist ("tweak") the slack end portions of the wire over the recess area in which the chip or chip module resides (or will be installed).

4. Method of embedding a wire conductor in a substrate layer to create an antenna with several turns of wire using a wire guiding tool comprising some or all of the following steps:

in a first phase the wire conductor is placed onto or embedded into the substrate at a start position on the transponder site and routed in the direction of an area to accept a chip or chip module;

in a second phase the wire conductor is pre-positioned adjacent to one side of the area accepting the chip or chip module with a portion of the wire conductor laying flat and loose on the substrate close to said area accepting the chip or chip module, but having the slack wire portion firmly fixed at two positions on the substrate;

in a third phase placing or embedding the wire conductor onto or into the substrate layer to form an inductive antenna with several turns of wire and then routing the wire conductor in the direction of the area to accept the chip or chip module;

in a fourth phase the wire conductor is pre-positioned adjacent to the other side of the area accepting the chip or chip module with a portion of the wire conductor laying flat and loose on the substrate close to said area accepting the chip or chip module, but having the slack wire portion firmly fixed at two positions on the substrate;

in a fifth phase the wire conductor is routed away from the last adjacent position to the area accepting the chip or chip module and placed onto or embedded into the substrate to arrive at the end position on the transponder site;

in a sixth phase the chip or chip module is installed in the area on the substrate to accommodate the chip or chip module and holding said chip or chip module in place by suction, adhesion or mechanically;

in a seventh phase the slack wire portions on each side of the area accepting the chip or chip module are re-positioned to be over the terminal areas on the chip or chip module by dragging, brushing or sweeping said slack wire portions into position;

in an eighth phase, interconnecting those portions of the wire conductor protruding over the respective terminal area on the chip or chip module.

5. A product formed by or with any of the techniques, methods or processes described herein.

Forming Channels or Grooves to Accept the Antenna Wire

FIG. 14A (see FIG. 4A of "S19") illustrates a technique 400a using a laser 1460a to form a groove (channel, trench) 1462a in a surface of an inlay substrate 1408. This is an example of removing material to form the groove. The laser 1460a is shown moving from left-to-right in the figure.

A wire 1420 is shown being laid down into the groove 1462, from left-to-right, and may be urged into the groove 1462 by a simple pressing tool (or wheel) 1468. The wire 1420 may be laid into the groove 1462 during formation of the groove (channel), by following after the laser a distance "u".

Although only one straight groove is shown, a 2-dimensional (x-y) groove pattern may thus be formed in the top surface of the inlay substrate, extending from (originating and terminating at) a recess in the inlay substrate, for embedding an antenna wire having a number of turns or coils (see FIG. 1E). As mentioned above, insulated wire is relevant where the wire needs to cross over itself, such as in FIG. 1A. And, in some cases, the antenna wire does not need to cross over itself. See, for example, FIG. 4 of U.S. Pat. No. 6,698,089.

FIG. 14B illustrates a technique 1400b using a mechanical tool 1460b to form a groove 1462b in a surface of an inlay substrate 1408. This is an example of removing material to form the groove. The tool may be a milling tool, such as a conventional or climb milling tool available from IBAG Switzerland AG, described hereinabove. Reducing the temperature of the material being milled, as discussed above, may be employed.

Alternatively, the tool 1460b may be similar to a "gouge" used to carve patterns in wood. (Gouge—Carving tool with a curved cutting edge.) A gouging tool 1460b is shown moving from left-to-right in the figure. In this figure, the wire (420) and the pressing tool (468) are omitted, for illustrative clarity. The "debris" from gouging (or milling) is also omitted, for illustrative clarity. Reducing the temperature of the material being gouged may be employed.

FIG. 14C illustrates a technique 1400c using an ultrasonic stamp tool 1460c form a groove 1462c in a surface of an inlay substrate 1408. This is an example of displacing material, with pressure, to form the groove. The tool may be a thin rectangular block, or a small diameter cylinder, mounted to an ultrasonic converter (not shown). The tool 1460c is shown moving from left-to-right in the figure. In this figure, the wire (1420) and the pressing tool (1468) are omitted, for illustrative clarity. A similar tool could be used to push the wire further into the substrate, once it has already been (partially) embedded therein.

FIG. 14D illustrates a technique 1400d forming a groove 11462d in the surface of an inlay substrate 1408 by using heat and molding. Essentially, a die tool 460d having a raised pattern 1461 corresponding to the desired pattern for the groove(s) is pressed (arrow) down against the surface of the inlay substrate, and heat may be applied, to transfer the pattern to (mold the pattern into) the inlay substrate. This technique can also be considered to be "displacing".

Regarding techniques for displacing material to form a channel for the antenna wire, it could be said that in straightforward embedding (ultrasonic, sonotrode), the wire displaces substrate material as it is embedded into the surface of the substrate. It should be understood that the displacing techniques described herein are performed with a tool separate and distinct from the wire, and prior to the wire being embedded in the surface of the substrate.

It should be understood that the channels for antenna wire being discussed herein are "pre-formed" (prior to mounting/embedding the antenna wire therein) in a desired pattern for the antenna. An inlay substrate may be prepared with such pre-formed channels for later embedding of antenna wire.

It should be understood that when a wire is inserted (mounted) into a pre-formed groove, this is different than ultrasonic embedding into a non-grooved surface of a substrate, such as is disclosed in U.S. Pat. No. 6,698,089. A tool for mounting the wire into a pre-formed groove may or may not be ultrasonic. Although the word "embedding" may be used herein, in conjunction with mounting wires in preformed grooves, it should be understood that it is used in its generic sense relating to inserting a first material (such as a wire) into a groove formed in another material (such as the inlay substrate, or a given layer thereof).

FIG. 14E shows embedding a wire in the channel. This can be done during channel formation, such as indicated in FIG. 14A, with the wire following close behind the laser, or the wire can be installed in a separate step after the entire channel is formed.

FIG. 14E is a cross-sectional view of a substrate 408 with a groove 462e (compare any of grooves 462a, 462b, 462c, 462d) and a wire 620 mounted in the groove. A simple embedding tool 460a may be used (such as without ultrasonics). FIG. 4E shows after groove formation, prior to embedding. After embedding, the wire may protrude slightly above the top surface of the substrate 608. If sufficient pressure, heat and/or ultrasonic are used during embedding and/or the groove is sufficiently deep, the wire may be fully embedded, flush with the top surface of the substrate.

In FIG. 14E, a channel 462e may be previously formed in a surface of an inlay substrate (or in a surface of a layer of a multi-layer substrate), and a wire 420 is mounted into the pre-formed channel 462e. The wire may be completely inset into the substrate, or it may protrude slightly therefrom.

"S16" (referenced above) discloses laser channels, laser ablated grooves and trenches. It should be understood that the channel to accept the wire does not have to be laser-ablated, rather it can be formed using other techniques such as
  direct etching (lithographic process),
  x-ray (using a mask),
  chemically,
  mechanically or thermally.
  Or it could be a transfer process using an adhesive layer.

The '230 and '818 patents disclose ultrasonic embedding to countersink a wire conductor into a synthetic material (non-conductive). The embedded wire displaces substrate material, some of which protrudes from the surface. See, for example, FIG. 2 of U.S. Pat. No. 6,233,818 (see also FIG. 8 of U.S. Pat. No. 7,612,677)

A favorable feature of the techniques disclosed herein for forming a channel for the wire include that there is substantially no displacement of substrate material (of course, with an "interference fit", some displacement of the substrate material is desirable, as the walls of the groove may expand resiliently when inserting the wire.) Also, uninsulated wire may be used, which has the advantage that insulation need not be removed from connection portions of the wire prior to bonding to the terminals of the chip module.

Crossing Wires (FIG. 15)

In some cases, depending on the pattern of the antenna, it may be necessary for the antenna wire to cross itself. For example, see compare FIG. 4 of U.S. Pat. No. 6,088,230 (here FIG. 2E) and FIG. 5 of U.S. Pat. No. 6,233,818 (here FIG. 3G). FIG. 1A also shows an antenna pattern which has a crossover. Typically, a short circuit is avoided because the wire is insulated, and the sonotrode may be switched off in the vicinity of the crossover. (In the embedding process, the embedding may be discontinuous, at several points, rather than continuous.)

The use of channels can be advantageous for mounting an antenna wire in a pattern that requires the antenna wire to cross over itself, without shorting. For example:
  a first portion of the antenna wire may be "fully" embedded in a channel, without protruding above the surface of the substrate. The channel may be made deeper at this point (vicinity) to ensure that the antenna wire is indeed fully embedded.
  Then, a second portion of the antenna wire which crosses over the first portion is not embedded, but rather is laid on the surface of the substrate.
  Alternatively,
  a first portion of the antenna wire is fully embedded in a channel (or portion of the overall channel) which is very deep where the second portion will be crossing over
  the second portion of the antenna wire is embedded in a channel (or portion of the overall channel) which is "normal" depth.
  The depth of the first channel portion is sufficient that the second portion of the wire crossing over the first portion of the antenna wire does not short thereto.

Generally, insulated and/or self-sticking wire would be used. But using these techniques, uninsulated (bare) wire may also be used, again avoiding the necessity of removing insulation from connection portions of the wire.

A transponder (which may be referred to as a "transponder site") generally comprises a chip or chip module installed on an inlay substrate (such as in a recess in the substrate), and an antenna wire mounted to the inlay substrate (such as one or more channels in the substrate), and connection portions of the antenna wire are connected to corresponding terminals of the chip or chip module.

Generally, to produce a transponder site, first an antenna channel(s) may be created in the Teslin with the appropriate number of turns and having a deeper indent in the material at the position where the outer wire of the antenna crosses the antenna wires to reach the chip module for interconnection.

FIG. 15 shows a portion of an inlay substrate ("substrate") whereat the antenna wire crosses itself. Compare the area in the dashed circle in FIG. 1A. A first portion of the antenna wire is disposed in a deep portion of the channel, and is shown in dashed lines. A second portion of the antenna wire is disposed in a shallow portion of the channel. In this manner, the second portion of the antenna wire may pass over the first portion of the antenna wire without contacting it.

Once the channel is created, the wire conductor (which may be a self-bonding wire) can be installed into the channel and simultaneously thermally activated, so that the adhesive layer of the self-bonding wire sticks to the walls of the channel.

Wire Straightening with a Suction System

FIGS. 6 and 7 describe "floating" end portions of the antenna wire which are pre-positioned during the mounting process so as to extend at least over the terminals of the chip module (and possibly beyond, if desired). Being thus pre-positioned, no repositioning is required, such as in US 2010/0141453 ("brushing").

Inasmuch as these "floating" end portions of the antenna wire are loose, and may move during handling, it may be important to ensure that the "floating" end portions of the antenna wire are correctly positioned over the terminals of the chip module, such as immediately prior to performing the connecting stage (bonding).

The floating portions of the antenna wire which reside (are located) over each terminal area before bonding may be straightened or repositioned for interconnection purposes by using an air suction system to draw each "floating" end portion into position. And, as mentioned, the end portions of the wires do not necessarily have to stop just over the terminals, but rather can pass beyond the terminals, beyond the chip module, beyond the recess, and slightly over (but not embedded in) the substrate. Such longer (than terminating over the terminals) "floating" end portions of the antenna wire may facilitate interaction with the suction provided by the suction system. Of course, an positive airflow may be provided in lieu of suction. Such an air flow may contain inert gas which would support the bonding of the wires to the terminals.

Secondly, the interconnections to the chip can be to a naked die which is bumped and the wire ends are connected to the bumps, in short a direct connection.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. A method of mounting a wire to an inlay substrate for a transponder comprising a substrate, a chip module and an antenna wire disposed on the substrate, said chip module comprising two terminals, the method comprising:
   during mounting the wire, ensuring that at least one end portion including an end of the wire is positioned directly over a corresponding at least one terminal of the chip module for subsequent connecting thereto without requiring repositioning;
   wherein:
   the antenna wire comprises two lengths, or "stubs" of wire;
   a first of the two stubs of antenna wire is formed by first embedding on the substrate, then causing a first unembedded end portion of the antenna wire to be located directly over a corresponding first one of the two terminals of the chip module;
   a second of the two stubs of antenna wire is formed by first embedding on the substrate, then causing a second unembedded end portion of the antenna wire to be located directly over a corresponding second one of the two terminals of the chip module.

2. The method of claim 1, further comprising
   connecting the two distal ends of the two stubs of antenna wire together.

3. The method of claim 2, further comprising
   connecting the two distal ends of the two stubs of antenna wire together at a capacitor.

4. The method of claim 1, wherein:
   the stubs are of unequal length.

5. The method of claim 1, further comprising
   subsequently connecting the two unembedded end portions of the antenna wire stubs to the corresponding two terminals of the chip module.

* * * * *